United States Patent
Ise et al.

(10) Patent No.: US 7,566,505 B2
(45) Date of Patent: Jul. 28, 2009

(54) ORGANIC ELECTROLUMINESCENT ELEMENT

(75) Inventors: Toshihiro Ise, Kanagawa (JP); Satoshi Sano, Kanagawa (JP); Tatsuya Igarashi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 651 days.

(21) Appl. No.: 11/094,675

(22) Filed: Mar. 31, 2005

(65) Prior Publication Data

US 2005/0227112 A1    Oct. 13, 2005

(30) Foreign Application Priority Data

Mar. 31, 2004  (JP) .............................. 2004-106435
Mar. 11, 2005  (JP) .............................. 2005-069963

(51) Int. Cl.
*H01L 51/54* (2006.01)
*C09K 11/06* (2006.01)

(52) U.S. Cl. ........................ 428/690; 428/917; 313/504; 313/506; 257/E51.041; 257/E51.044; 548/101; 548/103; 548/106; 548/402; 548/403; 546/4; 546/6; 544/181; 544/225

(58) Field of Classification Search ....................... None
See application file for complete search history.

(56) References Cited

U.S. PATENT DOCUMENTS

| 6,303,238 | B1 | 10/2001 | Thompson et al. | |
| 6,653,654 | B1 | 11/2003 | Che | |
| 2005/0260444 | A1* | 11/2005 | Forrest et al. | ................ 428/690 |
| 2005/0260445 | A1* | 11/2005 | Walters et al. | .............. 428/690 |
| 2006/0172146 | A1* | 8/2006 | Igarashi et al. | .............. 428/690 |

FOREIGN PATENT DOCUMENTS

WO    WO 00/57676 A1    9/2000

* cited by examiner

*Primary Examiner*—Marie R. Yamnitzky
(74) *Attorney, Agent, or Firm*—Sughrue Mion, PLLC

(57) ABSTRACT

The present invention provides an organic electroluminescent element having at least one organic layer including a luminescent layer between a pair of electrodes wherein at least one organic layer contains a metal complex of cyclic tetradentate ligand having a specific structure.

4 Claims, No Drawings

ORGANIC ELECTROLUMINESCENT ELEMENT

CROSS-REFERENCE TO RELATED APPLICATION

This application claims priority under 35 USC 119 from Japanese Patent Application Nos. 2004-106435 and 2005-69963, the disclosures of which are incorporated by reference herein.

BACKGROUND OF THE INVENTION

1. Field of the Invention

The present invention relates to an organic electroluminescent element (hereinafter, also referred to as "organic EL element", "luminescent element" or "element"), and particularly relates to an organic electroluminescent element excellent in emission characteristics and durability.

2. Description of the Related Art

Organic electroluminescent elements (organic EL element) have been extensively studied and developed in recent years because emission can be obtained with high luminance by driving at low voltage.

Generally, an organic EL element is composed of an organic layer including a luminescent layer and a pair of electrodes sandwiching the layer, and utilizes emission from excitons formed upon recombination, in the luminescent layer, of electrons injected through a cathode to holes injected through an anode.

The efficiency of the element has been improved advancing in recent years by using phosphorescent material. For example, iridium complexes and platinum complexes are known as disclosed in U.S. Pat. No. 6,303,238 and International Publication No. 00/57676. However, even such materials have not lead to the development of elements satisfying both high efficiency and high durability, and at present, there is demand for the development of a phosphorescent material meeting both high efficiency and high durability.

SUMMARY OF THE INVENTION

The present invention has been made in view of the above-described circumstances and provides an organic electroluminescent element having high emission luminance, high luminous efficiency and excellent durability.

The inventors have found that the organic electroluminescent element described above can be obtained by incorporating, into an organic layer, a metal complex of cyclic tetradentate ligand having a specific structure.

A first aspect of the invention is to provide an organic electroluminescent element having at least one organic layer including a luminescent layer between a pair of electrodes, wherein at least one organic layer comprises at least one compound represented by formula (A-1):

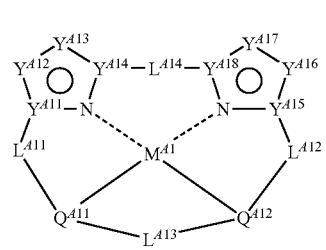

Formula (A-1)

wherein $M^{A1}$ represents a metal ion, $Y^{A11}$, $Y^{A14}$, $Y^{A15}$ and $Y^{A18}$ independently represent a carbon atom or a nitrogen atom, $Y^{A12}$, $Y^{A13}$, $Y^{A16}$ and $Y^{A17}$ independently represent a substituted or unsubstituted carbon atom, a substituted or unsubstituted nitrogen atom, an oxygen atom or a sulfur atom, $L^{A11}$, $L^{A12}$, $L^{A13}$ and $L^{A14}$ independently represent a linking group, and $Q^{A11}$ and $Q^{A12}$ independently represent a partial structure containing an atom bonded to $M^{A1}$.

A second aspect of the invention is to provide an organic electroluminescent element having at least one organic layer including a luminescent layer between a pair of electrodes, wherein at least one organic layer comprises at least one compound represented by formula (B-1):

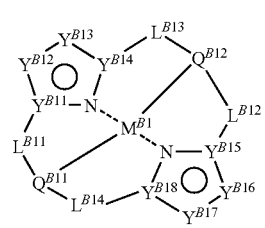

Formula (B-1)

wherein $M^{B1}$ represents a metal ion, $Y^{B11}$, $Y^{B14}$, $Y^{B15}$ and $Y^{B18}$ independently represent a carbon atom or a nitrogen atom, $Y^{B12}$, $Y^{B13}$, $Y^{B16}$ and $Y^{B17}$ independently represent a substituted or unsubstituted carbon atom, a substituted or unsubstituted nitrogen atom, an oxygen atom or a sulfur atom, $L^{B11}$, $L^{B12}$, $L^{B13}$ and $L^{B14}$ independently represent a linking group, and $Q^{B11}$, $Q^{B12}$ independently represent a partial structure containing an atom bonded to $M^{B1}$.

A third aspect of the invention is to provide an organic electroluminescent element having at least one organic layer including a luminescent layer between a pair of electrodes, wherein at least one organic layer comprises at least one compound represented by formula (C-1):

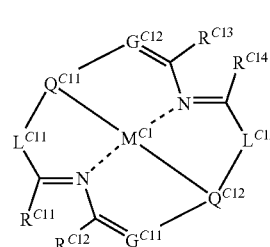

Formula (C-1)

wherein $M^{C1}$ represents a metal ion, $R^{C11}$ and $R^{C12}$ independently represent a hydrogen atom or are substituent groups bonded to each other to form a 5-membered ring or substituent groups not bonded to each other, $R^{C13}$ and $R^{C14}$ independently represent a hydrogen atom or are substituent groups bonded to each other to form a 5-membered ring or substituent groups not bonded to each other, $G^{C11}$ and $G^{C12}$ independently represent a nitrogen atom or a substituted or unsubstituted carbon atom, $L^{C11}$ and $L^{C12}$ independently represent a linking group, and $Q^{C11}$ and $Q^{C12}$ independently represent a partial structure containing an atom bonded to $M^{C1}$.

A fourth aspect of the invention is to provide an organic electroluminescent element having at least one organic layer including a luminescent layer between a pair of electrodes, wherein at least one organic layer comprises at least one compound represented by formula (D-1):

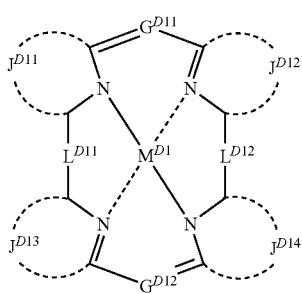

Formula (D-1)

wherein $M^{D1}$ represents a metal ion, $G^{D11}$ and $G^{D12}$ independently represent a nitrogen atom or a substituted or unsubstituted carbon atom, $J^{D11}$, $J^{D12}$, $J^{D13}$ and $J^{D14}$ independently represent an atomic group necessary for forming a 5-membered ring, and $L^{D11}$ and $L^{D12}$ independently represent a linking group.

A fifth aspect of the invention is to provide an organic electroluminescent element having at least one organic layer including a luminescent layer between a pair of electrodes, wherein at least one organic layer comprises at least one compound represented by formula (E-1):

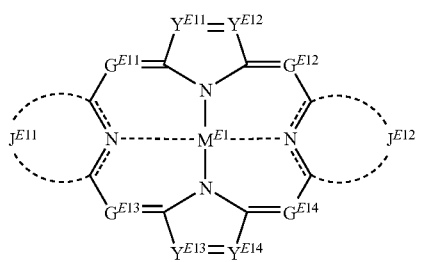

Formula (E-1)

wherein $M^{E1}$ represents a metal ion, $J^{E11}$ and $J^{E12}$ independently represent an atomic group necessary for forming a 5-membered ring, $G^{E11}$, $G^{E12}$, $G^{E13}$ and $G^{E14}$ independently represent a nitrogen atom or a substituted or unsubstituted carbon atom, and $Y^{E11}$, $Y^{E12}$, $Y^{E13}$ and $Y^{E14}$ independently represent a nitrogen atom or a substituted or unsubstituted carbon atom.

A sixth aspect of the invention is to provide an organic electroluminescent element having at least one organic layer including a luminescent layer between a pair of electrodes, wherein at least one organic layer comprises at least one of compounds represented by formula (F-1):

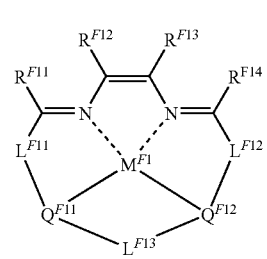

Formula (F-1)

wherein $M^{F1}$ represents a metal ion, $L^{F11}$, $L^{F12}$ and $L^{F13}$ independently represent a linking group, $R^{F11}$, $R^{F12}$, $R^{F13}$ and $R^{F14}$ independently represent a hydrogen atom or a substituent group, $R^{F11}$ and $R^{F12}$, $R^{F12}$ and $R^{F13}$, or $R^{F13}$ and $R^{F14}$ may, if possible, be bonded to each other to form a ring provided that the ring formed by $R^{F11}$ and $R^{F12}$ or $R^{F13}$ and $R^{F14}$ is a 5-membered ring, and $Q^{F11}$ and $Q^{F12}$ independently represent a partial structure containing an atom bonded to $M^{F1}$.

DETAILED DESCRIPTION OF THE INVENTION

Hereinafter, an organic EL element of the present invention is described in detail.

The organic EL element of the invention has at least one organic layer including a luminescent layer between a pair of electrodes. The organic EL element of the invention comprises, in an organic layer, a metal complex of cyclic tetradentate ligand having a specific structure.

The organic EL element of the invention may comprise a hole injection layer, a hole transport layer, an electron injection layer, an electron transport layer, a hole blocking layer, an electron blocking layer, an exciton blocking layer and a protective layer arranged suitably in addition to the luminescent layer, and each of these layers may have another function.

The functions of the metal complexes represented by formulae (A-1), (B-1), (C-1), (D-1), (E-1) and (F-1) in the invention (hereinafter, referred to as the metal complex in the invention) are not limited. When the organic layer is composed of a plurality of layers, the metal complex in the invention may be contained in any of the layers, but is preferably contained in the luminescent layer, and more preferably contained as a luminescent material in the luminescent layer.

One of preferable compounds among the metal complexes in the invention is a compound represented by the following formula (A-1):

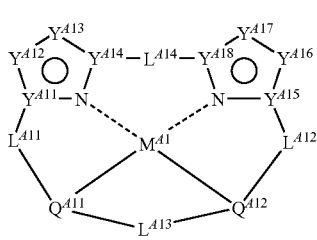

Formula (A-1)

In the formula (A-1), $M^{41}$ represents a metal ion. $Y^{411}$, $Y^{414}$, $Y^{415}$ and $Y^{418}$ independently represent a carbon atom or a nitrogen atom. $Y^{412}$, $Y^{413}$, $Y^{416}$ and $Y^{417}$ independently represent a substituted or unsubstituted carbon atom, a substituted or unsubstituted nitrogen atom, an oxygen atom or a sulfur atom. $L^{A11}$, $L^{A12}$, $L^{A13}$ and $L^{A14}$ independently represent a linking group, and may be the same or different. $Q^{A11}$ and $Q^{A12}$ independently represent a partial structure containing an atom bonded to $M^{A1}$.

The compounds represented by the formula (A-1) are described in detail.

$M^{A1}$ represents a metal ion. The metal ion is not particularly limited, but is preferably a divalent metal ion, more preferably $Pt^{2+}$, $Pd^{2+}$, $Cu^{2+}$, $Ni^{2+}$, $Co^{2+}$, $Zn^{2+}$, $Mg^{2+}$ or $Pb^{2+}$, still more preferably $Pt^{2+}$ or $Cu^{2+}$, and further more preferably $Pt^{2+}$.

$Y^{A11}$, $Y^{A14}$, $Y^{A15}$ and $Y^{A18}$ independently represent a carbon atom or a nitrogen atom. Each of $Y^{A11}$, $Y^{A14}$, $Y^{A15}$ and $Y^{A18}$ is preferably a carbon atom.

$Y^{A12}$, $Y^{A13}$, $Y^{A16}$ and $Y^{A17}$ independently represent a substituted or unsubstituted carbon atom, a substituted or unsubstituted nitrogen atom, an oxygen atom or a sulfur atom. Each of $Y^{A12}$, $Y^{A13}$, $Y^{A16}$ and $Y^{A17}$ is preferably a substituted or unsubstituted carbon atom or a substituted or unsubstituted nitrogen atom.

$L^{A11}$, $L^{A12}$, $L^{A13}$ and $L^{A14}$ independently represent a divalent linking group. The divalent linking group represented by $L^{A11}$, $L^{A12}$, $L^{A13}$ or $L^{A14}$ may be, for example, a single bond or a linking group including carbon, nitrogen, silicon, sulfur, oxygen, germanium, phosphorus or the like, more preferably a single bond, a substituted or unsubstituted carbon atom, a substituted or unsubstituted nitrogen atom, a substituted silicon atom, an oxygen atom, a sulfur atom, a divalent aromatic hydrocarbon cyclic (arylene) group or a divalent aromatic heterocyclic (hetero arylene) group, still more preferably a single bond, a substituted or unsubstituted carbon atom, a substituted or unsubstituted nitrogen atom, a substituted silicon atom, a divalent aromatic hydrocarbon cyclic (arylene) group or a divalent aromatic heterocyclic (hetero arylene) group, and further more preferably a single bond or a substituted or unsubstituted methylene group. Examples of the divalent linking group represented by $L^{A11}$, $L^{A12}$, $L^{A13}$ or $L^{A14}$ include the following groups:

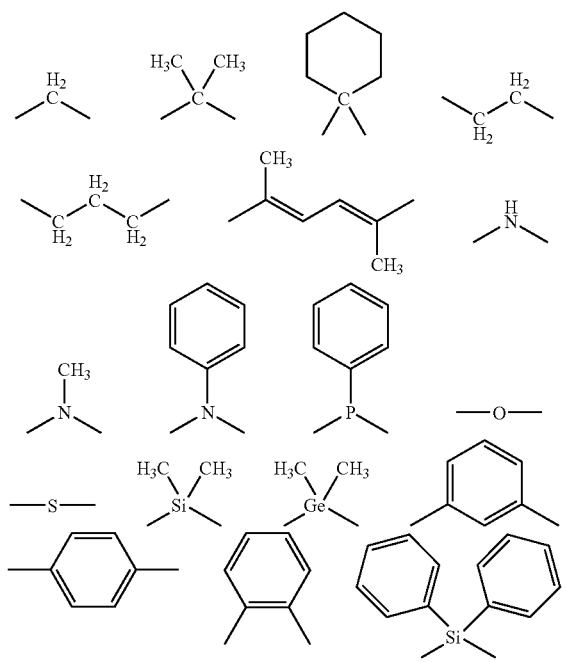
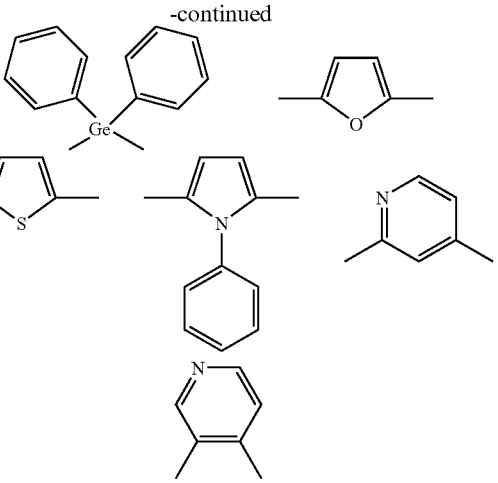

The divalent linking group represented by $L^{A11}$, $L^{A12}$, $L^{A13}$ or $L^{A14}$ may further have a substituent group. The substituent group which can be introduced into it may be, for example, an alkyl group (preferably a C1 to C30, more preferably C1 to C20, particularly preferably C1 to C10 group, for example methyl, ethyl, iso-propyl, tert-butyl, n-octyl, n-decyl, n-hexadecyl, cyclopropyl, cyclopentyl, cyclohexyl, etc.), an alkenyl group (preferably a C2 to C30, more preferably C2 to C20, particularly preferably C2 to C10 group, for example vinyl, allyl, 2-butenyl, 3-pentenyl, etc.), an alkynyl group (preferably a C2 to C30, more preferably C2 to C20, particularly preferably C2 to C10 group, for example propargyl, 3-pentynyl, etc.), an aryl group (preferably a C6 to C30, more preferably C6 to C20, particularly preferably C6 to C12 group, for example phenyl, p-methylphenyl, naphthyl, anthranyl, etc.), an amino group (preferably a C0 to C30, more preferably C0 to C20, particularly preferably C0 to C10 group, for example amino, methylamino, dimethylamino, diethylamino, dibenzylamino, diphenylamino, ditolylamino, etc.), an alkoxy group (preferably a C1 to C30, more preferably C1 to C20, particularly preferably C1 to C10 group, for example methoxy, ethoxy, butoxy, 2-ethylhexyloxy, etc.), an aryloxy group (preferably a C6 to C30, more preferably C6 to C20, particularly preferably C6 to C12 group, for example phenyloxy, 1-naphthyloxy, 2-naphthyloxy, etc.), a heterocyclic oxy group (preferably a C1 to C30, more preferably C1 to C20, particularly preferably C1 to C12 group, for example pyridyloxy, pyrazyloxy, pyrimidyloxy, quinolyloxy, etc.), an acyl group (preferably a C1 to C30, more preferably C1 to C20, particularly preferably C1 to C12 group, for example acetyl, benzoyl, formyl, pivaloyl, etc.), an alkoxycarbonyl group (preferably a C2 to C30, more preferably C2 to C20, particularly preferably C2 to C12 group, for example methoxycarbonyl, ethoxycarbonyl, etc.), an aryloxycarbonyl group (preferably a C7 to C30, more preferably C7 to C20, particularly preferably C7 to C12 group, for example phenyloxycarbonyl, etc.), an acyloxy group (preferably a C2 to C30, more preferably C2 to C20, particularly preferably C2 to C10 group, for example acetoxy, benzoyloxy, etc.), an acylamino group (preferably a C2 to C30, more preferably C2 to C20, particularly preferably C2 to C10 group, for example acetylamino, benzoylamino, etc.), an alkoxycarbonylamino group (preferably a C2 to C30, more preferably C2 to C20, particularly preferably C2 to C12 group, for example methoxycarbonylamino, etc.), an aryloxycarbonylamino group (preferably a C7 to C30, more preferably C7 to C20, particularly preferably C7 to C12 group, for example phenyloxycarbonylamino, etc.), a sulfonylamino group (preferably a C1 to C30, more preferably C1 to C20, particularly preferably C1 to C12 group, for example methanesulfonylamino, benzenesulfonylamino, etc.), a sulfamoyl group (preferably a C0 to C30, more preferably C0 to C20, particularly preferably C0 to C12 group, for example sulfamoyl, methylsulfamoyl, dimethylsulfamoyl, phenylsulfamoyl, etc.), a carbamoyl group (preferably a C1 to C30, more preferably C1 to C20, particularly preferably C1 to C12 group, for example carbamoyl, methylcarbamoyl, diethylcarbamoyl, phenylcarbamoyl, etc.), an alkylthio group (preferably a C1 to C30, more preferably C1 to C20, particularly preferably C1 to C12 group, for example methylthio, ethylthio, etc.), an arylthio group (preferably a C6 to C30, more preferably C6 to C20, particularly preferably C6 to C12 group, for example phenylthio, etc.), a heterocyclic thio group (preferably a C1 to C30, more preferably C1 to C20, particularly preferably C1 to C12 group, for example pyridylthio, 2-benzimizolylthio, 2-benzoxazolylthio, 2-benzthiazolylthio, etc.), a sulfonyl group (preferably a C1 to C30, more preferably C1 to C20, particularly preferably C1 to C12 group, for example mesyl, tosyl, etc.), a sulfinyl group (preferably a C1 to C30, more preferably C1 to C20, particularly preferably C1 to C12 group, for example methanesulfinyl, benzenesulfinyl, etc.), an ureido group (preferably a C1 to C30, more preferably C1 to C20, particularly preferably C1 to C12 group, for example ureido, methylureido, phenylureido, etc.), a phosphoric amide group (preferably a C1 to C30, more preferably C1 to C20, particularly preferably C1 to C12 group, for example diethylphosphoric amide, phenylphosphoric amide, etc.), a hydroxy group, a mercapto group, a halogen atom (for example a fluorine atom, chlorine atom, bromine atom, iodine atom), a cyano group, a sulfo group, a carboxyl group, a nitro group, a hydroxamic acid group, a sulfino group, a hydrazino group, an imino group, a heterocyclic group (preferably a C1 to C30, more preferably C1 to C12 group containing a heteroatom such as a nitrogen atom, oxygen atom and sulfur atom, specifically imidazolyl, pyridyl, quinolyl, furyl, thienyl, piperidyl, morpholino, benzoxazolyl, benzimidazolyl, benzthiazolyl, carbazolyl group, azepinyl group, etc.), a silyl group (preferably a C3 to C40, more preferably C3 to C30, particularly preferably C3 to C24 group, for example trimethylsilyl, triphenylsilyl, etc.) or a silyloxy group (preferably a C3 to C40, more preferably C3 to C30, particularly preferably C3 to C24 group, for example trimethylsilyloxy, triphenylsilyloxy, etc.).

These substituent groups may be further substituted. A substituent group on these substituent groups is preferably an alkyl group, an aryl group, a heterocyclic group, a halogen atom or a silyl group, more preferably an alkyl group, an aryl group, a heterocyclic group or a halogen atom, and still more preferably an alkyl group, an aryl group, an aromatic heterocyclic group or a fluorine atom.

$Q^{411}$ and $Q^{412}$ independently represent a partial structure containing an atom bonded to $M^{41}$. $Q^{411}$ and $Q^{412}$ independently represent preferably a group bonded via a carbon atom, a group bonded via a nitrogen atom, a group bonded via a silicon atom, a group bonded via a phosphorus atom, a group bonded via an oxygen atom or a group bonded via a sulfur atom to $M^{41}$, more preferably a group bonded via a carbon atom, a nitrogen atom, an oxygen atom or a sulfur atom, still more preferably a group bonded via a carbon atom or a nitrogen atom, and further more preferably a group bonded via a carbon atom.

The group bonded via a carbon atom is preferably an aryl group bonded via a carbon atom, a 5-membered heteroaryl group bonded via a carbon atom or a 6-membered heteroaryl group bonded via a carbon atom, more preferably an aryl group bonded via a carbon atom, a nitrogen-containing 5-membered heteroaryl group bonded via a carbon atom or a nitrogen-containing 6-membered heteroaryl group bonded via a carbon atom, and still more preferably an aryl group bonded via a carbon atom.

The group bonded via a nitrogen atom is preferably a substituted amino group or a nitrogen-containing 5-membered heteroaryl group bonded via a nitrogen atom, more preferably a nitrogen-containing 5-membered heteroaryl group bonded via a nitrogen atom.

The group bonded via a phosphorus atom is preferably a substituted phosphino group. The group bonded via a silicon atom is preferably a substituted silyl group. The group bonded via an oxygen atom is preferably an oxy group, and the group bonded via a sulfur atom is preferably a sulfide group.

The compound represented by the formula (A-1) is more preferably a compound represented by the following formula (A-2), (A-3) or (A-4).

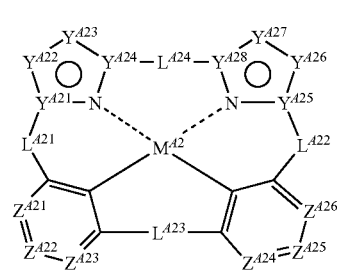

Formula (A-2)

In the formula (A-2), $M^{42}$ represents a metal ion. $Y^{421}$, $Y^{424}$, $Y^{425}$ and $Y^{428}$ independently represent a carbon atom or a nitrogen atom. $Y^{422}$, $Y^{423}$, $Y^{426}$ and $Y^{427}$ independently represent a substituted or unsubstituted carbon atom, a substituted or unsubstituted nitrogen atom, an oxygen atom or a sulfur atom. $L^{421}$, $L^{422}$, $L^{423}$ and $L^{424}$ independently represent a linking group. $Z^{421}$, $Z^{422}$, $Z^{423}$, $Z^{424}$, $Z^{425}$ and $Z^{426}$ independently represent a nitrogen atom or a substituted or unsubstituted carbon atom. Formula (A-3)

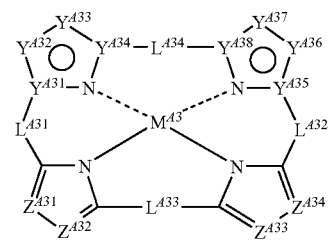

In the formula (A-3), $M^{43}$ represents a metal ion. $Y^{431}$, $Y^{434}$, $Y^{435}$ and $Y^{438}$ independently represent a carbon atom or a nitrogen atom. $Y^{432}$, $Y^{433}$, $Y^{436}$ and $Y^{437}$ independently represent a substituted or unsubstituted carbon atom, a substituted or unsubstituted nitrogen atom, an oxygen atom or a sulfur atom. $L^{431}$, $L^{432}$, $L^{433}$ and $L^{434}$ independently represent a linking group. $Z^{431}$, $Z^{432}$, $Z^{433}$ and $Z^{434}$ independently represent a nitrogen atom or a substituted or unsubstituted carbon atom.

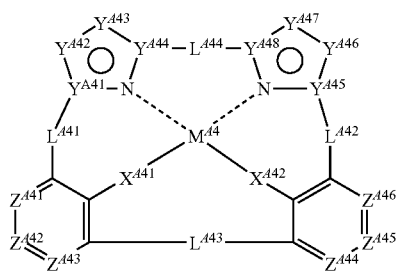

Formula (A-4)

In the formula (A-4), $M^{44}$ represents a metal ion. $Y^{441}$, $Y^{444}$, $Y^{445}$ and $Y^{448}$ independently represent a carbon atom or a nitrogen atom. $Y^{442}$, $Y^{443}$, $Y^{446}$ and $Y^{447}$ independently represent a substituted or unsubstituted carbon atom, a substituted or unsubstituted nitrogen atom, an oxygen atom or a sulfur atom. $L^{441}$, $L^{442}$, $L^{443}$ and $L^{444}$ independently represent a linking group. $Z^{441}$, $Z^{442}$, $Z^{443}$, $Z^{444}$, $Z^{445}$ and $Z^{446}$ independently represent a nitrogen atom or a substituted or unsubstituted carbon atom. $X^{441}$ and $X^{442}$ independently represent an oxygen atom, a sulfur atom or a substituted or unsubstituted nitrogen atom.

The compound represented by the formula (A-2) is described in detail.

$M^{42}$, $Y^{421}$, $Y^{424}$, $Y^{425}$, $Y^{428}$, $Y^{422}$, $Y^{423}$, $Y^{426}$, $Y^{427}$, $L^{421}$, $L^{422}$, $L^{423}$ and $L^{424}$ have the same meaning as defined above in their corresponding $M^{41}$, $Y^{411}$, $Y^{414}$, $Y^{415}$, $Y^{418}$, $Y^{412}$, $Y^{413}$, $Y^{416}$, $Y^{417}$, $L^{411}$, $L^{412}$, $L^{413}$ and $L^{414}$ in the formula (A-1), and their preferable examples are also the same as defined above.

$Z^{421}$, $Z^{422}$, $Z^{423}$, $Z^{424}$, $Z^{425}$ and $Z^{426}$ independently represent a nitrogen atom or a substituted or unsubstituted carbon atom. $Z^{421}$, $Z^{422}$, $Z^{423}$, $Z^{424}$, $Z^{425}$ and $Z^{426}$ independently represent preferably a substituted or unsubstituted carbon atom, and more preferably an unsubstituted carbon atom. A substituent group with which the carbon atom is substituted may be selected from the above-mentioned substituent groups listed as examples of the substituent group on the divalent linking group represented by $L^{411}$, $L^{412}$, $L^{413}$ or $L^{414}$ in the formula (A-1).

The compound represented by the formula (A-3) is described in detail.

$M^{43}$, $Y^{431}$, $Y^{434}$, $Y^{435}$, $Y^{438}$, $Y^{432}$, $Y^{433}$, $Y^{436}$, $Y^{437}$, $L^{431}$, $L^{432}$, $L^{433}$ and $L^{434}$ have the same meaning as defined above in their corresponding $M^{41}$, $Y^{411}$, $Y^{414}$, $Y^{415}$, $Y^{418}$, $Y^{412}$, $Y^{413}$, $Y^{416}$, $Y^{417}$, $L^{411}$, $L^{412}$, $L^{413}$ and $L^{414}$ in the formula (A-1), and their preferable examples are also the same as defined above.

$Z^{431}$, $Z^{432}$, $Z^{433}$ and $Z^{434}$ independently represent a nitrogen atom or a substituted or unsubstituted carbon atom. Each of $Z^{431}$, $Z^{432}$, $Z^{433}$ and $Z^{434}$ is preferably a substituted or unsubstituted carbon atom, and more preferably an unsubstituted carbon atom. A substituent group with which the carbon atom is substituted may be selected from the above-mentioned substituent groups listed as examples of the substituent group on the divalent linking group represented by $L^{411}$, $L^{412}$, $L^{413}$ or $L^{414}$ in the formula (A-1).

The compound represented by the formula (A-4) is described in detail.

$M^{44}$, $Y^{441}$, $Y^{444}$, $Y^{445}$, $Y^{448}$, $Y^{442}$, $Y^{443}$, $Y^{446}$, $Y^{447}$, $L^{441}$, $L^{442}$, $L^{443}$ and $L^{444}$ have the same meaning as defined above in their corresponding $M^{41}$, $Y^{411}$, $Y^{414}$, $Y^{415}$, $Y^{418}$, $Y^{412}$, $Y^{413}$, $Y^{416}$, $Y^{417}$, $L^{411}$, $L^{412}$, $L^{413}$ and $L^{414}$ in the formula (A-1), and their preferable examples are also the same as defined above.

$Z^{441}$, $Z^{442}$, $Z^{443}$, $Z^{444}$, $Z^{445}$ and $Z^{446}$ independently represent a nitrogen atom or a substituted or unsubstituted carbon atom. Each of $Z^{441}$, $Z^{442}$, $Z^{443}$, $Z^{444}$, $Z^{445}$ and $Z^{446}$ is preferably a substituted or unsubstituted carbon atom, and more preferably an unsubstituted carbon atom. A substituent group with which the carbon atom is substituted may be selected from the above-mentioned substituent groups listed as examples of the substituent group on the divalent linking group represented by $L^{411}$, $L^{412}$, $L^{413}$ or $L^{414}$ in the formula (A-1).

$X^{441}$ and $X^{442}$ independently represent an oxygen atom, a sulfur atom or a substituted or unsubstituted nitrogen atom. Each of $X^{441}$ and $X^{442}$ is preferably an oxygen atom or a sulfur atom, and more preferably an oxygen atom.

The compound represented by the formula (A-1) or (A-2) is more preferably a compound represented by the following formula (A-5).

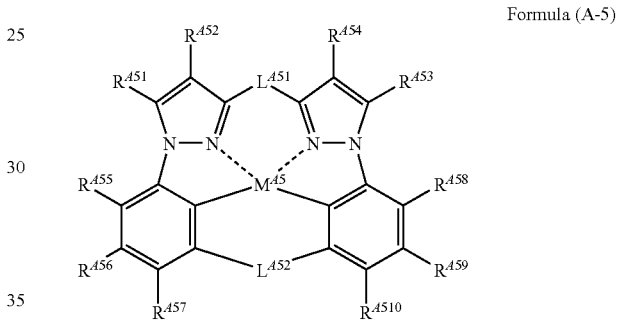

Formula (A-5)

In the formula (A-5), $M^{45}$ represents a metal ion. $R^{451}$, $R^{452}$, $R^{453}$, $R^{454}$, $R^{455}$, $R^{456}$, $R^{457}$, $R^{458}$, $R^{459}$ and $R^{4510}$ independently represent a hydrogen atom or a substituent group. $L^{451}$ and $L^{452}$ independently represent a linking group.

The compound represented by formula (A-5) is described in detail. $M^{45}$ has the same meaning as defined above in $M^{41}$ in the formula (A-1), and its preferable examples are also the same as defined above.

$R^{451}$, $R^{452}$, $R^{453}$, $R^{454}$, $R^{455}$, $R^{456}$, $R^{457}$, $R^{458}$, $R^{459}$ and $R^{4510}$ independently represent a hydrogen atom or a substituent group. The substituent group may be selected from the above-mentioned substituent groups listed as examples of the substituent group on the divalent linking group represented by $L^{411}$, $L^{412}$, $L^{413}$ or $L^{414}$ in the formula (A-1).

Each of $R^{451}$ and $R^{453}$ is preferably a hydrogen atom, an alkyl group, an aryl group, an alkoxy group, a dialkylamino group, a diarylamino group, or a heterocyclic group, more preferably a hydrogen atom, an alkyl group or an aryl group, and still more preferably a hydrogen atom.

Each of $R^{452}$ and $R^{454}$ is preferably a hydrogen atom, an alkyl group, an aryl group, an alkoxy group, a dialkylamino group, a diarylamino group, or a heterocyclic group, more preferably a hydrogen atom, an alkyl group or an aryl group, and still more preferably a hydrogen atom or an aryl group.

Each of $R^{455}$ and $R^{458}$ is preferably a hydrogen atom, an alkyl group, an aryl group, an alkoxy group, a dialkylamino group, a diarylamino group, a heterocyclic group, a cyano group or a fluorine atom, more preferably a hydrogen atom, an alkyl group, an aryl group, a cyano group or a fluorine atom, and still more preferably a hydrogen atom or a fluorine atom.

Each of $R^{A56}$ and $R^{A59}$ is preferably a hydrogen atom, an alkyl group, an aryl group, an alkoxy group, a dialkylamino group, a diarylamino group, a heterocyclic group, a cyano group or a fluorine atom, more preferably a hydrogen atom, an alkyl group, an aryl group, a cyano group or a fluorine atom, and still more preferably a hydrogen atom, an alkyl group or a cyano group.

Each of $R^{A57}$ and $R^{A510}$ is preferably a hydrogen atom, an alkyl group, an aryl group, an alkoxy group, a dialkylamino group, a diarylamino group, a heterocyclic group, a cyano group or a fluorine atom, more preferably a hydrogen atom, an alkyl group, an aryl group, a cyano group or a fluorine atom, and still more preferably a hydrogen atom or a fluorine atom.

$L^{A51}$ and $L^{A52}$ independently represent a divalent linking group. The divalent linking group represented by $L^{A51}$ or $L^{A52}$ may be, for example, a single bond or a linking group including carbon, nitrogen, silicon, sulfur, oxygen, germanium, phosphorus or the like. Specific examples thereof include the divalent linking groups listed as examples of the divalent linking group represented by $L^{A11}$, $L^{A12}$, $L^{A13}$ or $L^{A14}$ in the formula (A-1). Each of $L^{A51}$ and $L^{A52}$ is preferably a substituted or unsubstituted methylene group or a substituted or unsubstituted ethylene group.

Specific examples of the compounds represented by the formula (A-1) are illustrated below, but the invention is not limited thereto.

(A1)
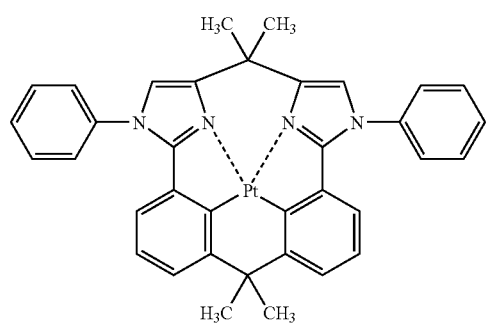

(A2)
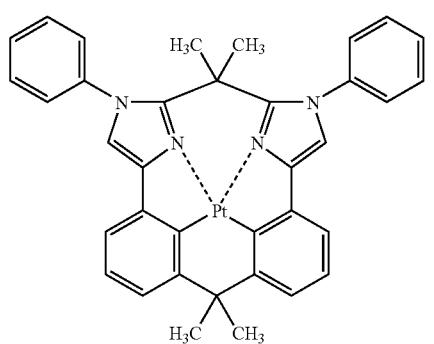

(A3)
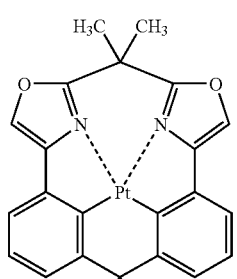

(A4)
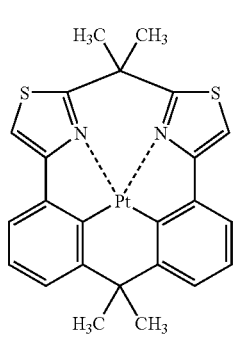

(A5)
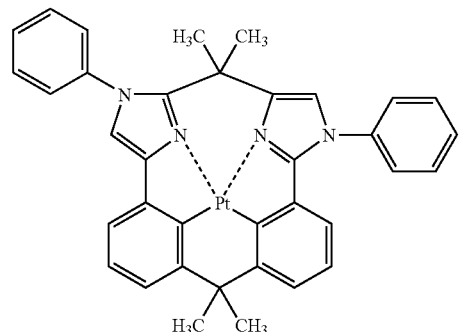

(A6)
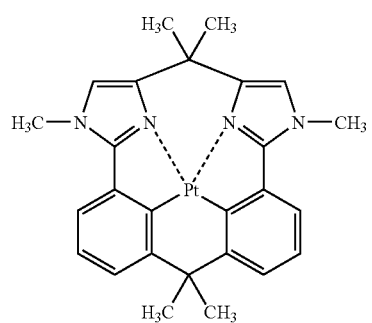

(A7)
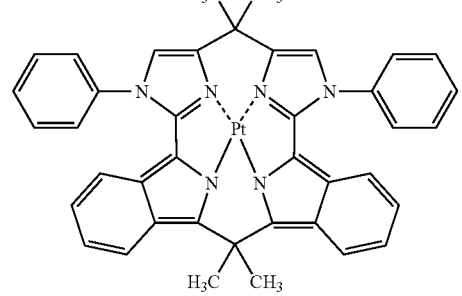

-continued
(A8)
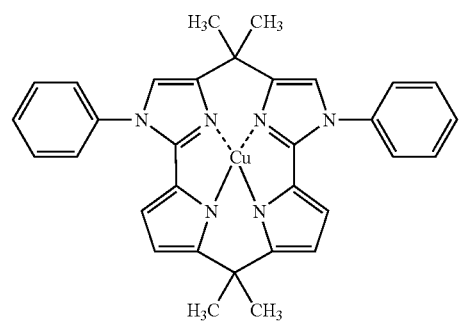
(A12)
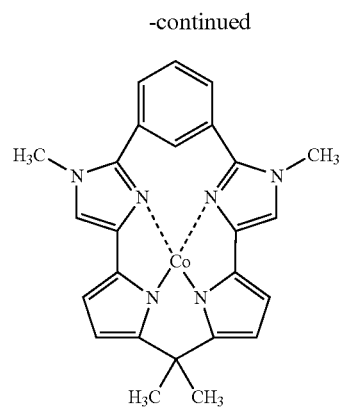
(A9)
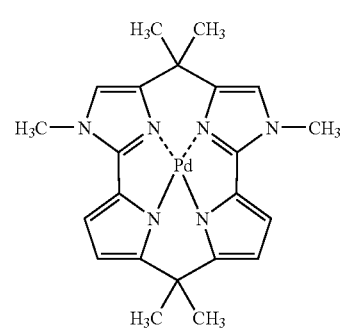
(A13)
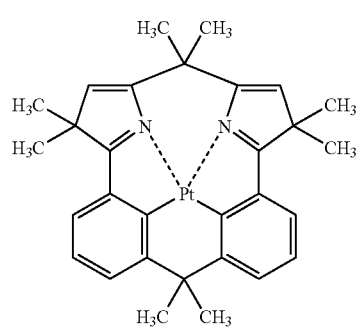
(A10)
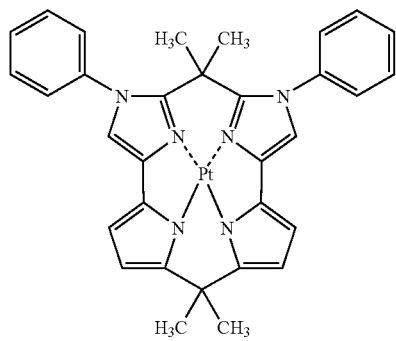
(A14)
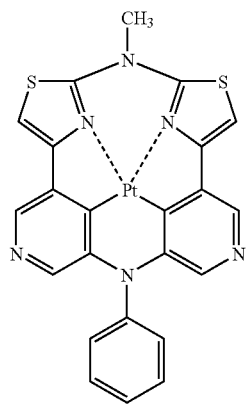
(A11)
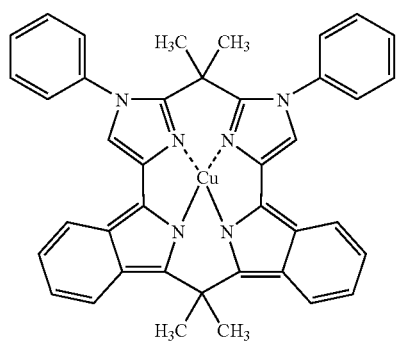
(A15)
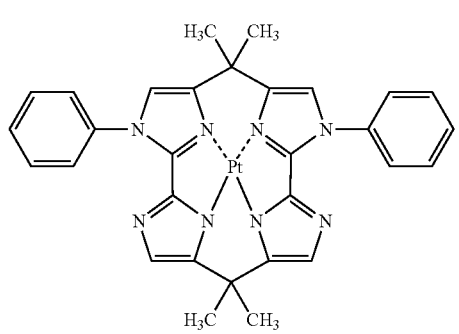

-continued
(A16) 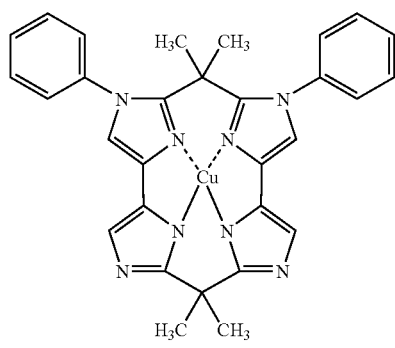
(A17) 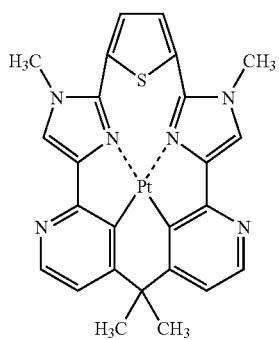
(A18) 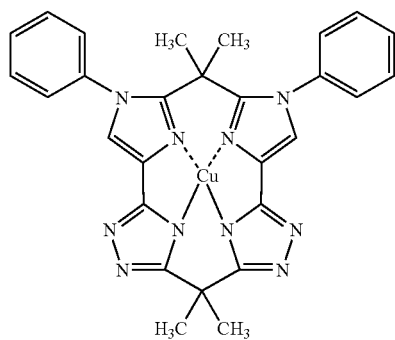
(A19) 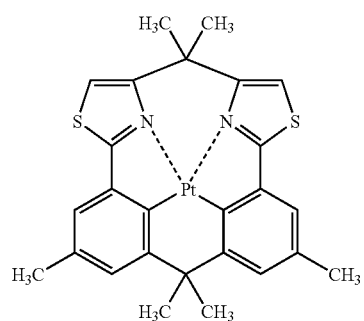
-continued
(A20) 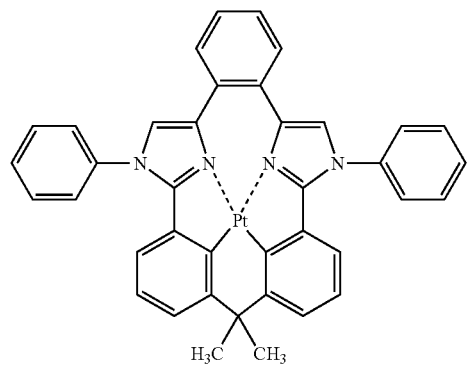
(A21) 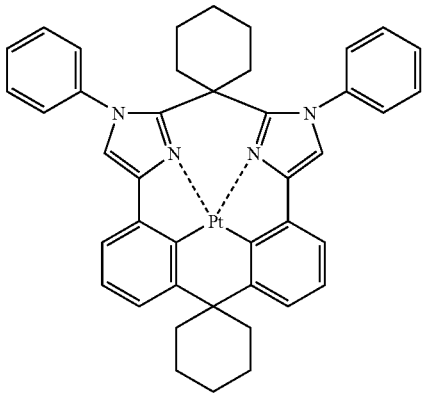
(A22) 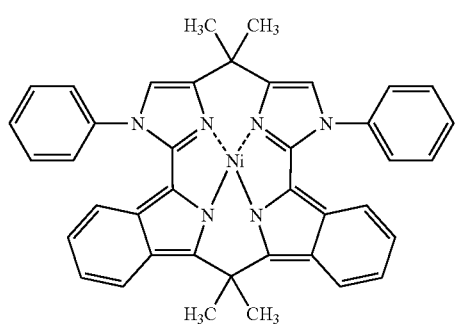
(A23) 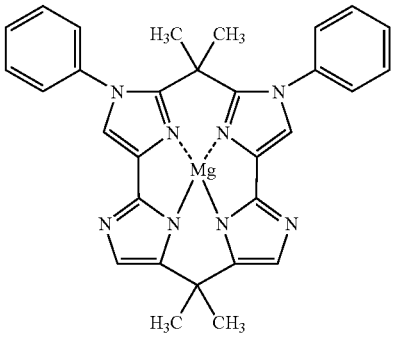

-continued
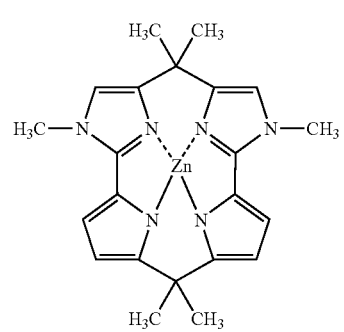
(A24)
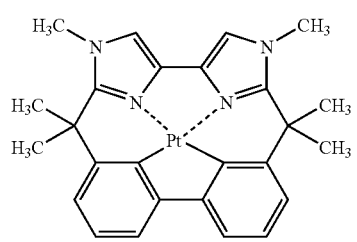
(A25)
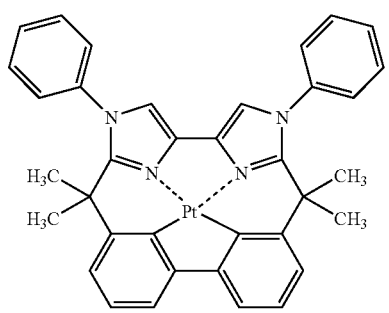
(A26)
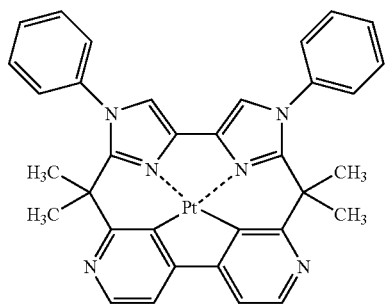
(A27)
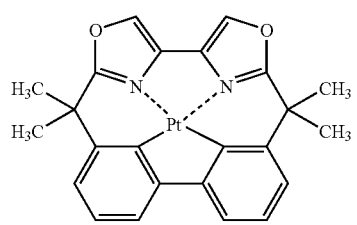
(A28)
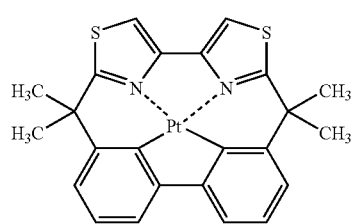
(A29)
-continued
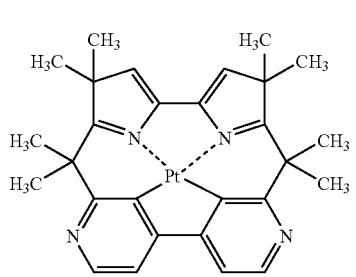
(A30)
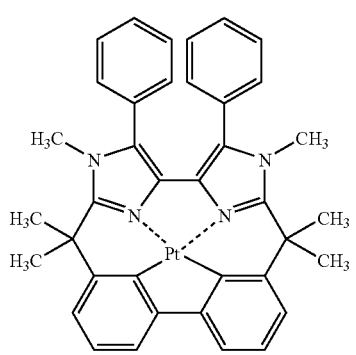
(A31)
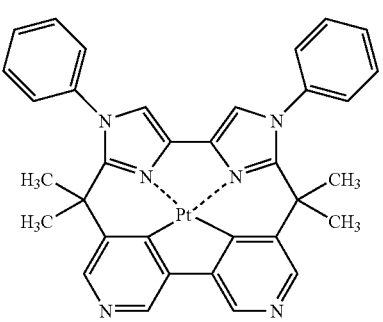
(A32)
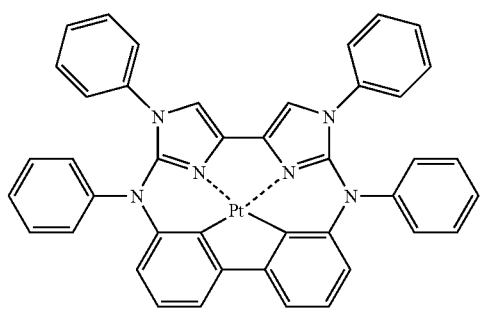
(A33)
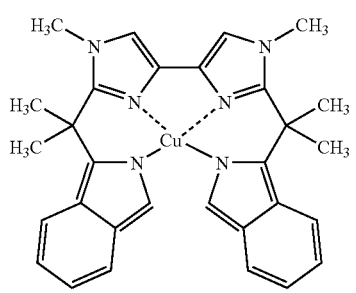
(A34)

-continued
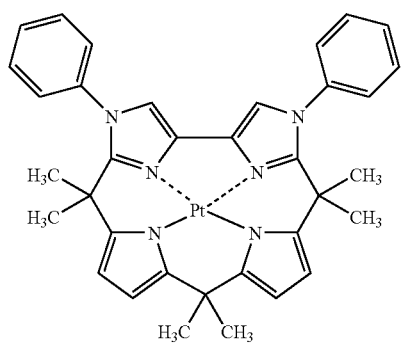
(A35)
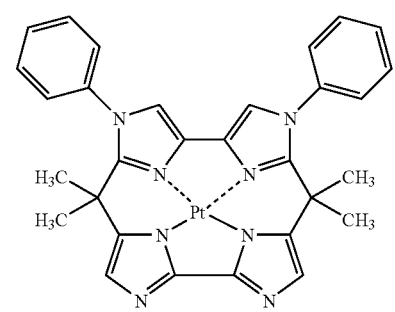
(A36)
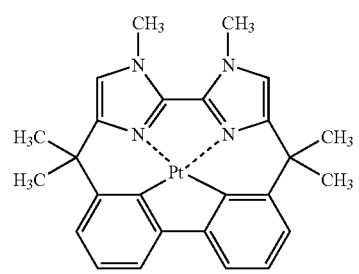
(A37)
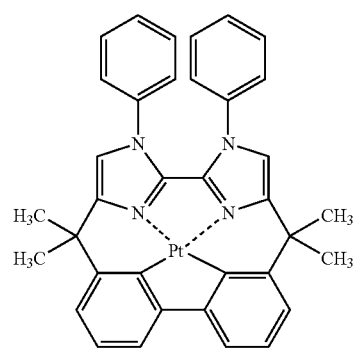
(A38)
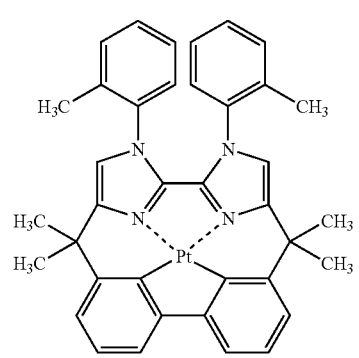
(A39)
-continued
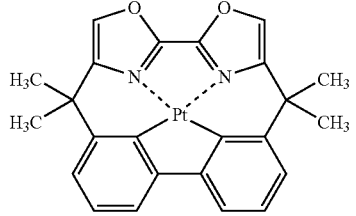
(A40)
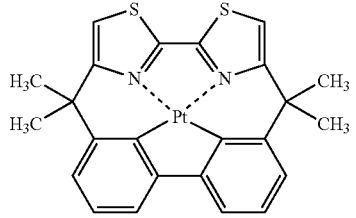
(A41)
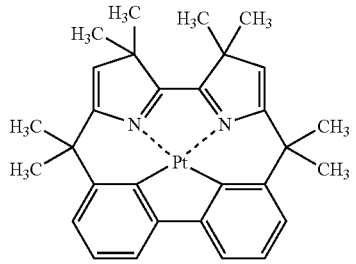
(A42)
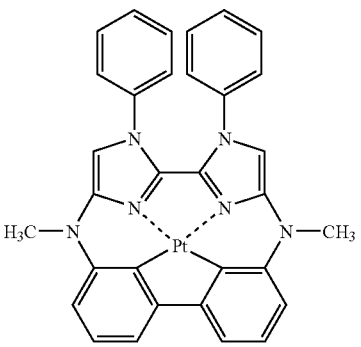
(A43)
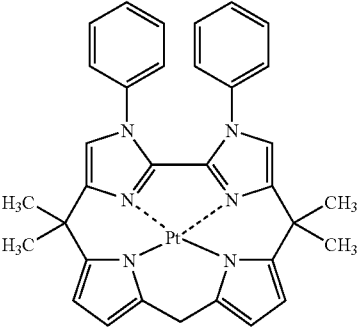
(A44)

-continued
(A45)
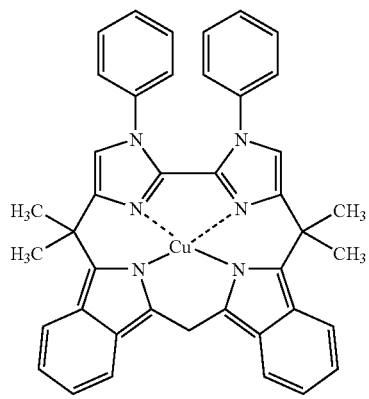
(A46)
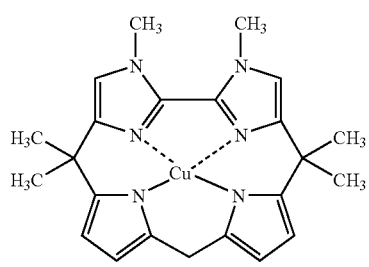
(A47)
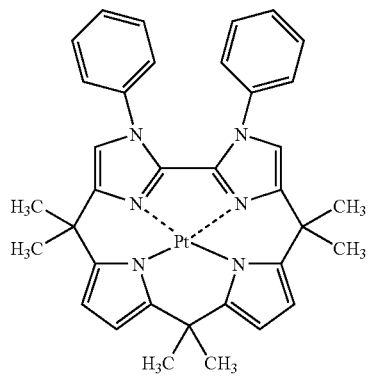
(A48)
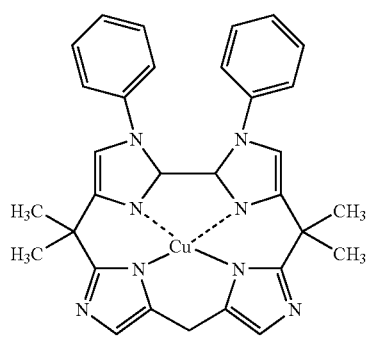
-continued
(A49)
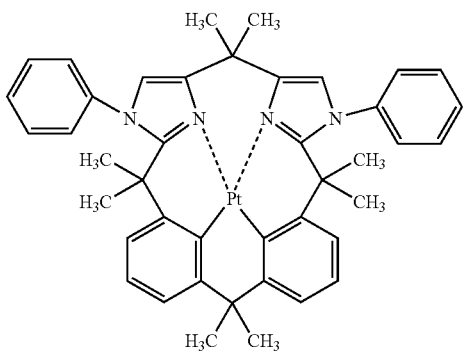
(A50)
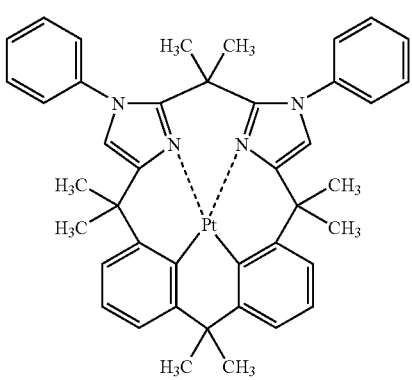
(A51)
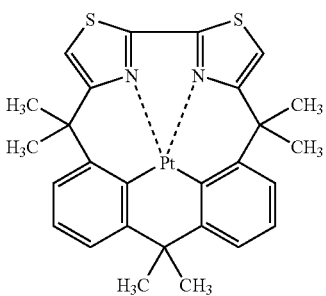
(A52)
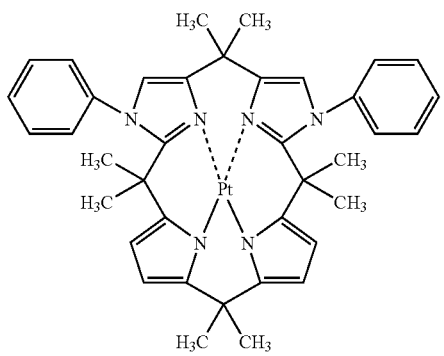

-continued
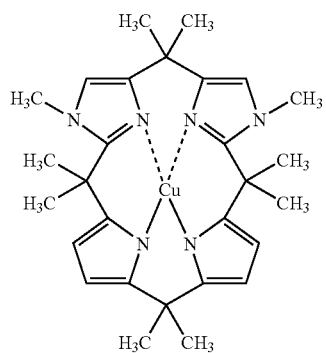
(A53)
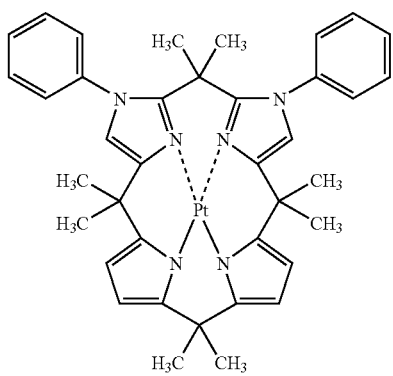
(A54)
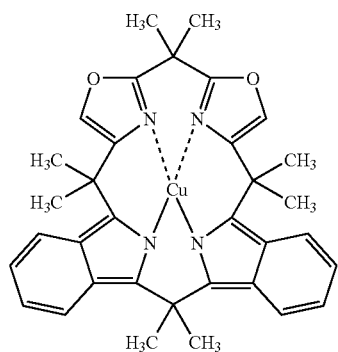
(A55)
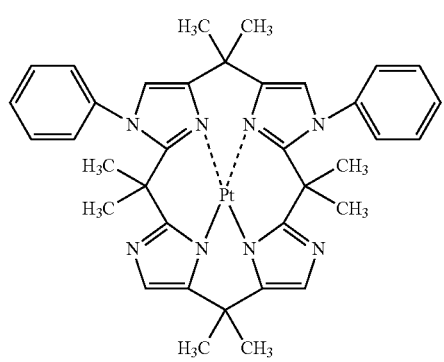
(A56)
-continued
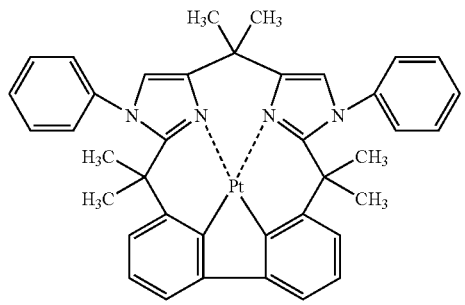
(A57)
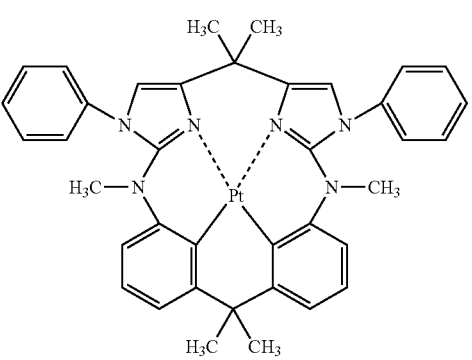
(A58)
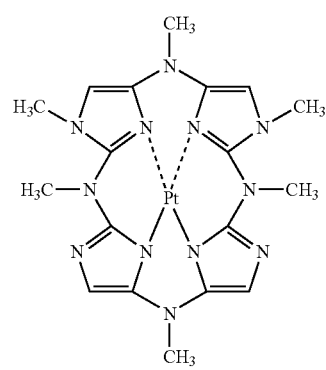
(A59)
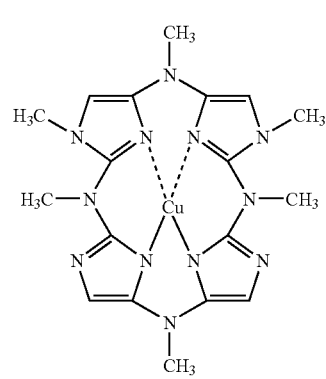
(A60)

-continued
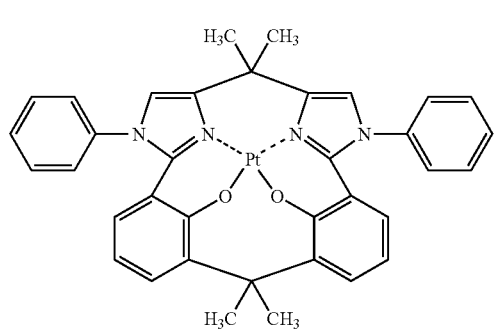
(A61)
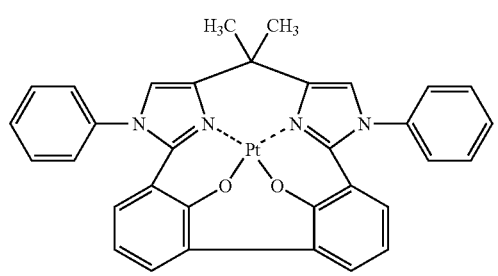
(A62)
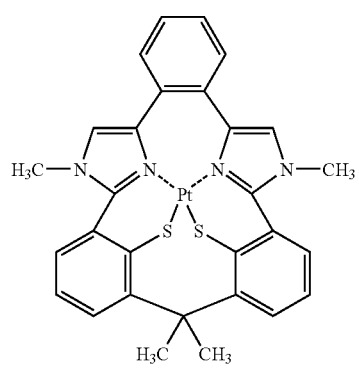
(A63)
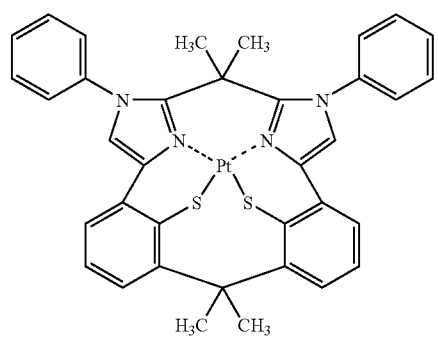
(A64)
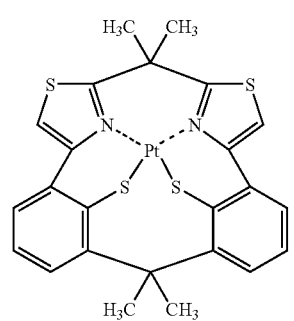
(A65)
-continued
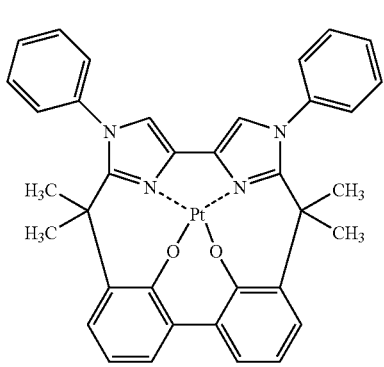
(A66)
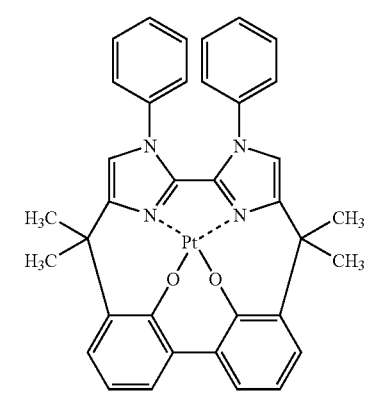
(A67)
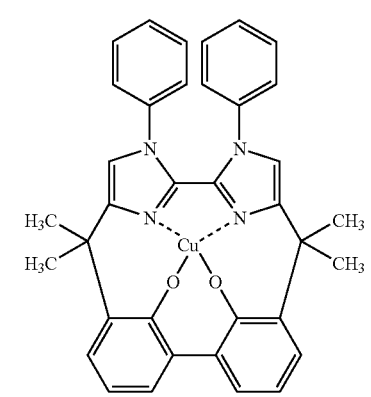
(A68)
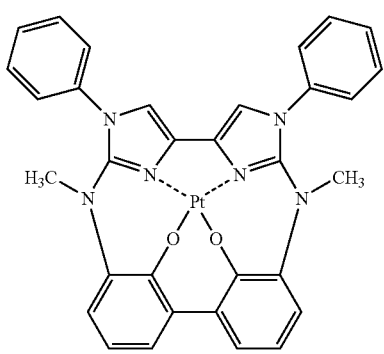
(A69)

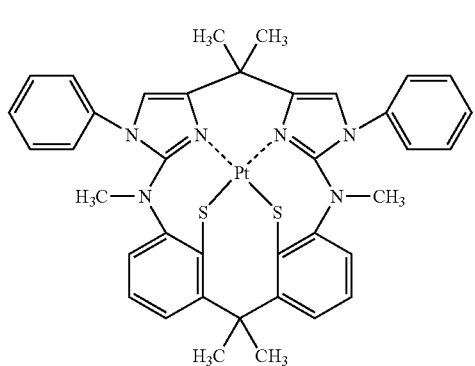
(A70)
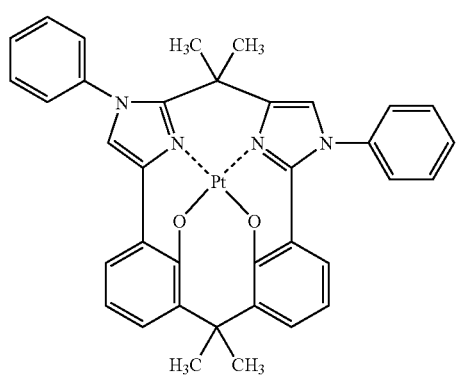
(A71)
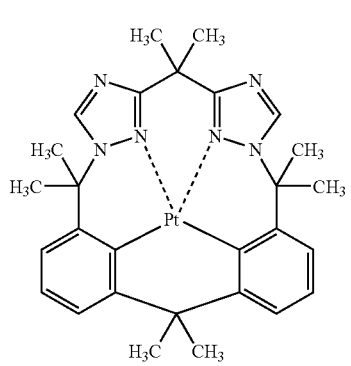
(A74)
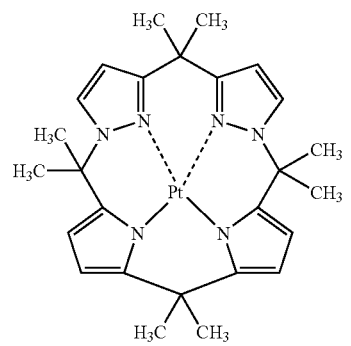
(A75)
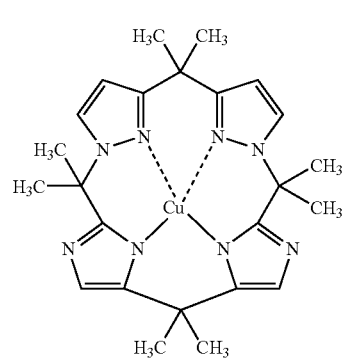
(A76)
(A72)
(A73)
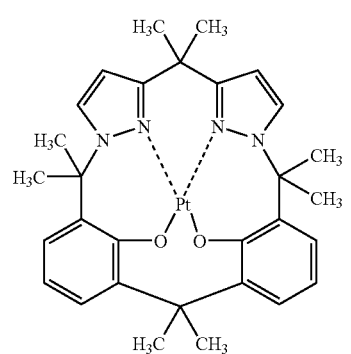
(A77)

-continued
(A78)
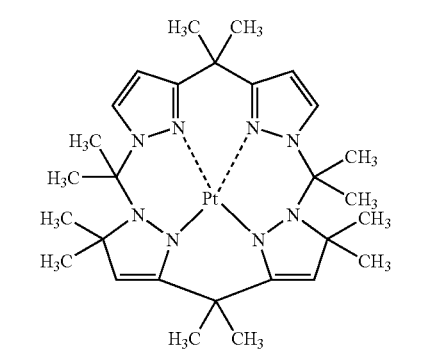
(A79)
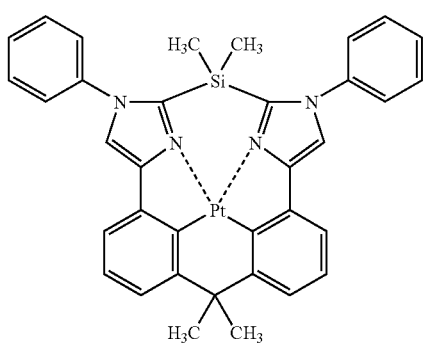
(A80)
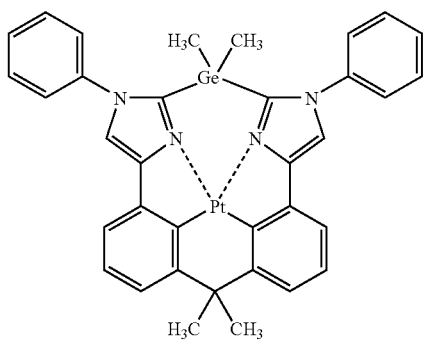
(A81)
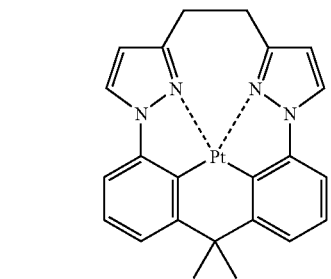
(A82)
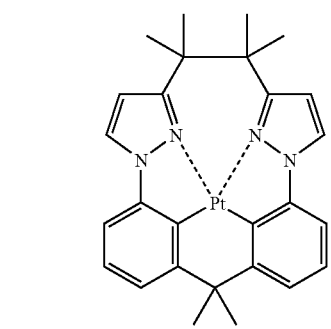
-continued
(A83)
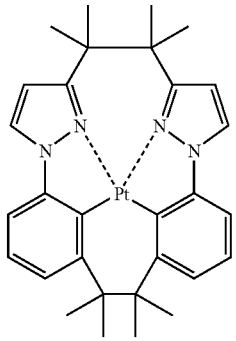
(A84)
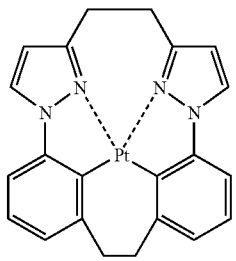
(A85)
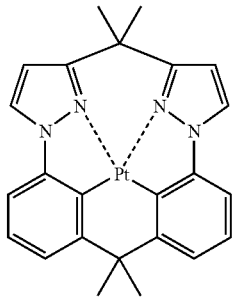
(A86)
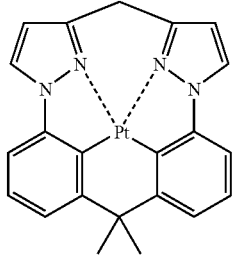
(A87)
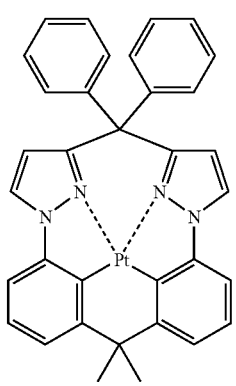

-continued
(A88) 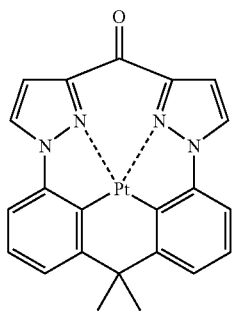
(A89) 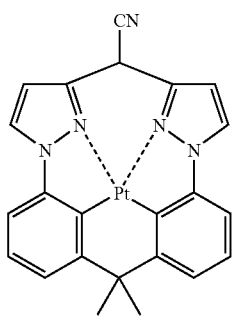
(A90) 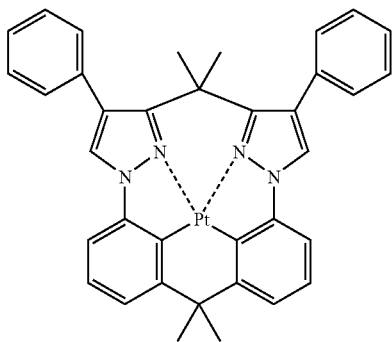
(A91) 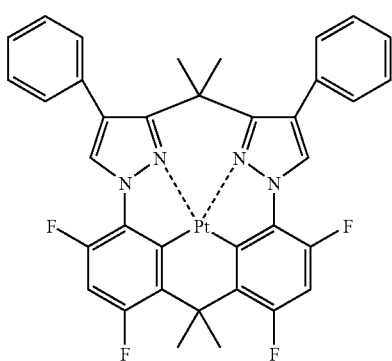
-continued
(A92) 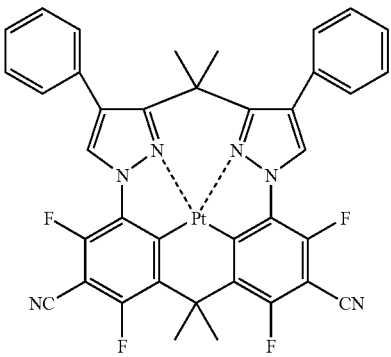
(A93) 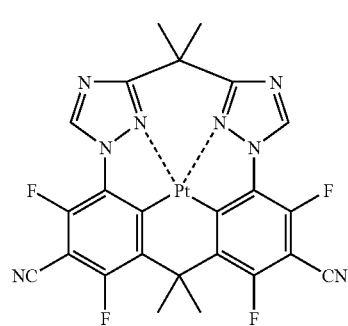
(A94) 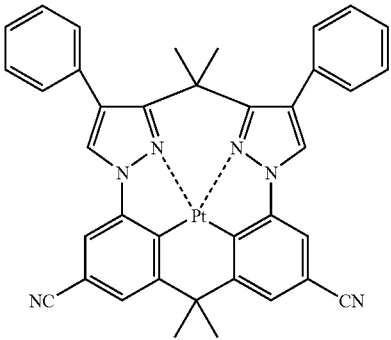
(A95) 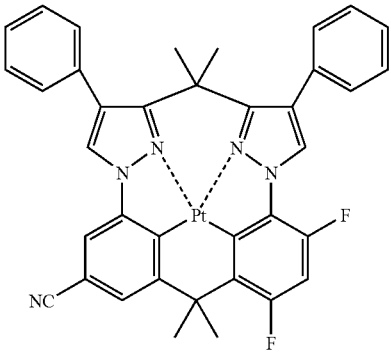

-continued
(A96)
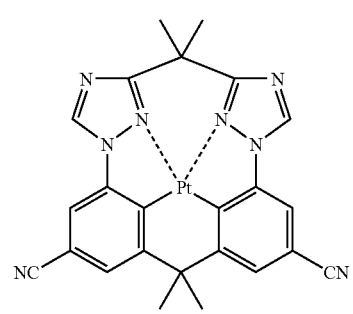
(A97)
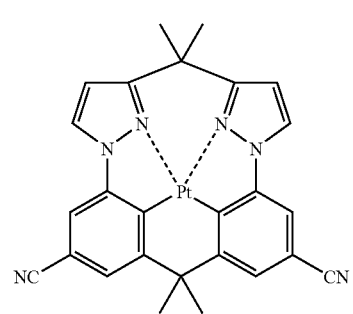
(A98)
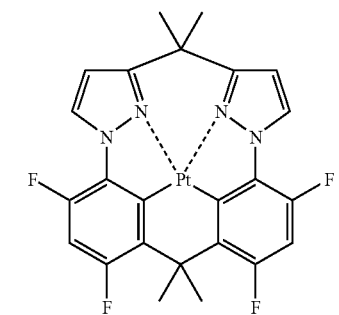
(A99)
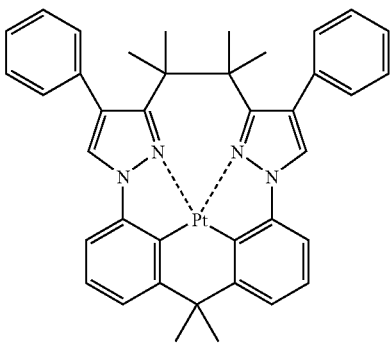
(A100)
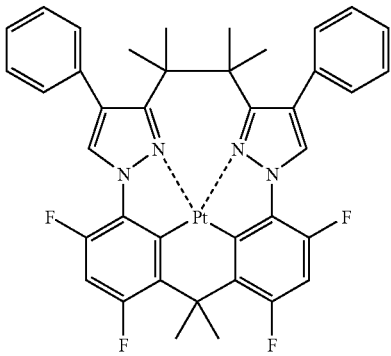
-continued
(A101)
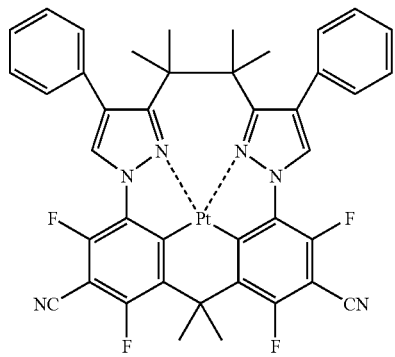
(A102)
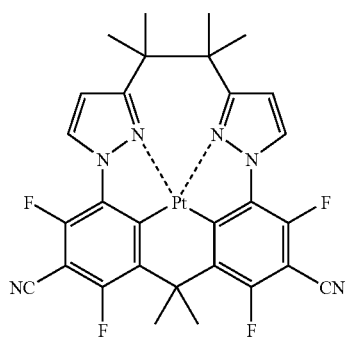
(A103)
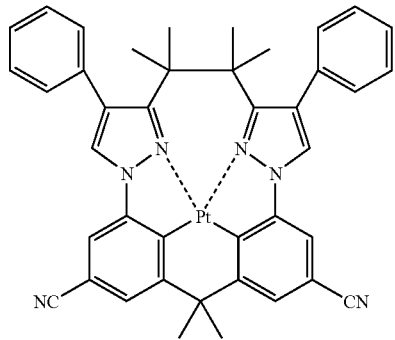
(A104)
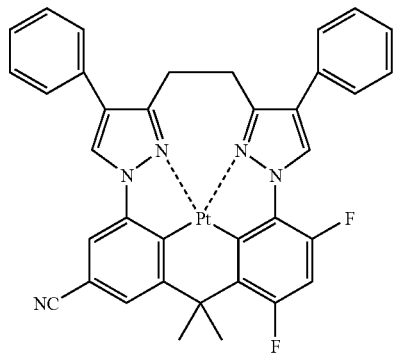

-continued
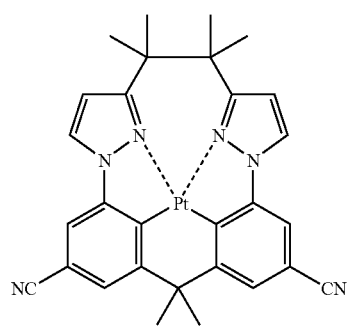 (A105)
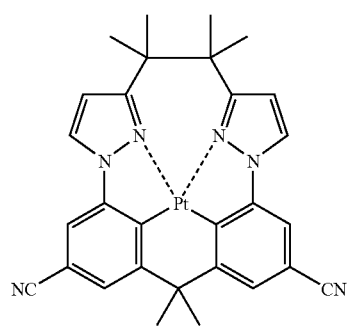 (A106)
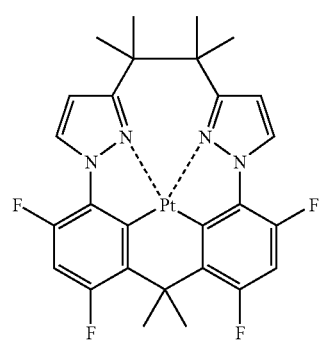 (A107)
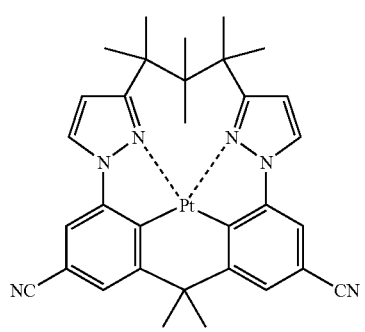 (A108)
-continued
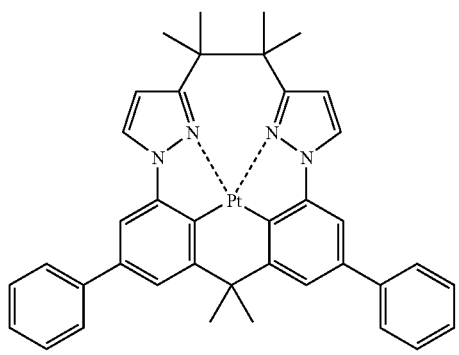 (A109)
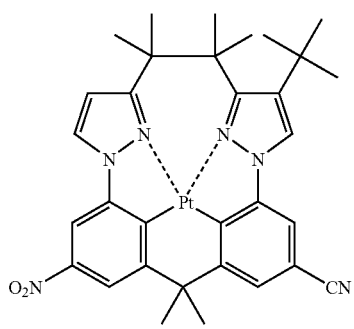 (A110)
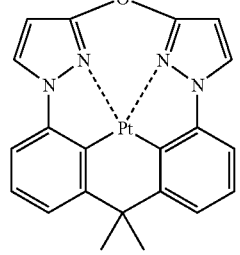 (A111)
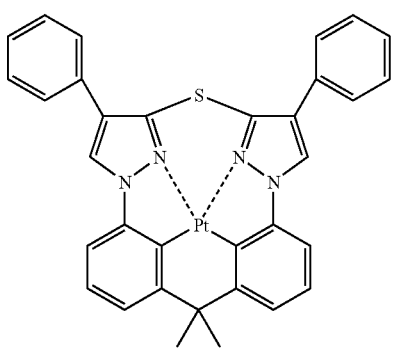 (A112)
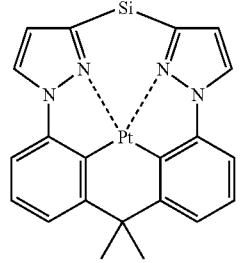 (A113)

-continued
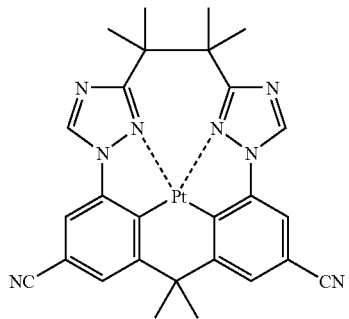 (A114)
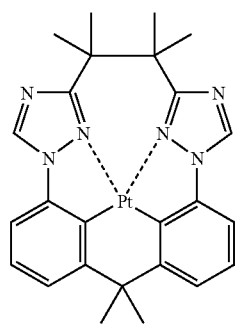 (A115)
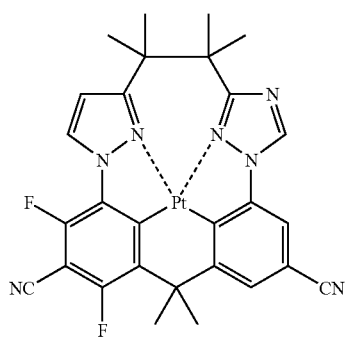 (A116)
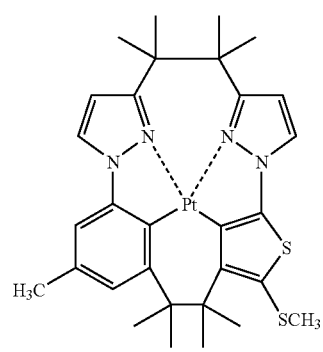 (A117)
-continued
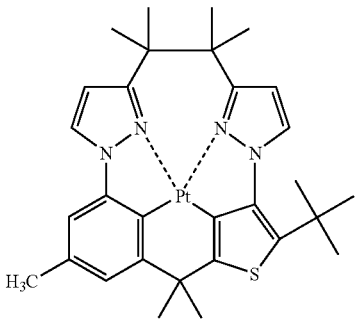 (A118)
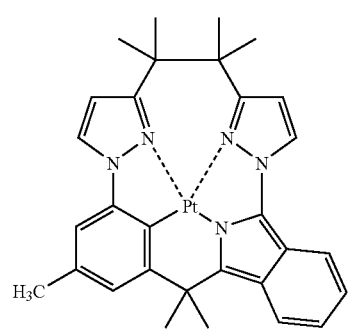 (A119)
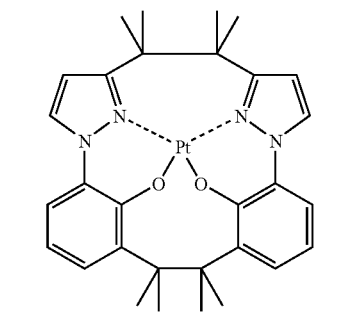 (A120)
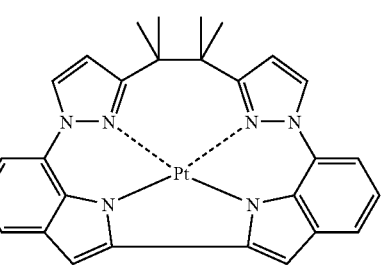 (A121)
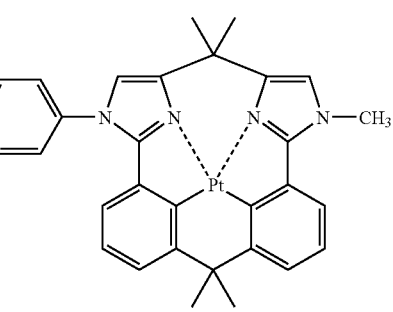 (A122)

-continued
(A123)
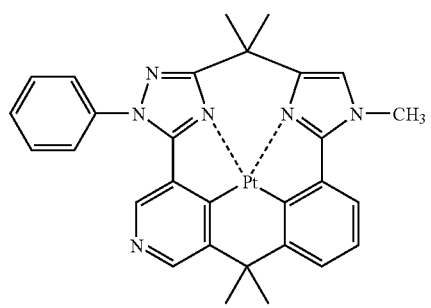
(A124)
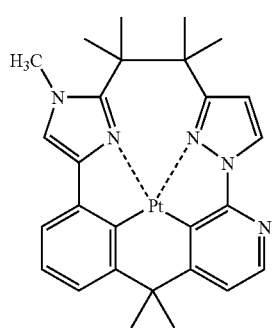
(A125)
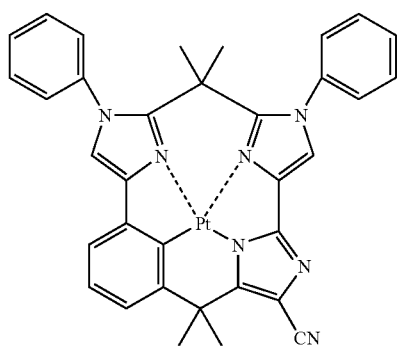
(A126)
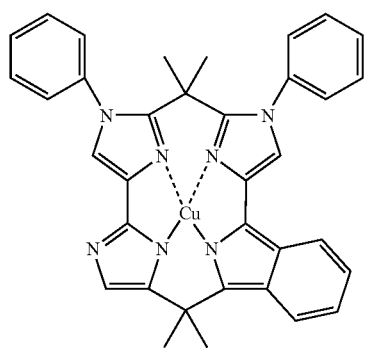
-continued
(A127)
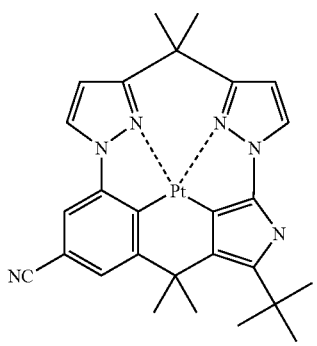
(A128)
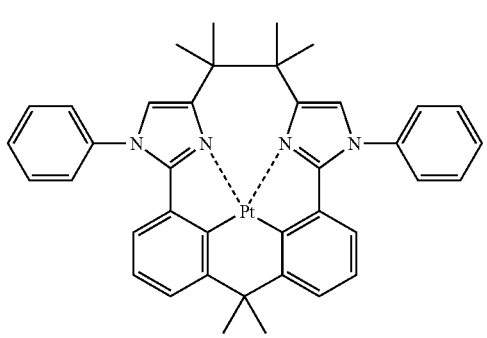
(A129)
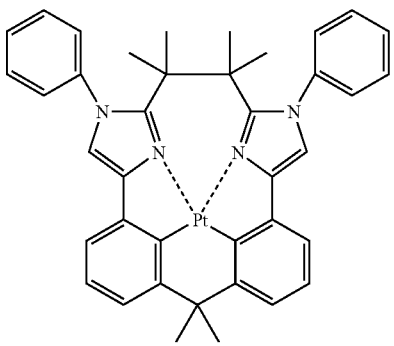
(A130)
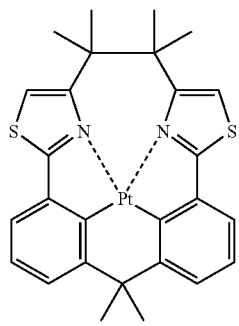

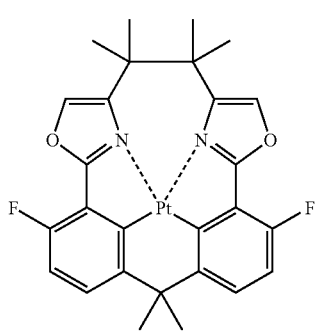

(A131)

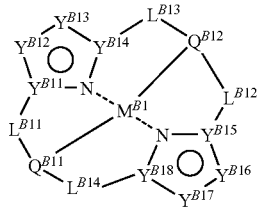

Formula (B-1)

In the formula (B-1), $M^{B1}$ represents a metal ion. $Y^{B11}$, $Y^{B14}$, $Y^{B15}$ and $Y^{B18}$ independently represent a carbon atom or a nitrogen atom. $Y^{B12}$, $Y^{B13}$, $Y^{B16}$ and $Y^{B17}$ independently represent a substituted or unsubstituted carbon atom, a substituted or unsubstituted nitrogen atom, an oxygen atom or a sulfur atom. $L^{B11}$, $L^{B12}$, $L^{B13}$ and $L^{B14}$ independently represent a linking group. $Q^{B11}$ and $Q^{B12}$ independently represent a partial structure containing an atom bonded to $M^{B1}$.

(A132)

The compound represented by the formula (B-1) is described in detail.

$M^{B1}$, $Y^{B11}$, $Y^{B14}$, $Y^{B15}$, $Y^{B18}$, $Y^{B12}$, $Y^{B13}$, $Y^{B16}$, $Y^{B17}$, $L^{B11}$, $L^{B12}$, $L^{B13}$, $L^{B14}$, $Q^{B11}$ and $Q^{B12}$ have the same meaning as defined above in their corresponding $M^{A1}$, $Y^{A11}$, $Y^{A14}$, $Y^{A15}$, $Y^{A18}$, $Y^{A12}$, $Y^{A13}$, $Y^{A16}$, $Y^{A17}$, $L^{A11}$, $L^{A12}$, $L^{A13}$, $L^{A14}$, $Q^{A11}$ and $Q^{A12}$ in the formula (A-1), and their preferable examples are also the same as defined above.

(A133)

The compound represented by formula (B-1) is more preferably a compound represented by the following formula (B-2), (B-3) or (B-4).

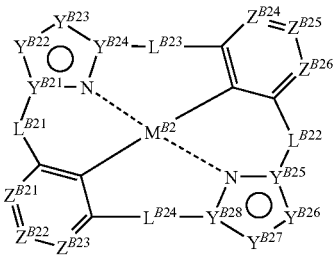

Formula (B-2)

(A134)

One of preferable compounds among the metal complexes in the invention is a compound represented by the following formula (B-1):

In the formula (B-2), $M^{B2}$ represents a metal ion. $Y^{B21}$, $Y^{B24}$, $Y^{B25}$ and $Y^{B28}$ independently represent a carbon atom or a nitrogen atom. $Y^{B22}$, $Y^{B23}$, $Y^{B26}$ and $Y^{B27}$ independently represent a substituted or unsubstituted carbon atom, a substituted or unsubstituted nitrogen atom, an oxygen atom or a sulfur atom. $L^{B21}$, $L^{B22}$, $L^{B23}$ and $L^{B24}$ independently represent a linking group. $Z^{B21}$, $Z^{B22}$, $Z^{B23}$, $Z^{B24}$, $Z^{B25}$ and $Z^{B26}$ independently represent a nitrogen atom or a substituted or unsubstituted carbon atom.

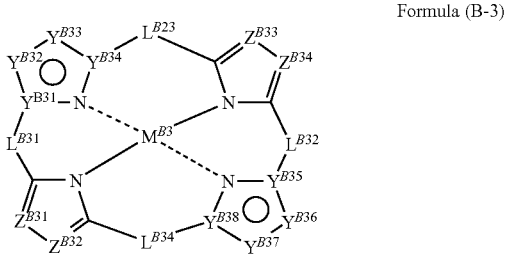

Formula (B-3)

In the formula (B-3), $M^{B3}$ represents a metal ion. $Y^{B31}$, $Y^{B34}$, $Y^{B35}$ and $Y^{B38}$ independently represent a carbon atom or a nitrogen atom. $Y^{B32}$, $Y^{B33}$, $Y^{B36}$ and $Y^{B37}$ independently represent a substituted or unsubstituted carbon atom, a substituted or unsubstituted nitrogen atom, an oxygen atom or a sulfur atom. $L^{B31}$, $L^{B32}$, $L^{B33}$ and $L^{B34}$ independently represent a linking group. $Z^{B31}$, $Z^{B32}$, $Z^{B33}$ and $Z^{B34}$ independently represent a nitrogen atom or a substituted or unsubstituted carbon atom.

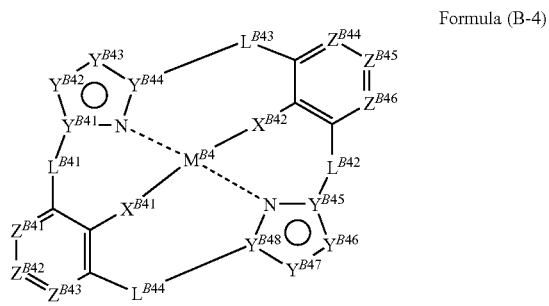

Formula (B-4)

In the formula (B-4), $M^{B4}$ represents a metal ion. $Y^{B41}$, $Y^{B44}$, $Y^{B45}$ and $Y^{B48}$ independently represent a carbon atom or a nitrogen atom. $Y^{B42}$, $Y^{B43}$, $Y^{B46}$ and $Y^{B47}$ independently represent a substituted or unsubstituted carbon atom, a substituted or unsubstituted nitrogen atom, an oxygen atom or a sulfur atom. $L^{B41}$, $L^{B42}$, $L^{B43}$ and $L^{B44}$ independently represent a linking group. $Z^{B41}$, $Z^{B42}$, $Z^{B43}$, $Z^{B44}$, $Z^{B45}$ and $Z^{B46}$ independently represent a nitrogen atom or a substituted or unsubstituted carbon atom. $X^{B41}$ and $X^{B42}$ independently represent an oxygen atom, a sulfur atom or a substituted or unsubstituted nitrogen atom.

The compound represented by the formula (B-2) is described in detail.

$M^{B2}$, $Y^{B21}$, $Y^{B24}$, $Y^{B25}$, $Y^{B28}$, $Y^{B22}$, $Y^{B23}$, $Y^{B26}$, $Y^{B27}$, $L^{B21}$, $L^{B22}$, $L^{B23}$ and $L^{B24}$ have the same meaning as defined above in their corresponding $M^{B1}$, $Y^{B11}$, $Y^{B14}$, $Y^{B15}$, $Y^{B18}$, $Y^{B12}$, $Y^{B13}$, $Y^{B16}$, $Y^{B17}$, $L^{B11}$, $L^{B12}$, $L^{B13}$ and $L^{B14}$ in the formula (B-1), and their preferable examples are also the same as defined above.

$Z^{B21}$, $Z^{B22}$, $Z^{B23}$, $Z^{B24}$, $Z^{B25}$ and $Z^{B26}$ independently represent a nitrogen atom or a substituted or unsubstituted carbon atom. Each of $Z^{B21}$, $Z^{B22}$, $Z^{B23}$, $Z^{B24}$, $Z^{B25}$ and $Z^{B26}$ is preferably a substituted or unsubstituted carbon atom, and more preferably an unsubstituted carbon atom. A substituent group with which the carbon atom is substituted may be selected from the above-mentioned substituent groups listed as examples of the substituent group on the divalent linking group represented by $L^{A11}$, $L^{A12}$, $L^{A13}$ or $L^{A14}$ in the formula (A-1).

The compound represented by the formula (B-3) is described in detail.

$M^{B3}$, $Y^{B31}$, $Y^{B34}$, $Y^{B35}$, $Y^{B38}$, $Y^{B32}$, $Y^{B33}$, $Y^{B36}$, $Y^{B37}$, $L^{B31}$, $L^{B32}$, $L^{B33}$ and $L^{B34}$ have the same meaning as defined above in their corresponding $M^{B1}$, $Y^{B11}$, $Y^{B14}$, $Y^{B15}$, $Y^{B18}$, $Y^{B12}$, $Y^{B13}$, $Y^{B16}$, $Y^{B17}$, $L^{B11}$, $L^{B12}$, $L^{B13}$ and $L^{B14}$ in the formula (B-1), and their preferable examples are also the same as defined above.

$Z^{B31}$, $Z^{B32}$, $Z^{B33}$ and $Z^{B34}$ independently represent a nitrogen atom or a substituted or unsubstituted carbon atom. Each of $Z^{B31}$, $Z^{B32}$, $Z^{B33}$ and $Z^{B34}$ is preferably a substituted or unsubstituted carbon atom, and more preferably an unsubstituted carbon atom. A substituent group with which the carbon atom is substituted may be selected from the above-mentioned substituent groups listed as examples of the substituent group on the divalent linking group represented by $L^{A11}$, $L^{A12}$, $L^{A13}$ or $L^{A14}$ in the formula (A-1).

The compound represented by the formula (B-4) is described in detail.

$M^{B4}$, $Y^{B41}$, $Y^{B44}$, $Y^{B45}$, $Y^{B48}$, $Y^{B42}$, $Y^{B43}$, $Y^{B46}$, $Y^{B47}$, $L^{B41}$, $L^{B42}$, $L^{B43}$ and $L^{B44}$ have the same meaning as defined above in their corresponding $M^{B1}$, $Y^{B11}$, $Y^{B14}$, $Y^{B15}$, $Y^{B18}$, $Y^{B12}$, $Y^{B13}$, $Y^{B16}$, $Y^{B17}$, $L^{B11}$, $L^{B12}$, $L^{B13}$ and $L^{B14}$ in the formula (B-1), and their preferable examples are also the same as defined above.

$Z^{B41}$, $Z^{B42}$, $Z^{B43}$, $Z^{B44}$, $Z^{B45}$ and $Z^{B46}$ independently represent a nitrogen atom or a substituted or unsubstituted carbon atom. Each of $Z^{B41}$, $Z^{B42}$, $Z^{B43}$, $Z^{B44}$, $Z^{B45}$ and $Z^{B46}$ is preferably a substituted or unsubstituted carbon atom, and more preferably an unsubstituted carbon atom. A substituent group with which the carbon atom is substituted may be selected from the above-mentioned substituent groups listed as examples of the substituent group on the divalent linking group represented by $L^{A11}$, $L^{A12}$, $L^{A13}$ or $L^{A14}$ in the formula (A-1).

$X^{B41}$ and $X^{B42}$ independently represent an oxygen atom, a sulfur atom or a substituted or unsubstituted nitrogen atom. Each of $X^{B41}$ and $X^{B42}$ is preferably an oxygen atom or a sulfur atom, and more preferably an oxygen atom.

Specific examples of the compounds represented by the formula (B-1) are illustrated below, but the invention is not limited thereto.

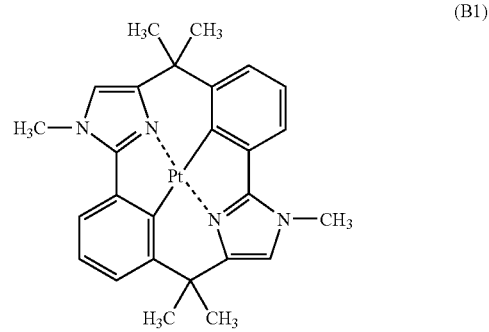

(B1)

-continued
(B2)
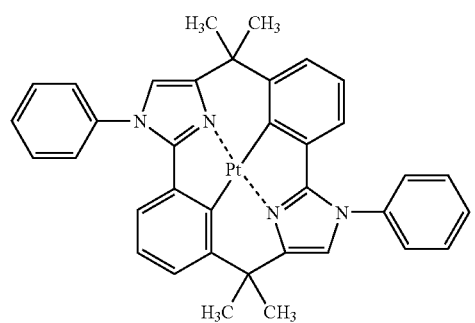
(B3)
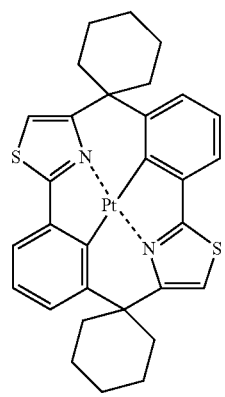
(B4)
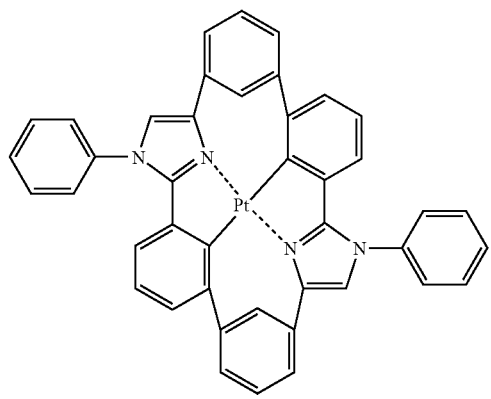
(B5)
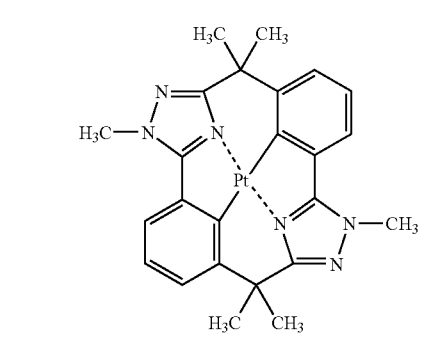
-continued
(B6)
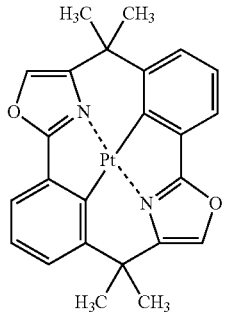
(B7)
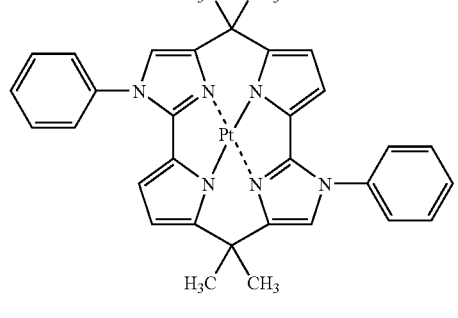
(B8)
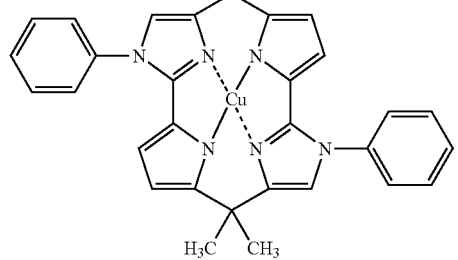
(B9)
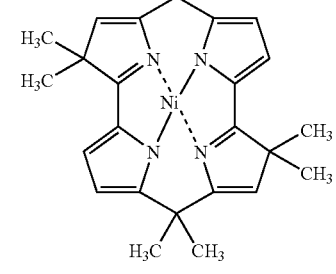
(B10)
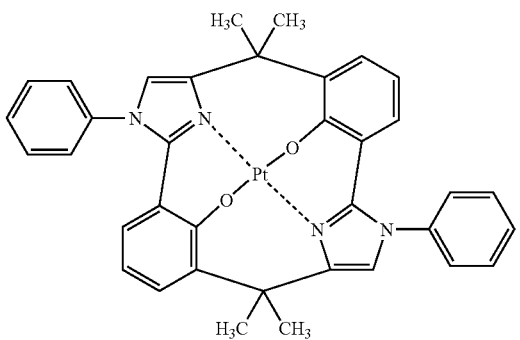

-continued
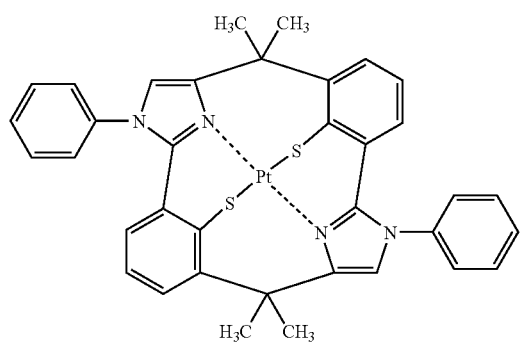
(B11)
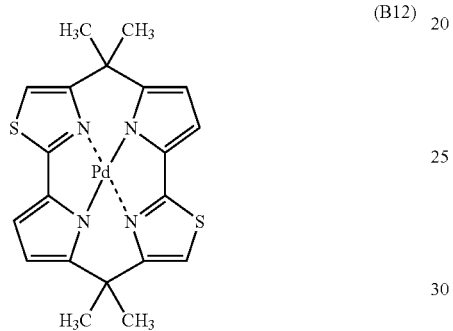
(B12)
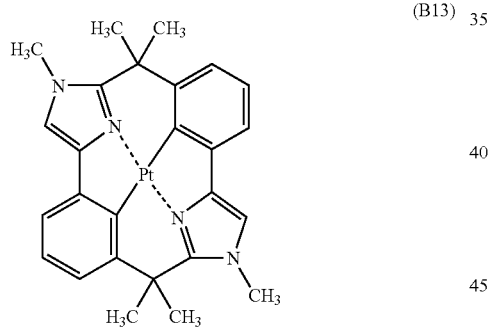
(B13)
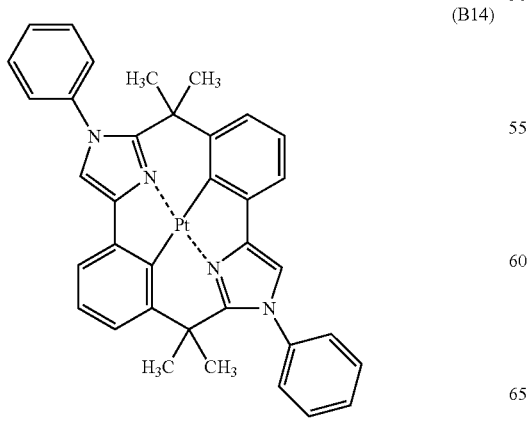
(B14)
-continued
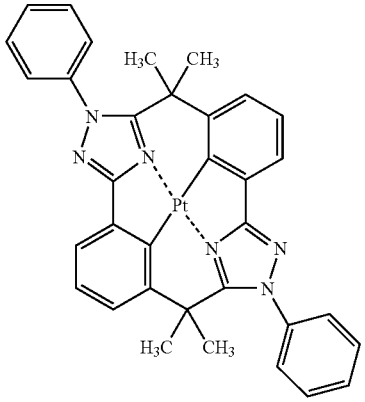
(B15)
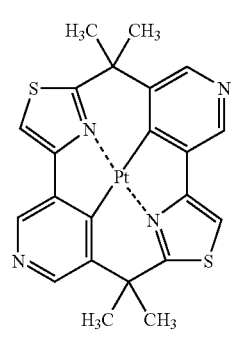
(B16)
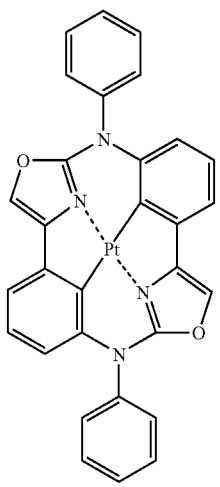
(B17)
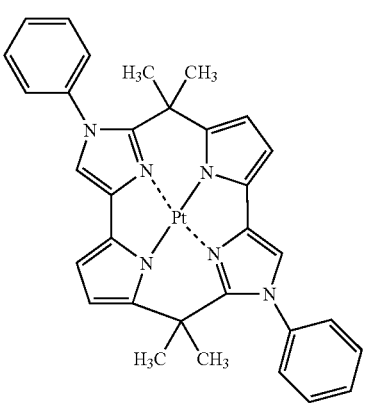
(B18)

-continued
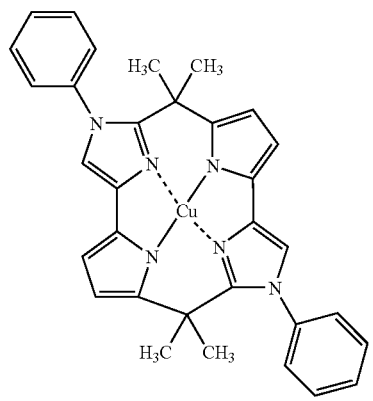
(B19)
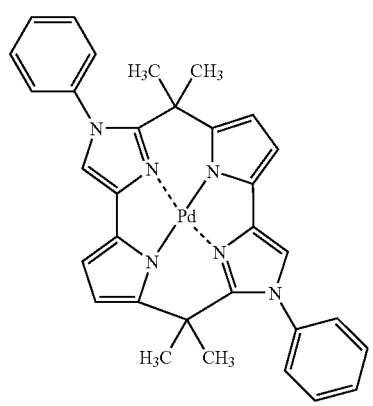
(B20)
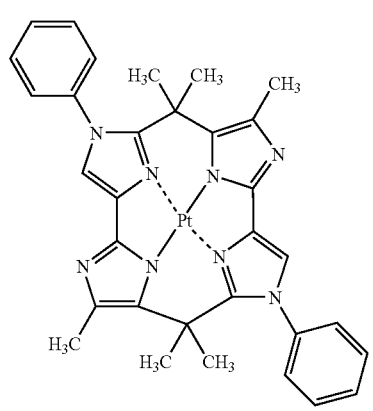
(B21)
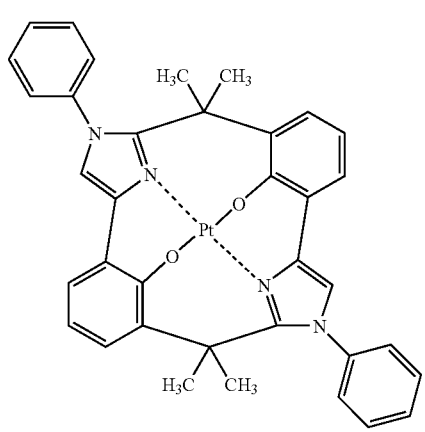
(B22)
-continued
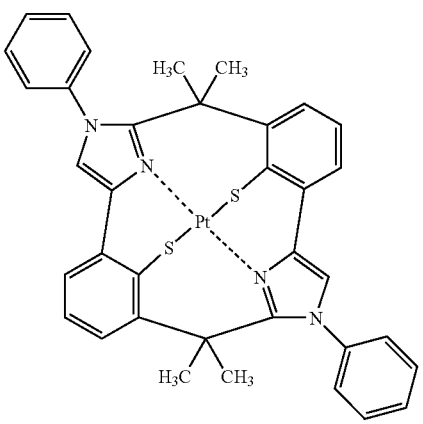
(B23)
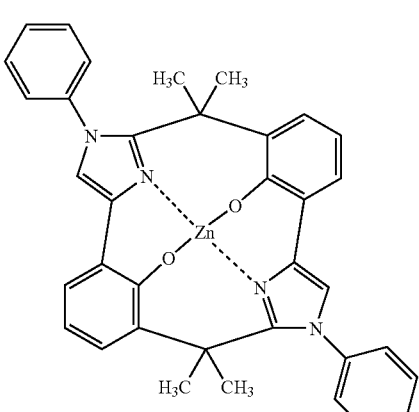
(B24)
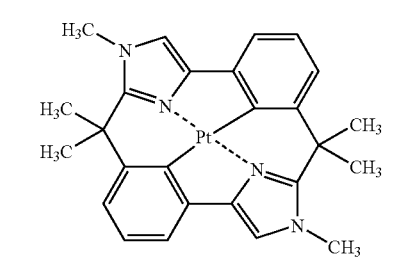
(B25)
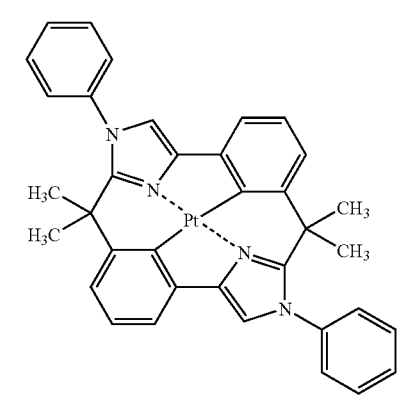
(B26)

-continued
(B27)
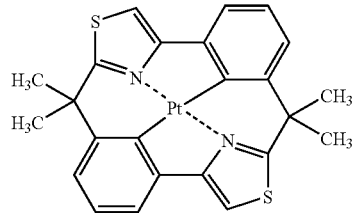
(B28)
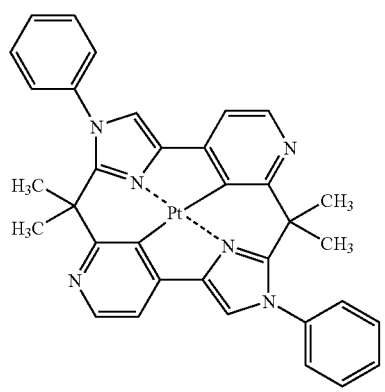
(B29)
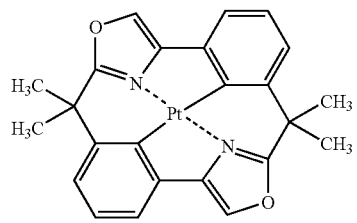
(B30)
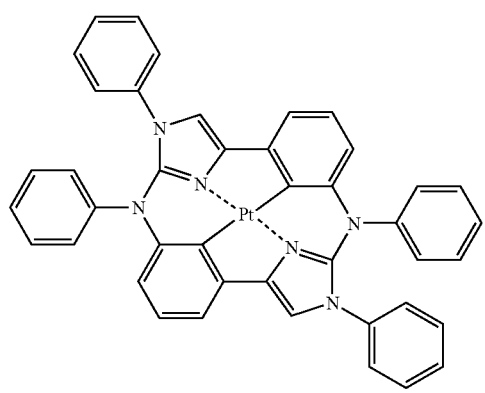
-continued
(B31)
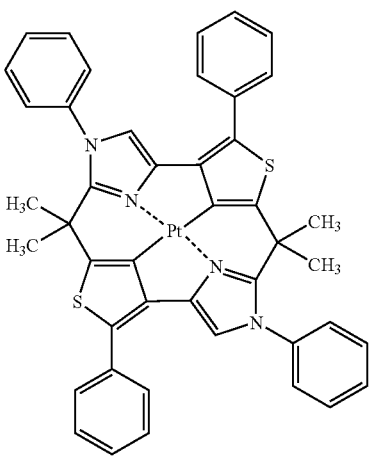
(B32)
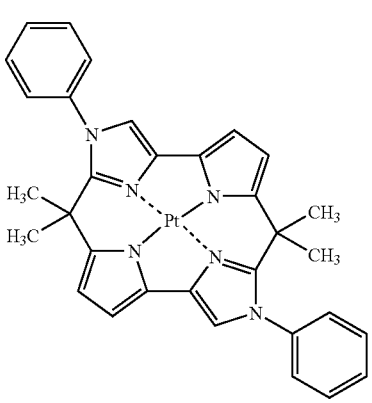
(B33)
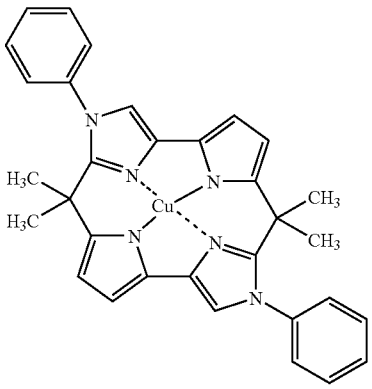
(B34)
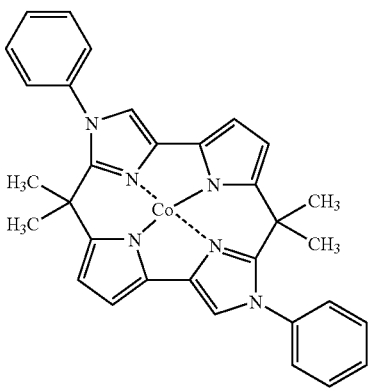

-continued
(B35)
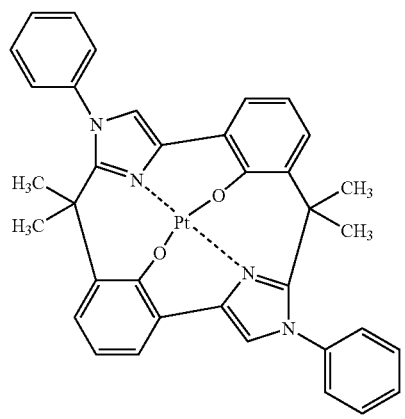
(B36)
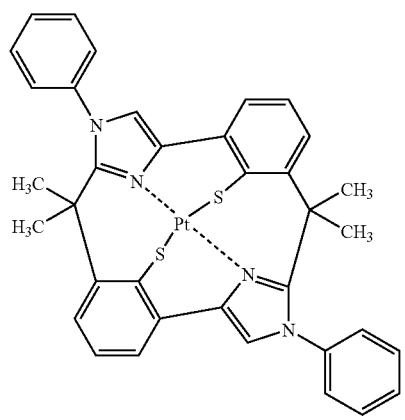
(B37)
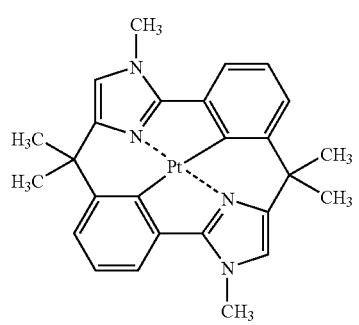
(B38)
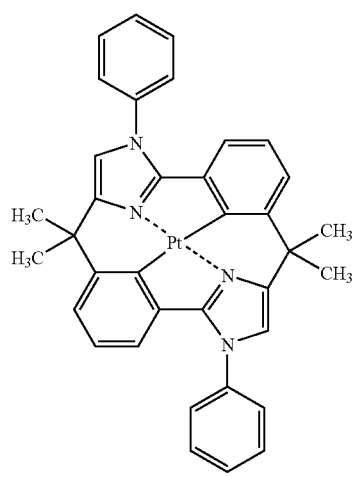
-continued
(B39)
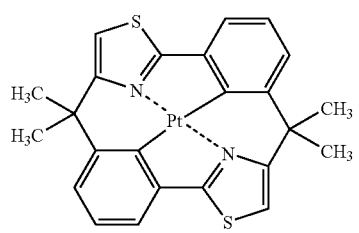
(B40)
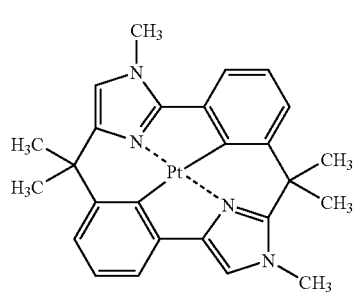
(B41)
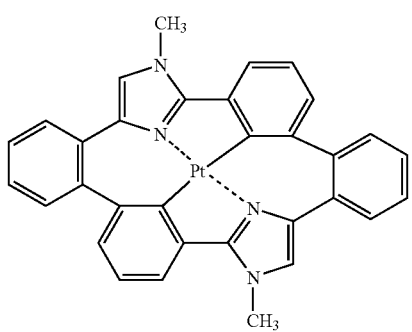
(B42)
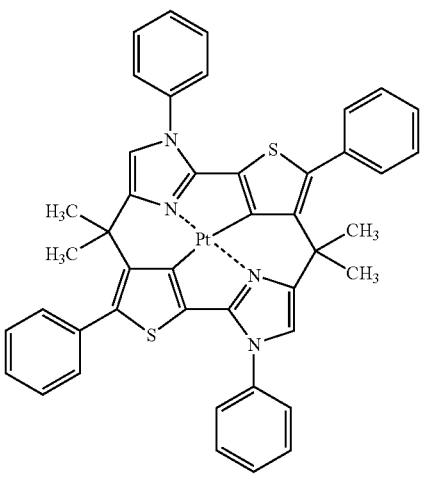

-continued
(B43)
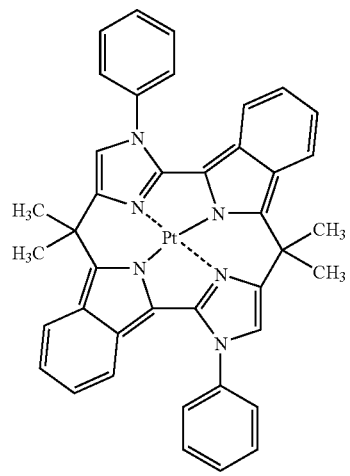
(B44)
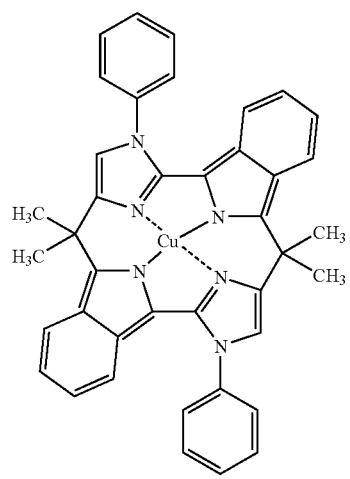
(B45)
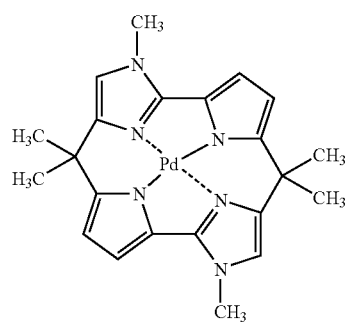
-continued
(B46)
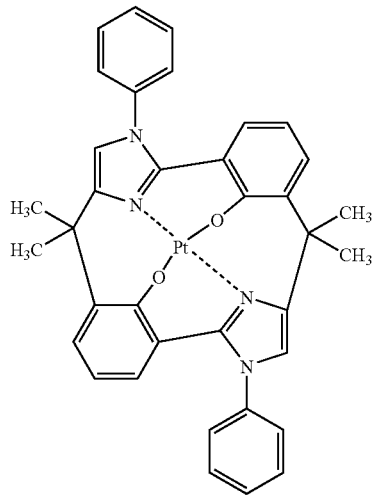
(B47)
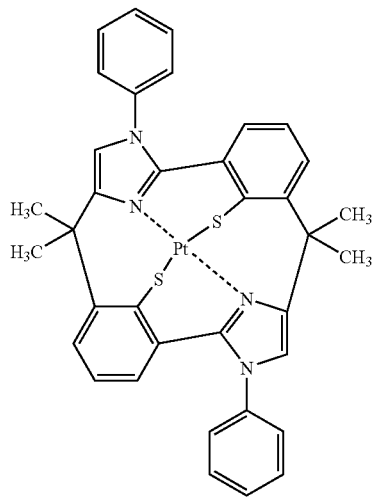
(B48)
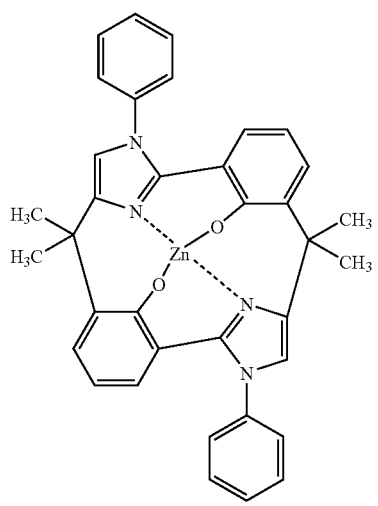

-continued
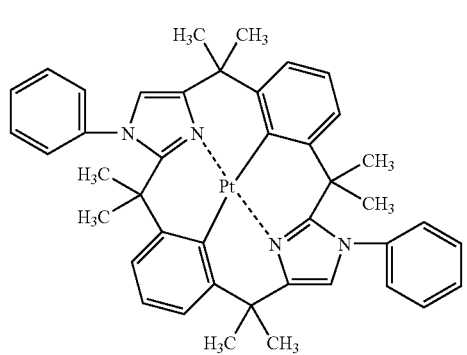
(B49)
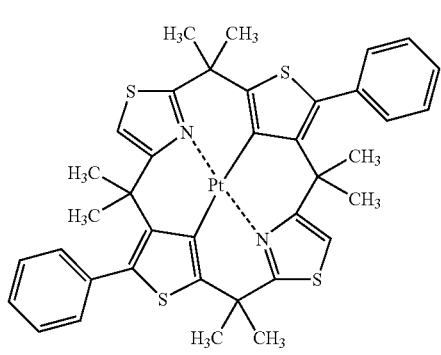
(B53)
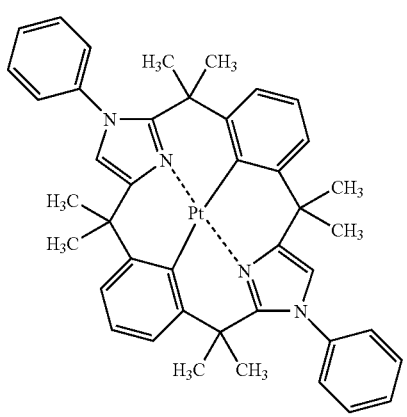
(B50)
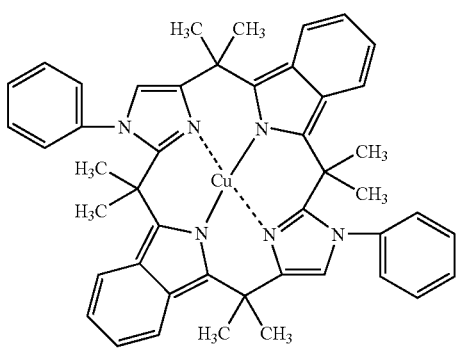
(B54)
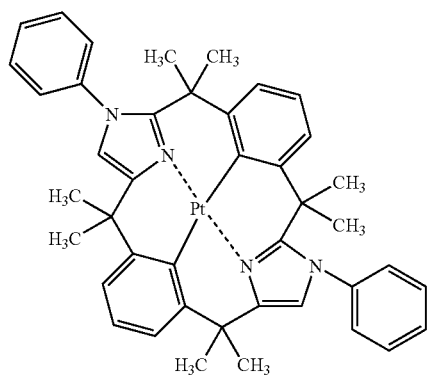
(B51)
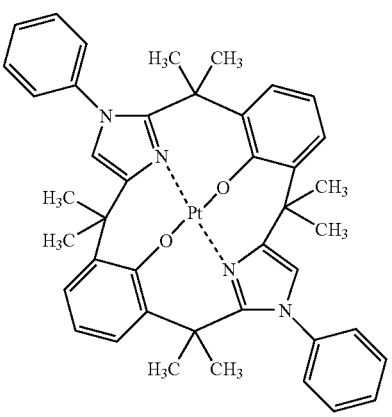
(B55)
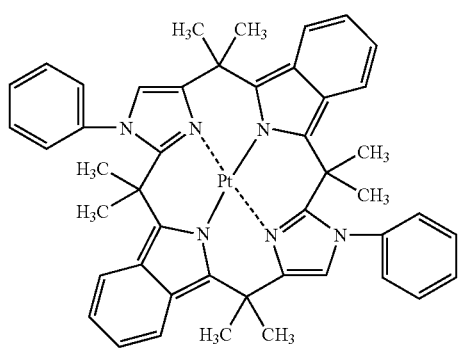
(B52)
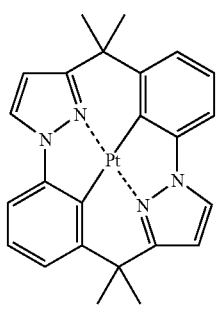
(B56)

-continued
(B57)
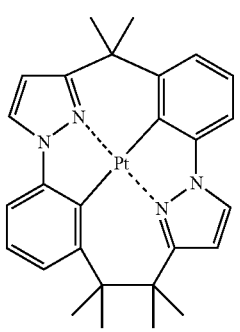
(B58)
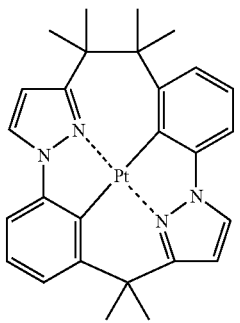
(B59)
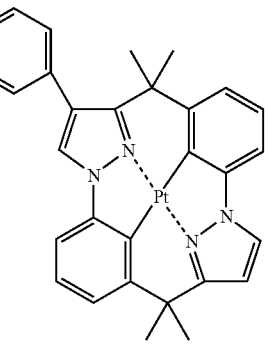
(B60)
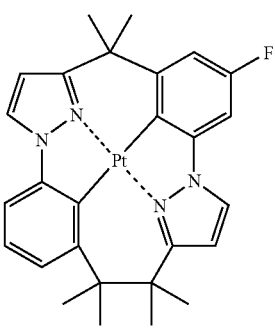
(B61)
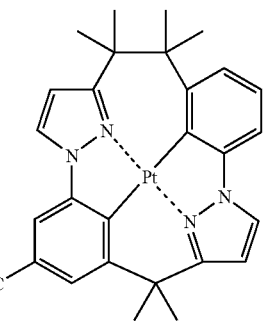
-continued
(B62)
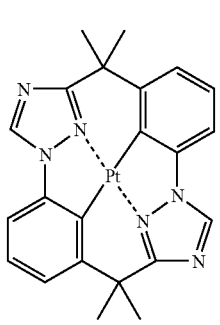
(B63)
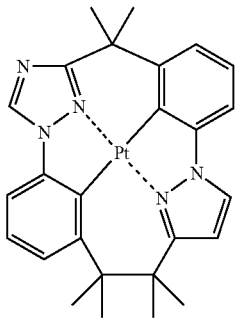
(B64)
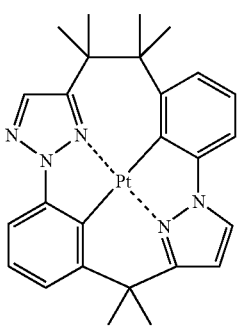
(B65)
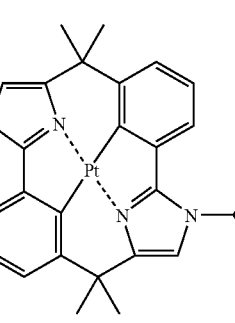
(B66)
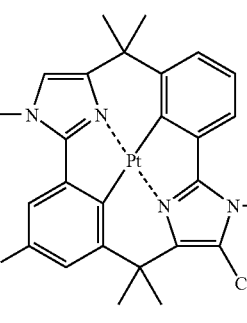

-continued (B67) 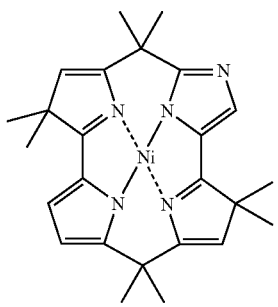

(B68) 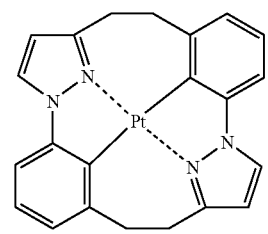

(B69) 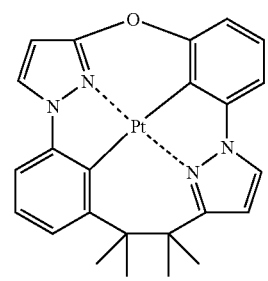

(B70) 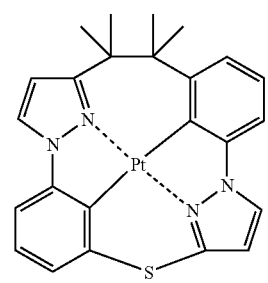

(B71) 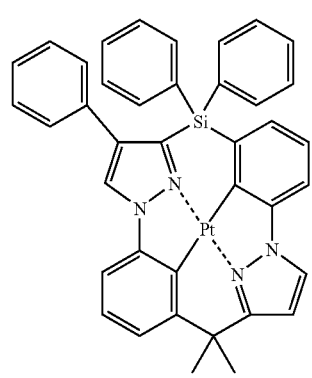

-continued (B72) 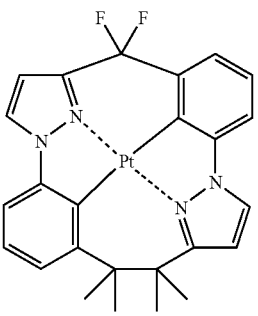

(B73) 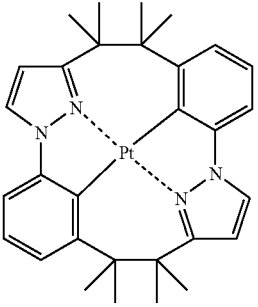

(B74) 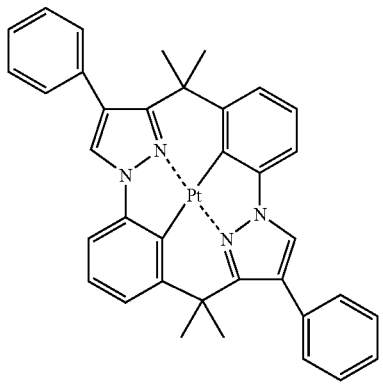

One of preferable compounds among the metal complexes in the invention is a compound represented by the following formula (C-1):

Formula (C-1)

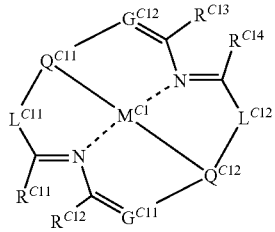

In the formula (C-1), $M^{C1}$ represents a metal ion. $R^{C11}$ and $R^{C12}$ independently represent a hydrogen atom or are substituent groups bonded to each other to form a 5-membered ring or substituent groups not bonded to each other. $R^{C13}$ and $R^{C14}$ independently represent a hydrogen atom or are substituent groups bonded to each other to form a 5-membered ring or substituent groups not bonded to each other. $G^{C11}$ and $G^{C12}$ independently represent a nitrogen atom or a substituted or unsubstituted carbon atom. $L^{C11}$ and $L^{C12}$ independently represent a linking group. $Q^{C11}$ and $Q^{C12}$ independently represent a partial structure containing an atom bonded to $M^{C1}$.

The formula (C-1) is described in detail.

$M^{C1}$, $L^{C11}$, $L^{C12}$, $Q^{C11}$ and $Q^{C12}$ have the same meaning as defined above in their corresponding $M^{A1}$, $L^{A11}$, $L^{A12}$, $Q^{A11}$ and $Q^{A12}$ in the formula (A-1), and their preferable examples are also the same as defined above.

$G^{C11}$ and $G^{C12}$ independently represent a nitrogen atom or a substituted or unsubstituted carbon atom, preferably a nitrogen atom or an unsubstituted carbon atom, and more preferably a nitrogen atom.

$R^{C11}$ and $R^{C12}$ independently represent a hydrogen atom or a substituent group. $R^{C11}$ and $R^{C12}$ may be bonded to each other to form a 5-membered ring. $R^{C13}$ and $R^{C14}$ independently represent a hydrogen atom or a substituent group. $R^{C13}$ and $R^{C14}$ may be bonded to each other to form a 5-membered ring.

The substituent groups represented by $R^{C11}$, $R^{C12}$, $R^{C13}$ or $R^{C14}$ may be, for example, an alkyl group (preferably a C1 to C30, more preferably C1 to C20, particularly preferably C1 to C10 group, for example methyl, ethyl, iso-propyl, tert-butyl, n-octyl, n-decyl, n-hexadecyl, cyclopropyl, cyclopentyl, cyclohexyl, etc.), an alkenyl group (preferably a C2 to C30, more preferably C2 to C20, particularly preferably C2 to C10 group, for example vinyl, allyl, 2-butenyl, 3-pentenyl, etc.), an alkynyl group (preferably a C2 to C30, more preferably C2 to C20, particularly preferably C2 to C10 group, for example propargyl, 3-pentynyl, etc.), an aryl group (preferably a C6 to C30, more preferably C6 to C20, particularly preferably C6 to C12 group, for example phenyl, p-methylphenyl, naphthyl, anthranyl, etc.), an amino group (preferably a C0 to C30, more preferably C0 to C20, particularly preferably C0 to C10 group, for example amino, methylamino, dimethylamino, diethylamino, dibenzylamino, diphenylamino, ditolylamino, etc.), an alkoxy group (preferably a C1 to C30, more preferably C1 to C20, particularly preferably C1 to C10 group, for example methoxy, ethoxy, butoxy, 2-ethylhexyloxy, etc.), an aryloxy group (preferably a C6 to C30, more preferably C6 to C20, particularly preferably C6 to C12 group, for example phenyloxy, 1-naphthyloxy, 2-naphthyloxy, etc.), a heterocyclic oxy group (preferably a C1 to C30, more preferably C1 to C20, particularly preferably C1 to C12 group, for example pyridyloxy, pyrazyloxy, pyrimidyloxy, quinolyloxy, etc.), an acyl group (preferably a C1 to C30, more preferably C1 to C20, particularly preferably C1 to C12 group, for example acetyl, benzoyl, formyl, pivaloyl, etc.), an alkoxycarbonyl group (preferably a C2 to C30, more preferably C2 to C20, particularly preferably C2 to C12 group, for example methoxycarbonyl, ethoxycarbonyl, etc.), an aryloxycarbonyl group (preferably a C7 to C30, more preferably C7 to C20, particularly preferably C7 to C12 group, for example phenyloxycarbonyl, etc.), an acyloxy group (preferably a C2 to C30, more preferably C2 to C20, particularly preferably C2 to C10 group, for example acetoxy, benzoyloxy, etc.), an acylamino group (preferably a C2 to C30, more preferably C2 to C20, particularly preferably C2 to C10 group, for example acetylamino, benzoylamino, etc.), an alkoxycarbonylamino group (preferably a C2 to C30, more preferably C2 to C20, particularly preferably C2 to C12 group, for example methoxycarbonylamino, etc.), an aryloxycarbonylamino group (preferably a C7 to C30, more preferably C7 to C20, particularly preferably C7 to C12 group, for example phenyloxycarbonylamino, etc.), an alkylthio group (preferably a C1 to C30, more preferably C1 to C20, particularly preferably C1 to C12 group, for example methylthio, ethylthio, etc.), an arylthio group (preferably a C6 to C30, more preferably C6 to C20, particularly preferably C6 to C12 group, for example phenylthio, etc.), a heterocyclic thio group (preferably a C1 to C30, more preferably C1 to C20, particularly preferably C1 to C12 group, for example pyridylthio, 2-benzimizolylthio, 2-benzoxazolylthio, 2-benzthiazolylthio, etc.), a halogen atom (for example a fluorine atom, chlorine atom, bromine atom, iodine atom), a cyano group, a heterocyclic group (preferably a C1 to C30, more preferably C1 to C12 group containing a heteroatom such as a nitrogen atom, oxygen atom and sulfur atom, specifically imidazolyl, pyridyl, quinolyl, furyl, thienyl, piperidyl, morpholino, benzoxazolyl, benzimidazolyl, benzthiazolyl, carbazolyl group, azepinyl group, etc.), a silyl group (preferably a C3 to C40, more preferably C3 to C30, particularly preferably C3 to C24 group, for example trimethylsilyl, triphenylsilyl, etc.) or a silyloxy group (preferably a C3 to C40, more preferably C3 to C30, particularly preferably C3 to C24 group, for example trimethylsilyloxy, triphenylsilyloxy, etc.).

The substituent group represented by $R^{C11}$, $R^{C12}$, $R^{C13}$ or $R^{C14}$ is preferably an alkyl group, an aryl group, or a group forming a 5-membered ring which $R^{C11}$ and $R^{C12}$, or $R^{C13}$ and $R^{C14}$, are bonded to each other to form, particularly preferably a group forming a 5-membered ring which $R^{C11}$ and $R^{C12}$, or $R^{C13}$ and $R^{C14}$, are bonded to each other to form.

The compound represented by the formula (C-1) is more preferably a compound represented by formula (C-2):

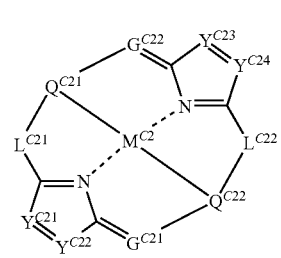

Formula (C-2)

In the formula (C-2), $M^{C2}$ represents a metal ion.

$Y^{C21}$, $Y^{C22}$, $Y^{C23}$ and $Y^{C24}$ independently represent a nitrogen atom or a substituted or unsubstituted carbon atom. $G^{C21}$ and $G^{C22}$ independently represent a nitrogen atom or a substituted or unsubstituted carbon atom. $L^{C21}$ and $L^{C22}$ independently represent a linking group. $Q^{C21}$ and $Q^{C22}$ independently represent a partial structure containing an atom bonded to $M^{C2}$.

The formula (C-2) is described in detail.

$M^{C2}$, $L^{C21}$, $L^{C22}$, $Q^{C21}$, $Q^{C22}$, $G^{C21}$ and $G^{C22}$ have the same meaning as defined above in their corresponding $M^{C1}$, $L^{C11}$, $L^{C12}$, $Q^{C11}$, $Q^{C12}$, $G^{C11}$ and $G^{C12}$ in the formula (C-1), and their preferable examples are also the same as defined above.

$Y^{C21}$, $Y^{C22}$, $Y^{C23}$ and $Y^{C24}$ independently represent a nitrogen atom or a substituted or unsubstituted carbon atom, preferably a substituted or unsubstituted carbon atom, and more preferably an unsubstituted carbon atom.

The compound represented by formula (C-2) is more preferably a compound represented by the following formula (C-3), (C-4) or (C-5).

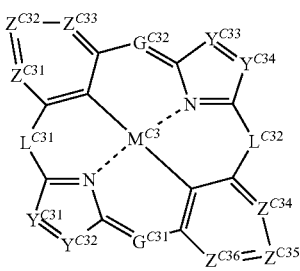

Formula (C-3)

In the formula (C-3), $M^{C3}$ represents a metal ion.

$Y^{C31}, Y^{C32}, Y^{C33}$ and $Y^{C34}$ independently represent a nitrogen atom or a substituted or unsubstituted carbon atom. $G^{C31}$ and $G^{C32}$ independently represent a nitrogen atom or a substituted or unsubstituted carbon atom. $L^{C31}$ and $L^{C32}$ independently represent a linking group. $Z^{C31}, Z^{C32}, Z^{C33}, Z^{C34}, Z^{C35}$ and $Z^{C36}$ independently represent a nitrogen atom or a substituted or unsubstituted carbon atom.

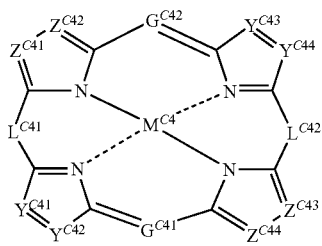

Formula (C-4)

In the formula (C-4), $M^{C4}$ represents a metal ion.

$Y^{C41}, Y^{C42}, Y^{C43}$ and $Y^{C44}$ independently represent a nitrogen atom or a substituted or unsubstituted carbon atom. $G^{C41}$ and $G^{C42}$ independently represent a nitrogen atom or a substituted or unsubstituted carbon atom. $L^{C41}$ and $L^{C42}$ independently represent a linking group. $Z^{C41}, Z^{C42}, Z^{C43}$ and $Z^{C44}$ independently represent a nitrogen atom or a substituted or unsubstituted carbon atom.

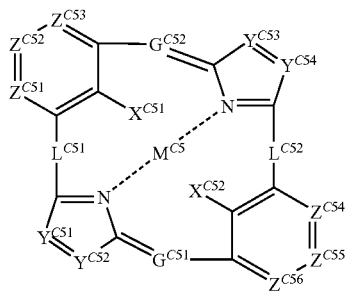

Formula (C-5)

In the formula (C-5), $M^{C5}$ represents a metal ion.

$Y^{C51}, Y^{C52}, Y^{C53}$ and $Y^{C54}$ independently represent a nitrogen atom or a substituted or unsubstituted carbon atom. $G^{C51}$ and $G^{C52}$ independently represent a nitrogen atom or a substituted or unsubstituted carbon atom. $L^{C51}$ and $L^{C52}$ independently represent a linking group. $Z^{C51}, Z^{C52}, Z^{C53}, Z^{C54}, Z^{C55}$ and $Z^{C56}$ independently represent a nitrogen atom or a substituted or unsubstituted carbon atom. $X^{C51}$ and $X^{C52}$ independently represent an oxygen atom, a sulfur atom or a substituted or unsubstituted nitrogen atom.

The compound represented by the formula (C-3) is described in detail.

$M^{C3}, L^{C31}, L^{C32}, G^{C31}$ and $G^{C32}$ have the same meaning as defined above in their corresponding $M^{C1}, L^{C11}, L^{C12}, G^{C11}$ and $G^{C12}$ in the formula (C-1), and their preferable examples are also the same as defined above.

$Z^{C31}, Z^{C32}, Z^{C33}, Z^{C34}, Z^{C35}$ and $Z^{C36}$ independently represent a nitrogen atom or a substituted or unsubstituted carbon atom. Each of $Z^{C31}, Z^{C32}, Z^{C33}, Z^{C34}, Z^{C35}$ and $Z^{C36}$ is preferably a substituted or unsubstituted carbon atom, and more preferably an unsubstituted carbon atom.

The compound represented by the formula (C-4) is described in more detail.

$M^{C4}, L^{C41}, L^{C42}, G^{C41}$ and $G^{C42}$ have the same meaning as defined above in their corresponding $M^{C1}, L^{C11}, L^{C12}, G^{C11}$ and $G^{C12}$ in the formula (C-1), and their preferable examples are also the same as defined above.

$Z^{C41}, Z^{C42}, Z^{C43}$, and $Z^{C44}$ independently represent a nitrogen atom or a substituted or unsubstituted carbon atom. Each of $Z^{C41}, Z^{C42}, Z^{C43}$ and $Z^{C44}$ is preferably a substituted or unsubstituted carbon atom, and more preferably an unsubstituted carbon atom.

The compound represented by the formula (C-5) is described in more detail.

$M^{C5}, L^{C51}, L^{C52}, G^{C51}$ and $G^{C52}$ have the same meaning as defined above in their corresponding $M^{C1}, L^{C11}, L^{C12}, G^{C11}$ and $G^{C12}$ in the formula (C-1), and their preferable examples are also the same as defined above.

$Z^{C51}, Z^{C52}, Z^{C53}, Z^{C54}, Z^{C55}$ and $Z^{C56}$ independently represent a nitrogen atom or a substituted or unsubstituted carbon atom. Each of $Z^{C51}, Z^{C52}, Z^{C53}, Z^{C54}, Z^{C55}$ and $Z^{C56}$ is preferably a substituted or unsubstituted carbon atom, and more preferably an unsubstituted carbon atom.

$X^{C51}$ and $X^{C52}$ independently represent an oxygen atom, a sulfur atom or a substituted or unsubstituted nitrogen atom. Each of $X^{C51}$ and $X^{C52}$ is preferably an oxygen atom or a sulfur atom, and more preferably an oxygen atom.

Specific examples of the compounds represented by the formula (C-1) are illustrated below, but the invention is not limited thereto.

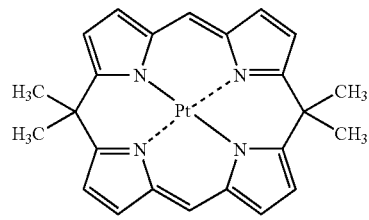

(C1)

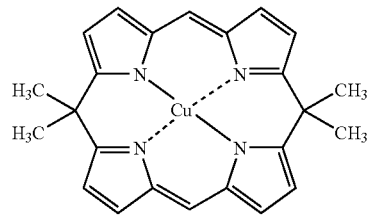

(C2)

-continued
(C3)
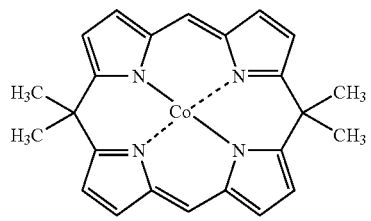
(C4)
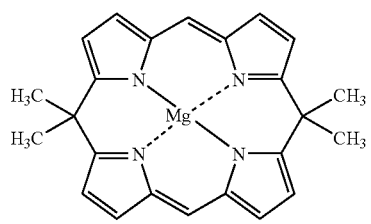
(C5)
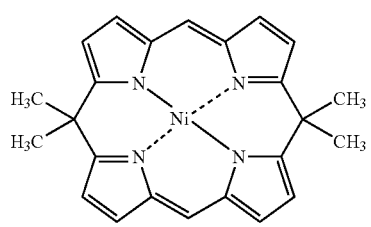
(C6)
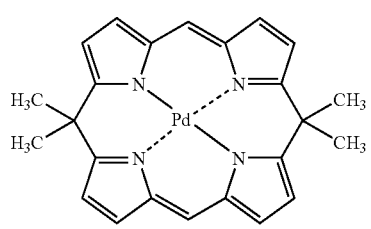
(C7)
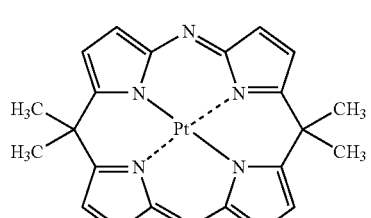
(C8)
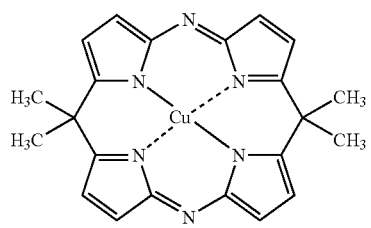
-continued
(C9)
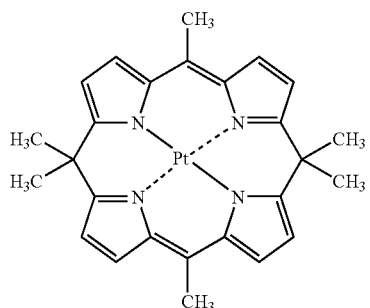
(C10)
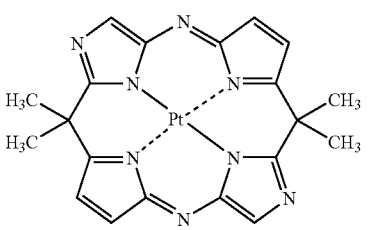
(C11)
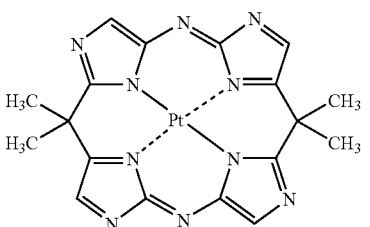
(C12)
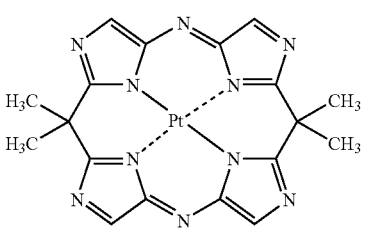
(C13)
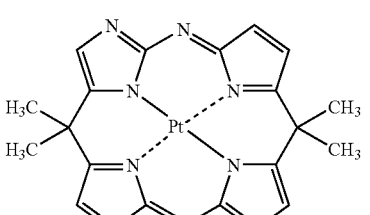
(C14)
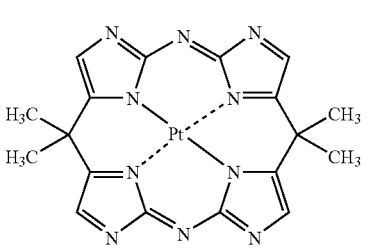

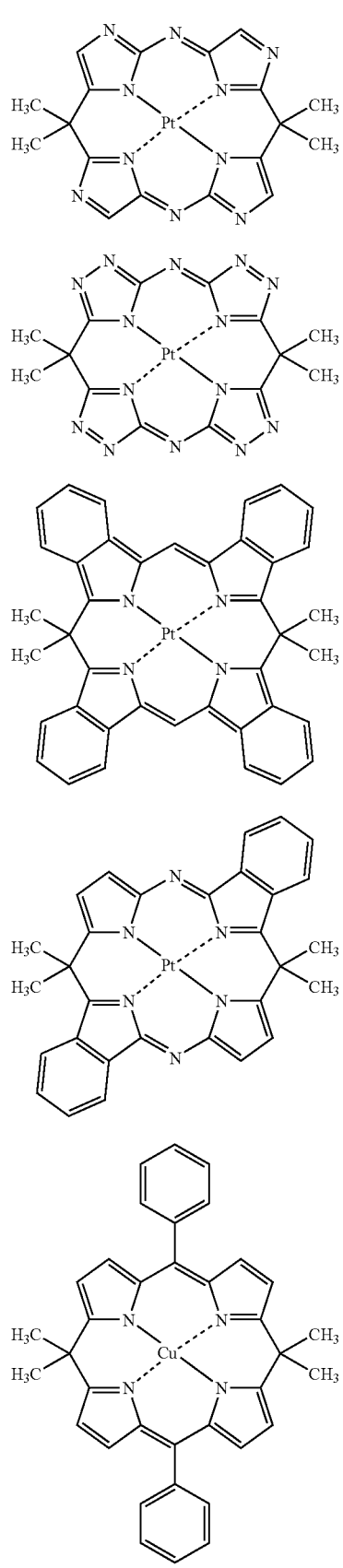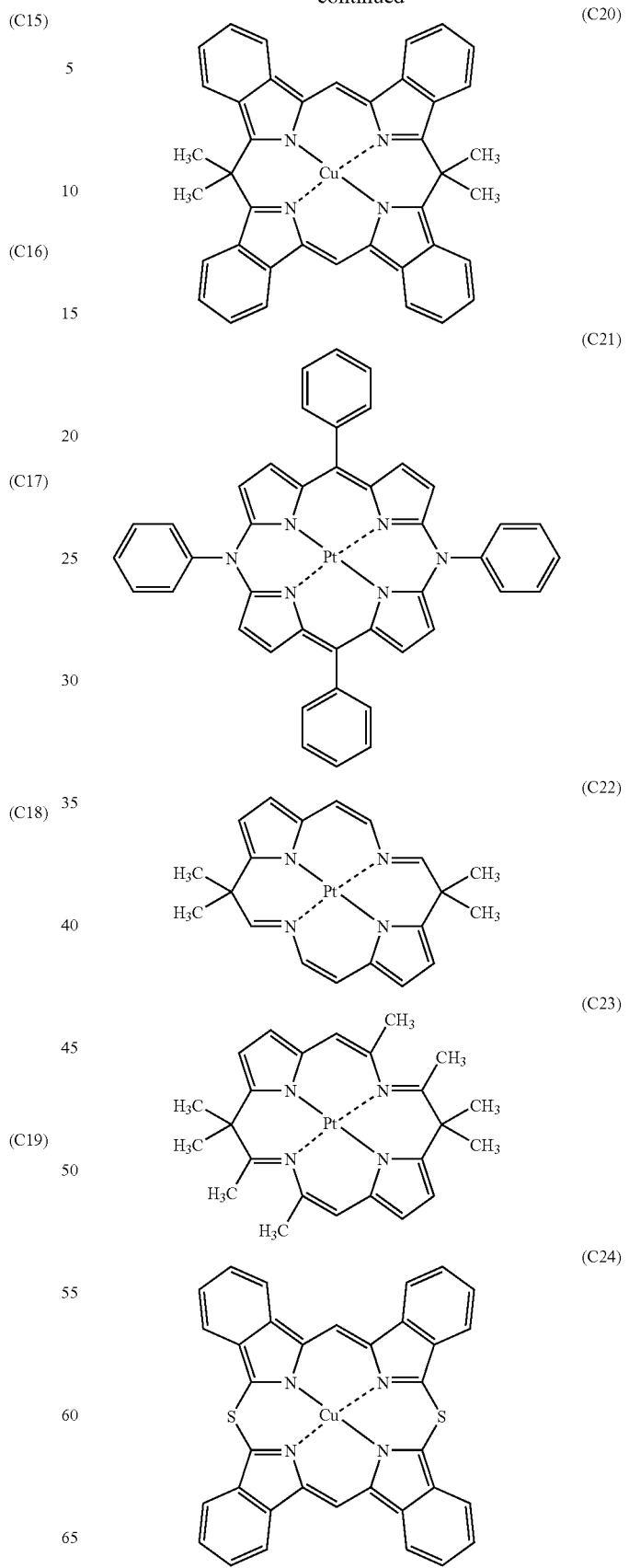

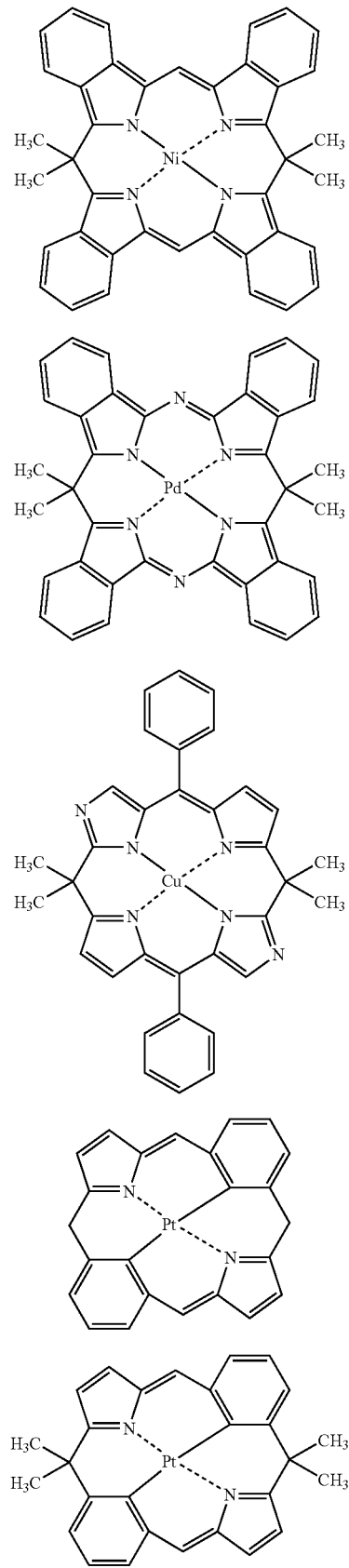

-continued
(C35)
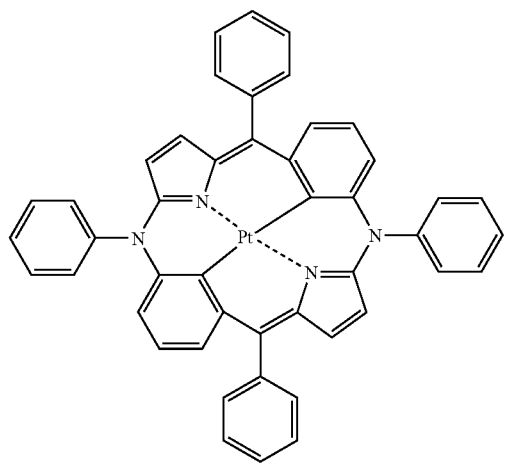
(C36)
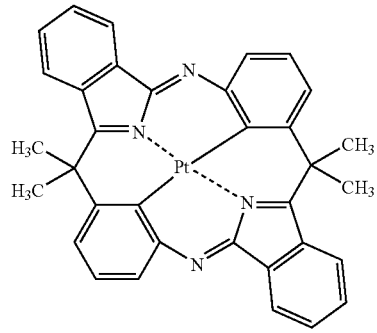
(C37)
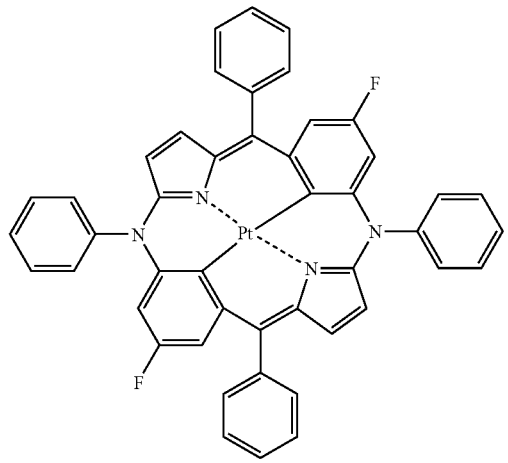
(C38)
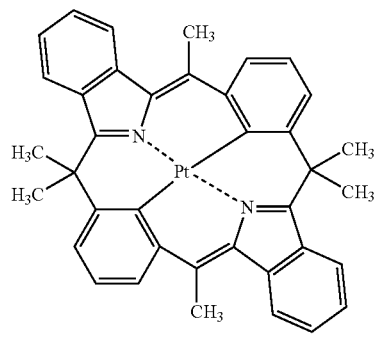
-continued
(C39)
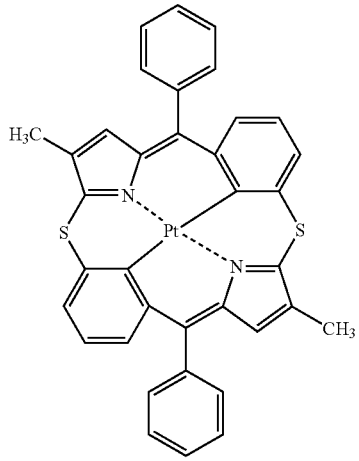
(C40)
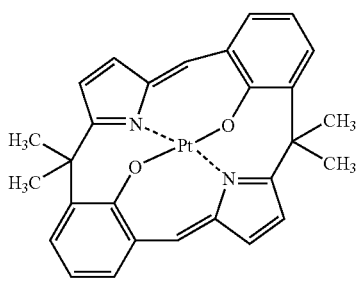
(C41)
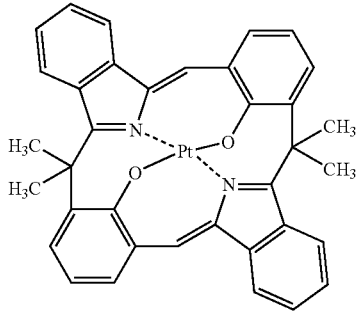
(C42)
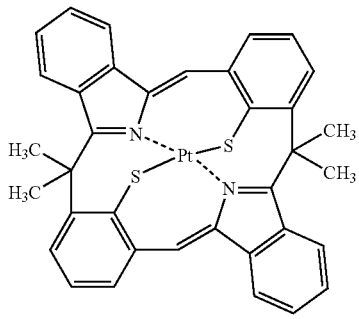
(C43)
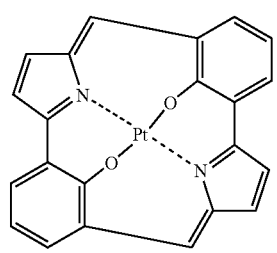

-continued
(C44)
(C45)
(C46)
(C47)
(C48)
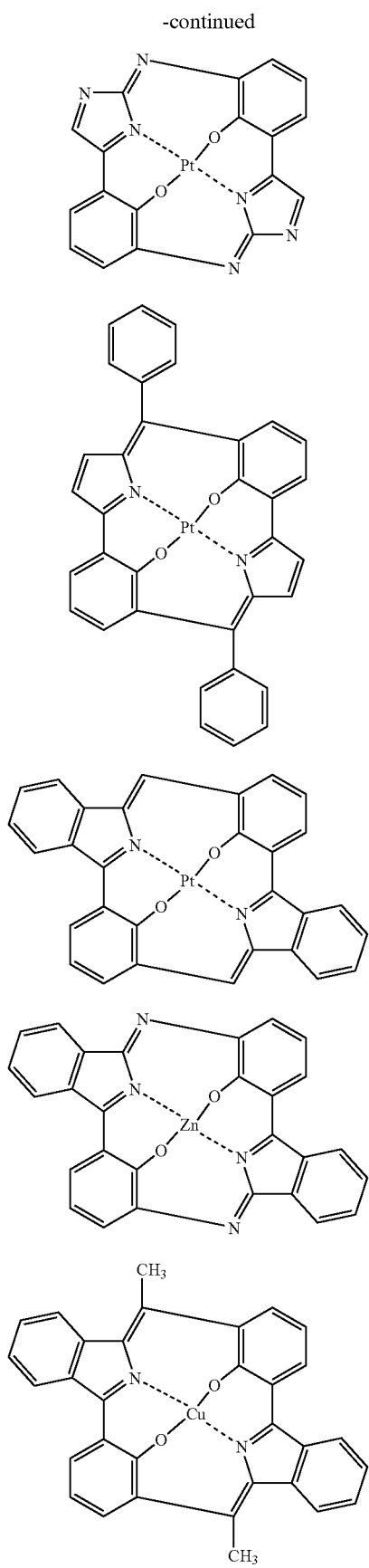
-continued
(C49)
(C50)
(C51)
(C52)
(C53)
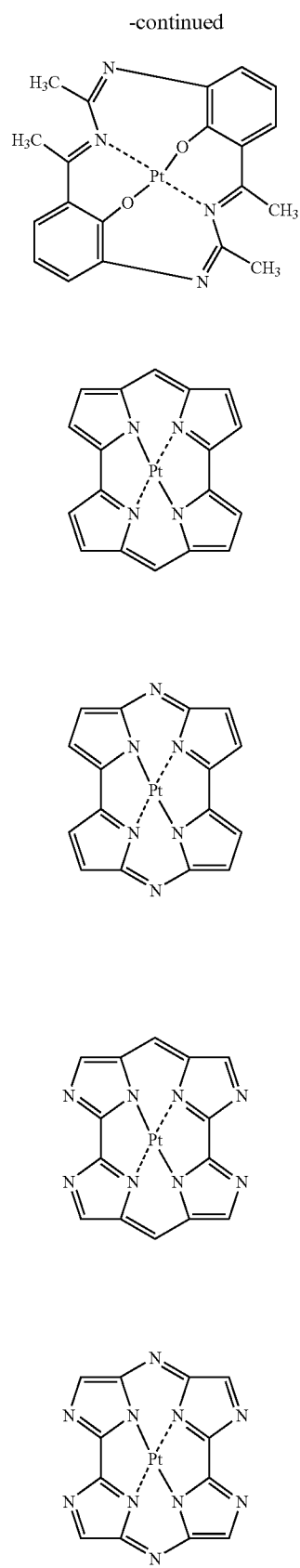

-continued
(C54)
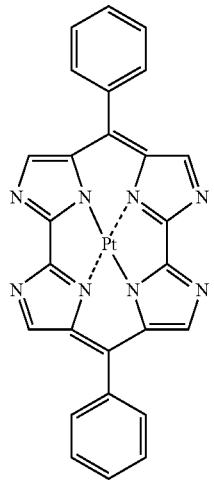
(C55)
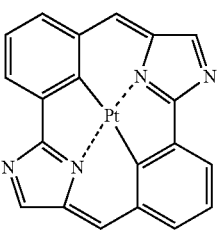
(C56)
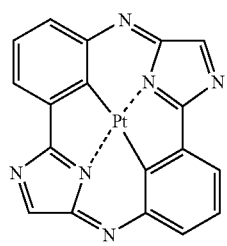
(C57)
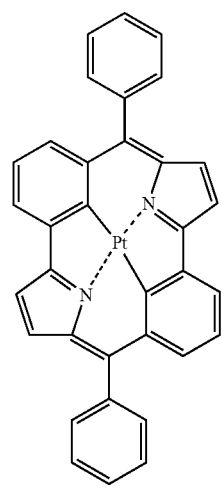
-continued
(C58)
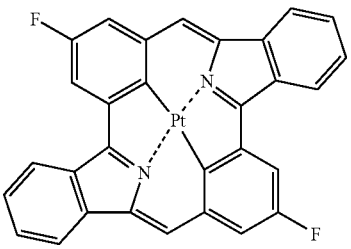
(C60)
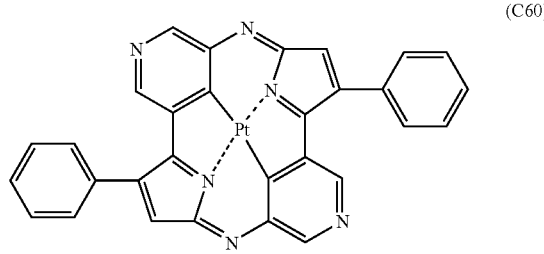
(C61)
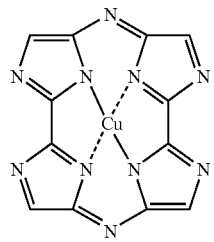
(C62)
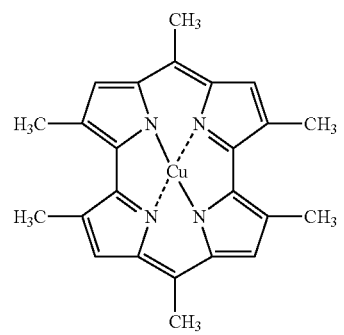
(C63)
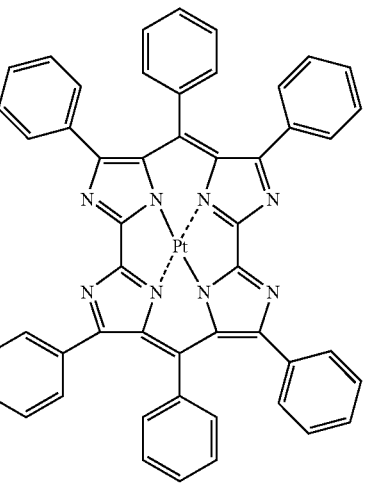

(C64)
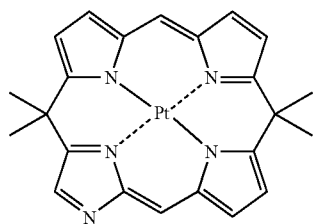
(C65)
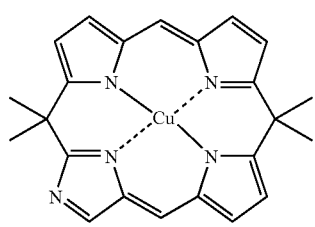
(C66)
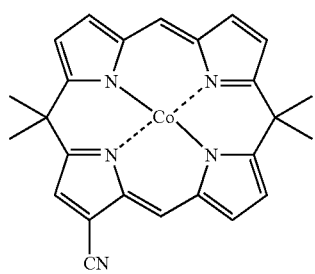
(C67)
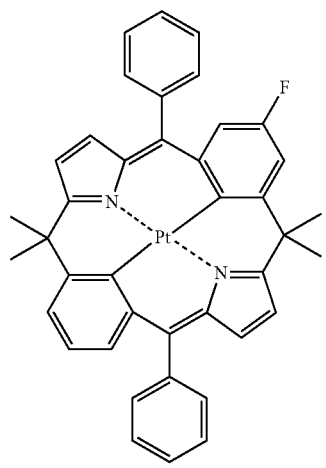
(C68)
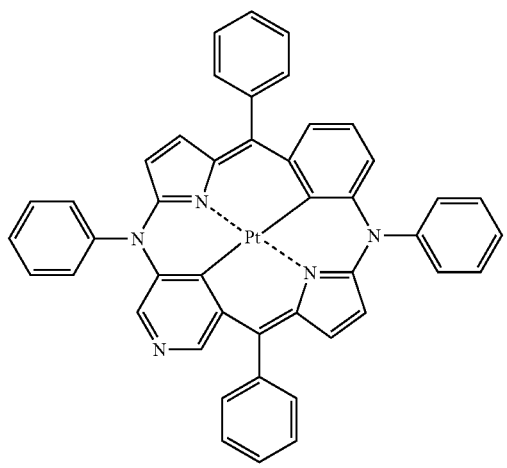
(C69)
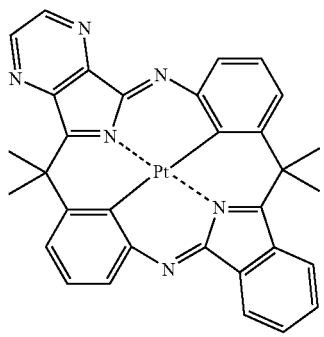
(C70)
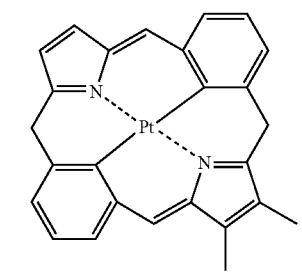
(C71)

-continued (C72)
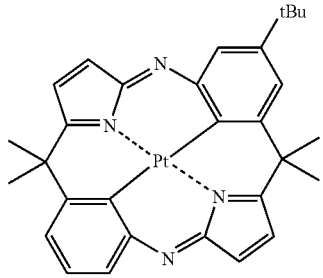

(C73)
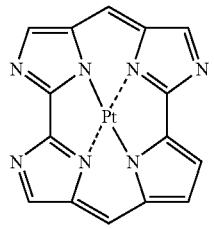

(C74)
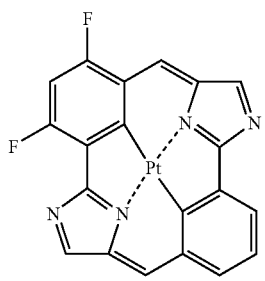

(C75)
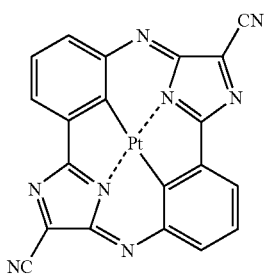

One of preferable compounds among the metal complexes in the invention is a compound represented by the following formula (D-1):

Formula (D-1)
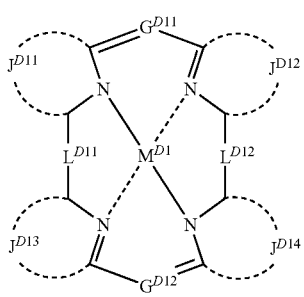

In the formula (D-1), $M^{D1}$ represents a metal ion.

$G^{D11}$ and $G^{D12}$ independently represent a nitrogen atom or a substituted or unsubstituted carbon atom. $J^{D11}$, $J^{D12}$, $J^{D13}$ and $J^{D14}$ independently represent an atomic group necessary for forming a 5-membered ring. $L^{D11}$ and $L^{D12}$ independently represent a linking group.

The formula (D-1) is described in detail.

$M^{D1}$, $L^{D11}$ and $L^{D12}$ have the same meaning as defined above in their corresponding $M^{A1}$, $L^{A11}$ and $L^{A12}$ in the formula (A-1), and their preferable examples are also the same as defined above.

$G^{D11}$ and $G^{D12}$ have the same meaning as defined above in their corresponding $G^{C11}$ and $G^{C12}$ in the formula (C-1), and their preferable examples are also the same as defined above.

$J^{D11}$, $J^{D12}$, $J^{D13}$ and $J^{D14}$ independently represent an atomic group, which together with an atomic group to which each of them is bonded, is necessary for forming a nitrogen-containing 5-membered heterocyclic ring.

The compound represented by the formula (D-1) is more preferably a compound represented by the following formula (D-2), (D-3) or (D-4).

Formula (D-2)
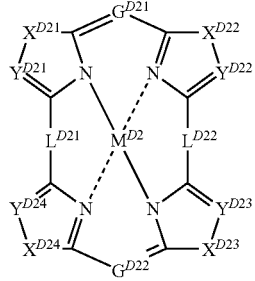

In the formula (D-2), $M^{D2}$ represents a metal ion.

$G^{D21}$ and $G^{D22}$ independently represent a nitrogen atom or a substituted or unsubstituted carbon atom.

$Y^{D21}$, $Y^{D22}$, $Y^{D23}$ and $Y^{D24}$ independently represent a nitrogen atom or a substituted or unsubstituted carbon atom.

$X^{D21}$, $X^{D22}$, $X^{D23}$ and $X^{D24}$ independently represent an oxygen atom, a sulfur atom, —$NR^{D21}$— or —$C(R^{D22})R^{D23}$—.

$R^{D21}$, $R^{D22}$ and $R^{D23}$ independently represent a hydrogen atom or a substituent group. $L^{D21}$ and $L^{D22}$ independently represent a linking group.

Formula (D-3)
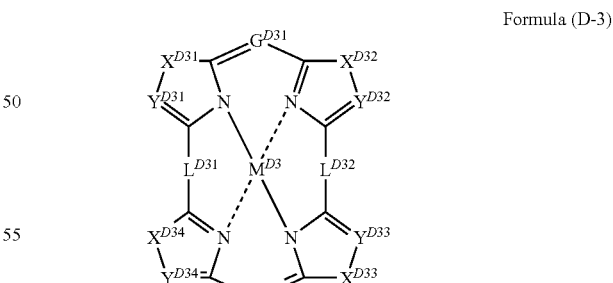

In the formula (D-3), $M^{D3}$ represents a metal ion.

$G^{D31}$ and $G^{D32}$ independently represent a nitrogen atom or a substituted or unsubstituted carbon atom.

$Y^{D31}$, $Y^{D32}$, $Y^{D33}$ and $Y^{D34}$ independently represent a nitrogen atom or a substituted or unsubstituted carbon atom.

$X^{D31}$, $X^{D32}$, $X^{D33}$ and $X^{D34}$ independently represent an oxygen atom, a sulfur atom, —$NR^{D31}$— or —$C(R^{D32})R^{D33}$—.

$R^{D31}$, $R^{D32}$ and $R^{D33}$ independently represent a hydrogen atom or a substituent group. $L^{D31}$ and $L^{D32}$ independently represent a linking group.

Formula (D-4)

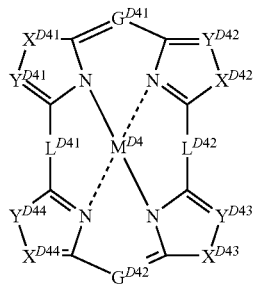

In the formula (D-4), $M^{D4}$ represents a metal ion.

$G^{D41}$ and $G^{D42}$ independently represent a nitrogen atom or a substituted or unsubstituted carbon atom.

$Y^{D41}$, $Y^{D42}$, $Y^{D43}$ and $Y^{D44}$ independently represent a nitrogen atom or a substituted or unsubstituted carbon atom.

$X^{D41}$, $X^{D42}$, $X^{D43}$ and $X^{D44}$ independently represent an oxygen atom, a sulfur atom, —$NR^{D41}$— or —$C(R^{D42})R^{D43}$—. $R^{D41}$, $R^{D42}$ and $R^{D43}$ independently represent a hydrogen atom or a substituent group. $L^{D41}$ and $L^{D42}$ independently represent a linking group.

The formula (D-2) is described in detail.

$M^{D2}$, $L^{D21}$, $L^{D22}$, $G^{D21}$ and $G^{D22}$ have the same meaning as defined above in their corresponding $M^{D1}$, $L^{D11}$, $L^{D12}$, $G^{D11}$ and $G^{D12}$ in the formula (D-1), and their preferable examples are also the same as defined above.

$Y^{D21}$, $Y^{D22}$, $Y^{D23}$ and $Y^{D24}$ independently represent a nitrogen atom or a substituted or unsubstituted carbon atom, preferably a substituted or unsubstituted carbon atom, and more preferably an unsubstituted carbon atom.

$X^{D21}$, $X^{D22}$, $X^{D23}$ and $X^{D24}$ independently represent an oxygen atom, a sulfur atom, —$NR^{D21}$— or —$C(R^{D22})R^{D23}$—, preferably a sulfur atom, —$NR^{D21}$— or —$C(R^{D22})R^{D23}$—, more preferably —$NR^{D21}$— or —$C(R^{D22})R^{D23}$—, and further more preferably —$NR^{D21}$—.

$R^{D21}$, $R^{D22}$ and $R^{D23}$ independently represent a hydrogen atom or a substituent group. The substituent group represented by $R^{D21}$, $R^{D22}$ or $R^{D23}$ may be, for example, an alkyl group (preferably a C1 to C20, more preferably C1 to C12, particularly preferably C1 to C8 group, for example methyl, ethyl, iso-propyl, tertbutyl, n-octyl, n-decyl, n-hexadecyl, cyclopropyl, cyclopentyl, cyclohexyl, etc.), an alkenyl group (preferably a C2 to C20, more preferably C2 to C12, particularly preferably C2 to C8 group, for example vinyl, allyl, 2-butenyl, 3-pentenyl, etc.), an alkynyl group (preferably a C2 to C20, more preferably C2 to C12, particularly preferably C2 to C8 group, for example propargyl, 3-pentynyl, etc.), an aryl group (preferably a C6 to C30, more preferably C6 to C20, particularly preferably C6 to C12 group, for example phenyl, p-methylphenyl, naphthyl, etc.), a substituted carbonyl group (preferably a C1 to C20, more preferably C1 to C16, particularly preferably C1 to C12 group, for example acetyl, benzoyl, methoxycarbonyl, phenyloxycarbonyl, dimethylaminocarbonyl, phenylaminocarbonyl, etc.), a substituted sulfonyl group (preferably a C1 to C20, more preferably C1 to C16, particularly preferably C1 to C12 group, for example mesyl, tosyl, etc.), or a heterocyclic group (including an aliphatic heterocyclic group and aromatic heterocyclic group, preferably a C1 to C50, more preferably C1 to C30, more preferably C2 to C12 group, preferably containing either an oxygen atom, a sulfur atom or a nitrogen atom, for example imidazolyl, pyridyl, furyl, piperidyl, morpholino, benzoxazolyl, triazolyl groups, etc.). Each of $R^{D21}$, $R^{D22}$ and $R^{D23}$ is preferably an alkyl group, aryl group or aromatic heterocyclic group, more preferably an alkyl or aryl group, and still more preferably an aryl group.

The formula (D-3) is described in detail.

$M^{D3}$, $L^{D31}$, $L^{D32}$, $G^{D31}$ and $G^{D32}$ have the same meaning as defined above in their corresponding $M^{D1}$, $L^{D11}$, $L^{D12}$, $G^{D11}$ and $G^{D12}$ in the formula (D-1), and their preferable examples are also the same as defined above.

$X^{D31}$, $X^{D32}$, $X^{D33}$ and $X^{D34}$ have the same meaning as defined above in their corresponding $X^{D21}$, $X^{D22}$, $X^{D23}$ and $X^{D24}$ in the formula (D-2), and their preferable examples are also the same as defined above.

$Y^{D31}$, $Y^{D32}$, $Y^{D33}$ and $Y^{D34}$ have the same meaning as defined above in their corresponding $Y^{D21}$, $Y^{D22}$, $Y^{D23}$ and $Y^{D24}$ in the formula (D-2), and their preferable examples are also the same as defined above.

The formula (D-4) is described in detail.

$M^{D4}$, $L^{D41}$, $L^{D42}$, $G^{D41}$ and $G^{D42}$ have the same meaning as defined above in their corresponding $M^{D1}$, $L^{D11}$, $L^{D12}$, $G^{D11}$ and $G^{D12}$ in the formula (D-1), and their preferable examples are also the same as defined above.

$X^{D41}$, $X^{D42}$, $X^{D43}$ and $X^{D44}$ have the same meaning as defined above in their corresponding $X^{D21}$, $X^{D22}$, $X^{D23}$ and $X^{D24}$ in the formula (D-2), and their preferable examples are also the same as defined above. $Y^{D41}$, $Y^{D42}$, $Y^{D43}$ and $Y^{D44}$ have the same meaning as defined above in their corresponding $Y^{D21}$, $Y^{D22}$, $Y^{D23}$ and $Y^{D24}$ in the formula (D-2), and their preferable examples are also the same as defined above.

Specific examples of the compounds represented by the formula (D-1) are illustrated below, but the invention is not limited thereto.

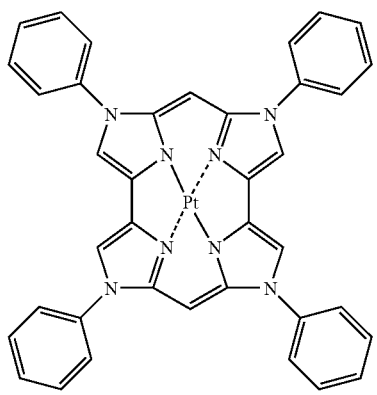

(D1)

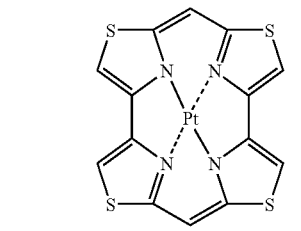

(D2)

-continued
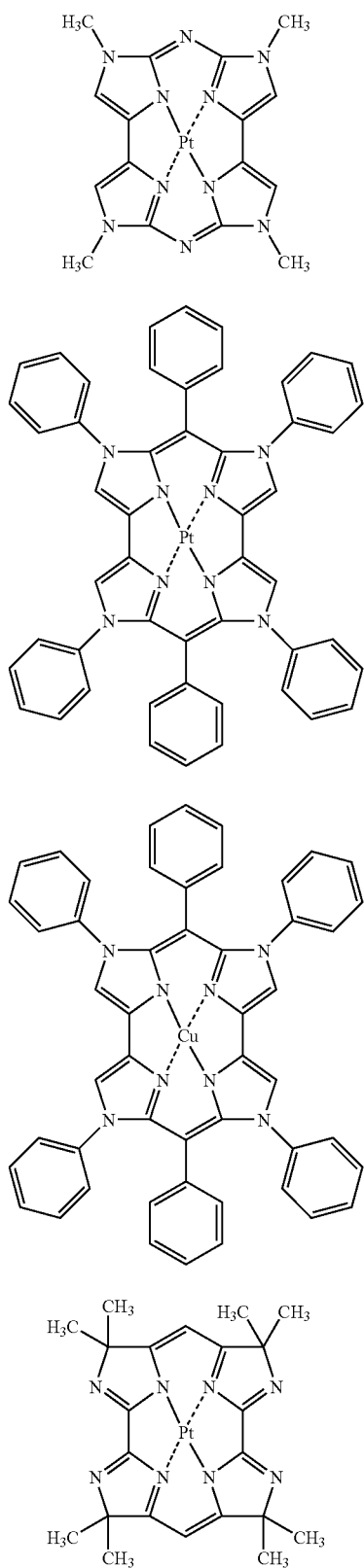
(D3)
(D4)
(D5)
(D6)
-continued
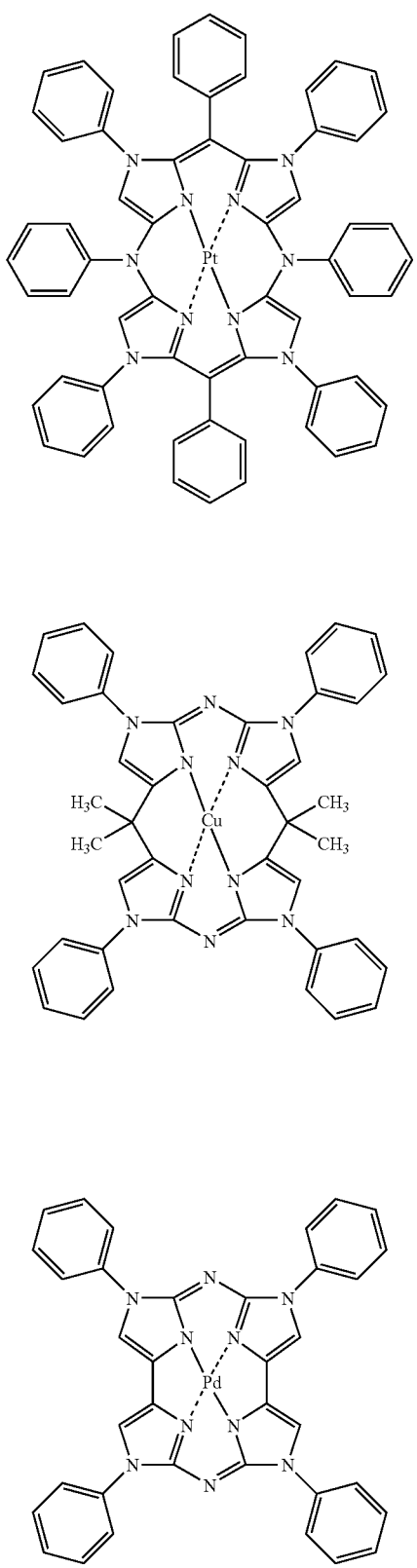
(D7)
(D8)
(D9)

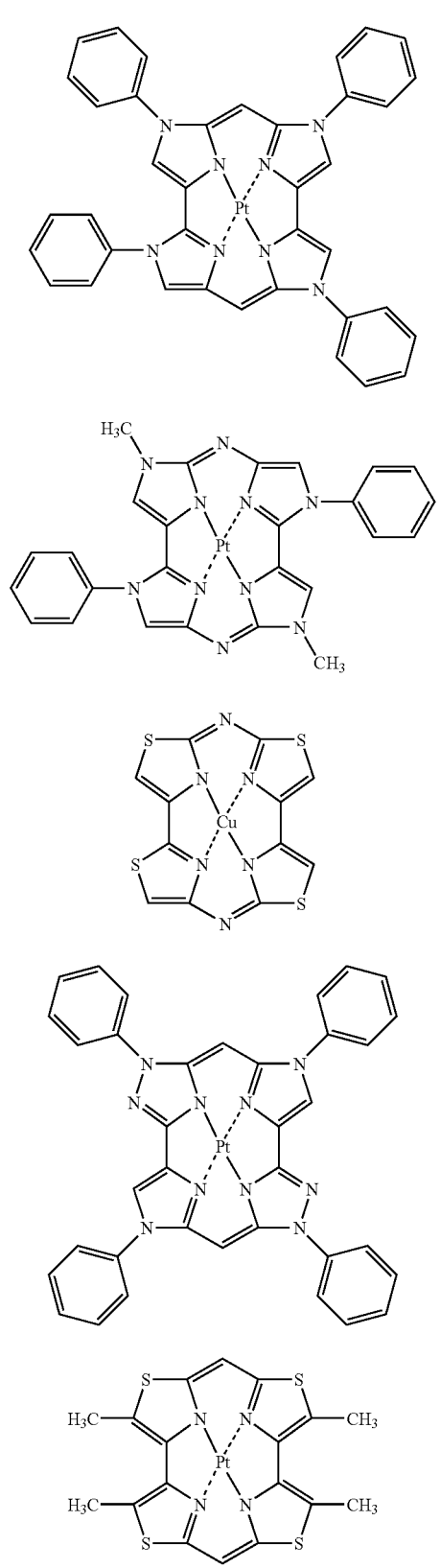
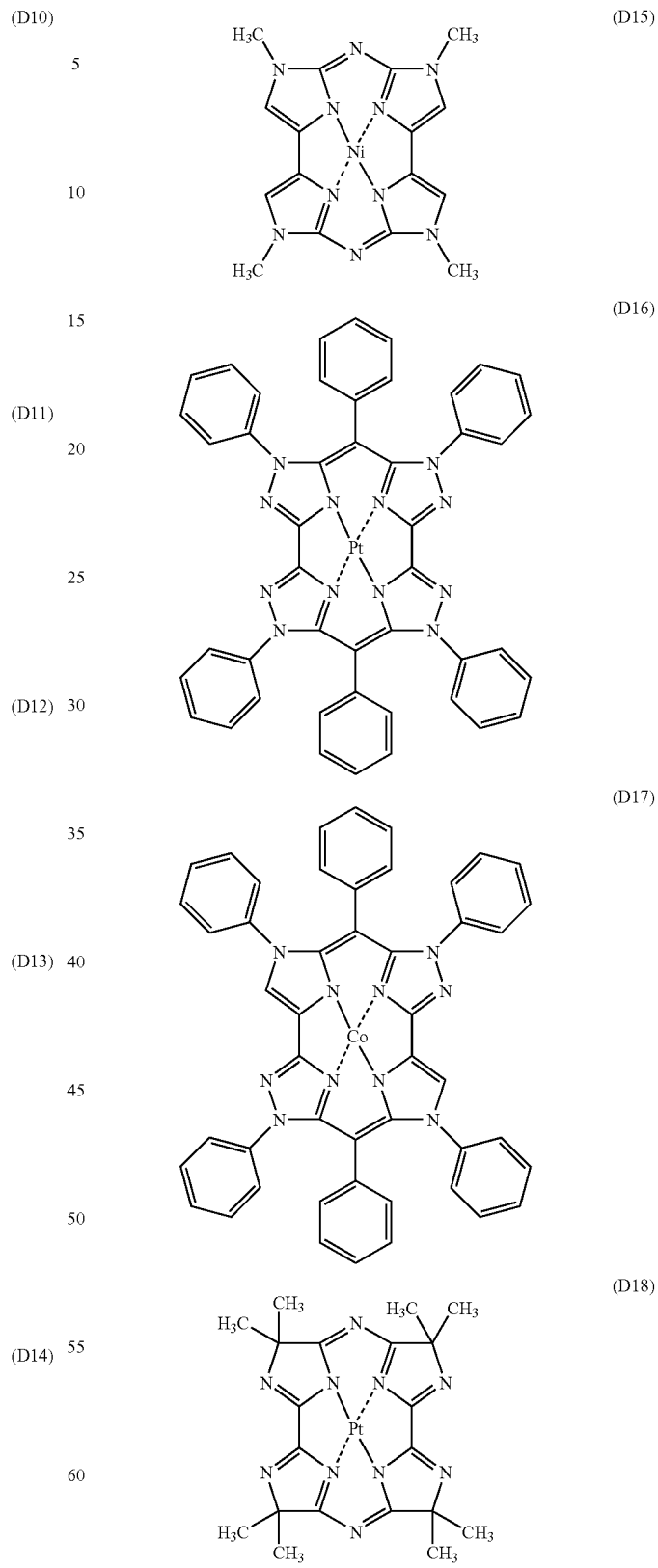

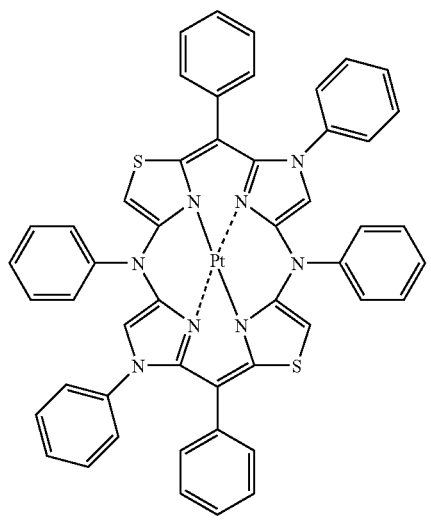 (D19)
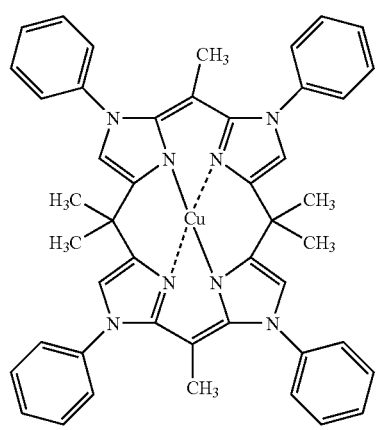 (D20)
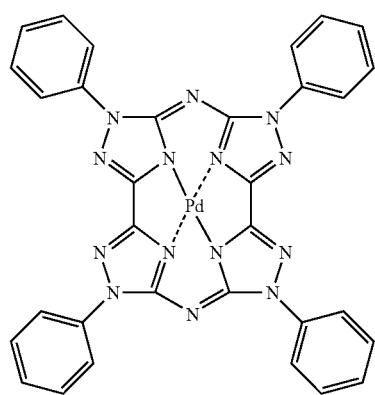 (D21)
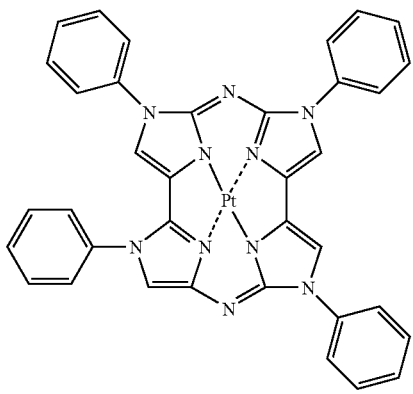 (D22)
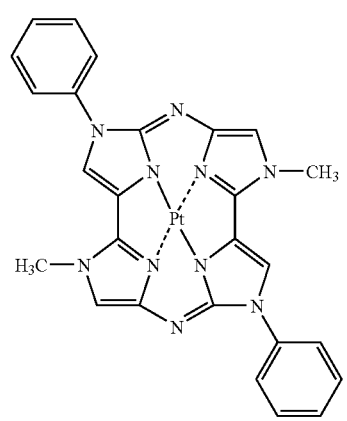 (D23)
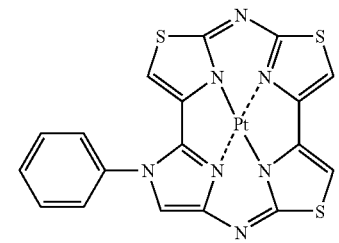 (D24)
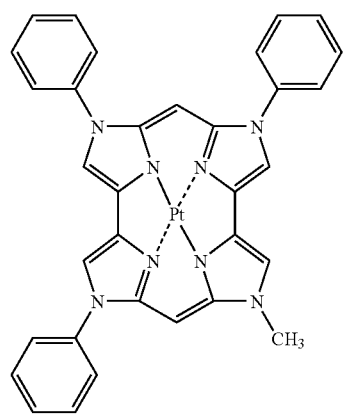 (D25)

-continued
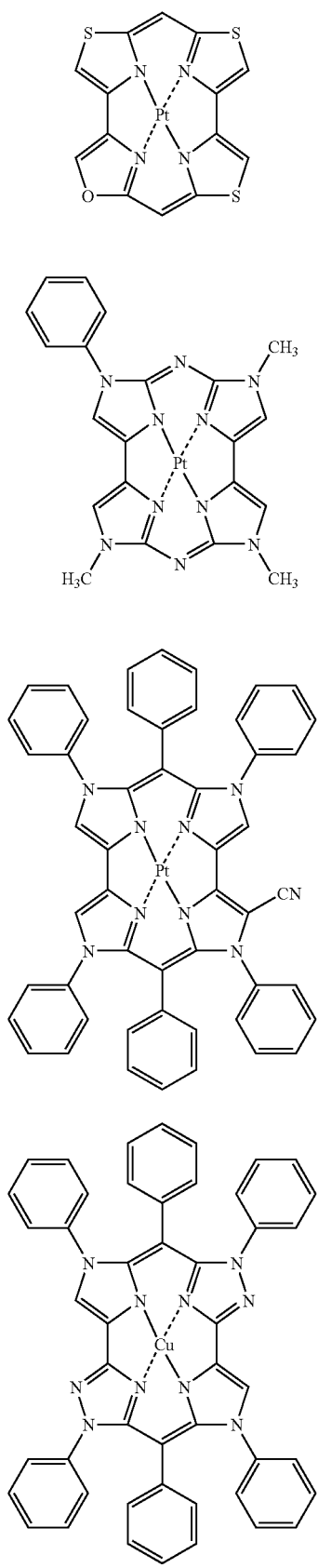
(D26)
(D27)
(D28)
(D29)
-continued
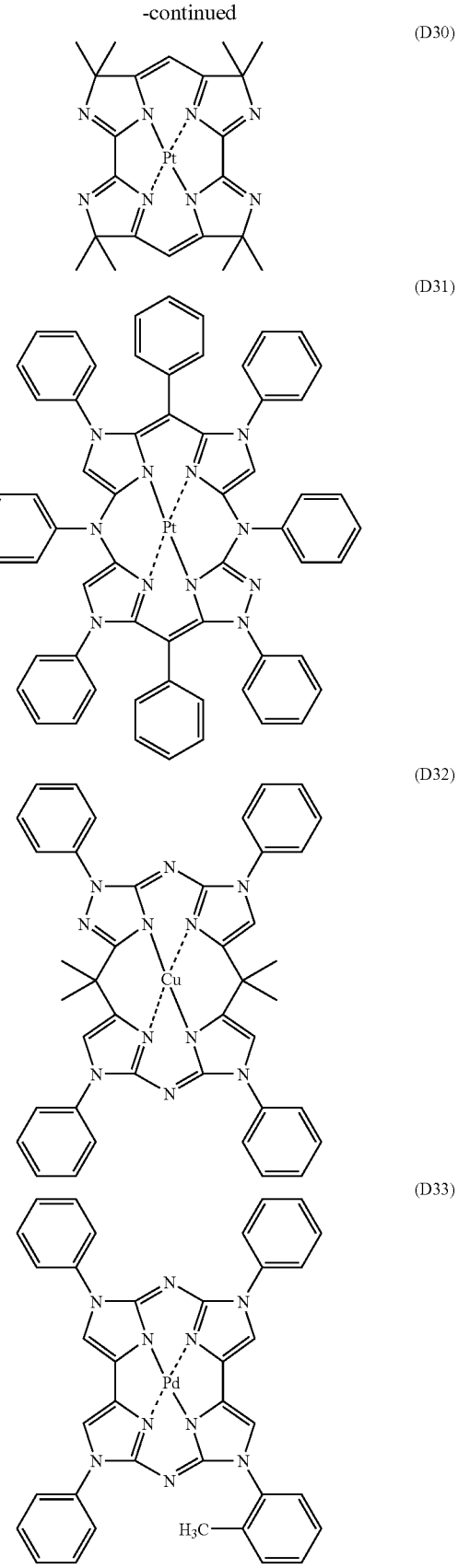
(D30)
(D31)
(D32)
(D33)

One of preferable compounds among the metal complexes in the invention is a compound represented by the following formula (E-1):

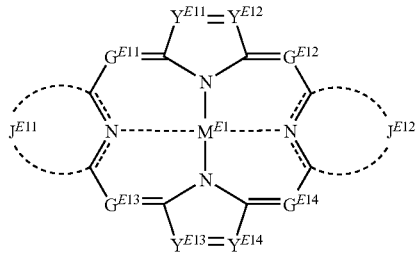

Formula (E-1)

In the formula (E-1), $M^{E1}$ represents a metal ion. $J^{E11}$ and $J^{E12}$ independently represent an atomic group necessary for forming a 5-membered ring. $G^{E11}$, $G^{E12}$, $G^{E13}$ and $G^{E14}$ independently represent a nitrogen atom or a substituted or unsubstituted carbon atom. $Y^{E11}$, $Y^{E12}$, $Y^{E13}$ and $Y^{E14}$ independently represent a nitrogen atom or a substituted or unsubstituted carbon atom.

The formula (E-1) is described in detail.

$M^{E1}$ has the same meaning as defined above in $M^{A1}$ in the formula (A-1), and its preferable examples are also the same as defined above. $G^{E11}$, $G^{E12}$, $G^{E13}$ and $G^{E14}$ have the same meaning as defined in $G^{C11}$ and $G^{C12}$ in the formula (C-1), and their preferable examples are also the same as defined above.

$J^{E11}$ and $J^{E12}$ have the same meaning as defined in $J^{D11}$ to $J^{D14}$ in the formula (D-1), and their preferable examples are also the same as defined above. $Y^{E11}$, $Y^{E12}$, $Y^{E13}$ and $Y^{E14}$ have the same meaning as defined in their corresponding $Y^{C21}$ to $Y^{C24}$ in the formula (C-2), and their preferable examples are also the same as defined above.

The compound represented by the formula (E-1) is more preferably a compound represented by the following formula (E-2) or (E-3).

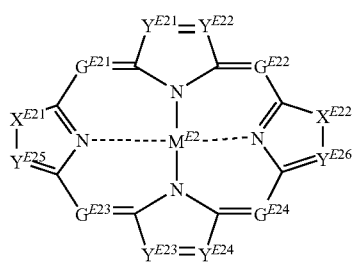

Formula (E-2)

In the formula (E-2), $M^{E2}$ represents a metal ion. $G^{E21}$, $G^{E22}$, $G^{E23}$ and $G^{E24}$ independently represent a nitrogen atom or a substituted or unsubstituted carbon atom. $Y^{E21}$, $Y^{E22}$, $Y^{E23}$, $Y^{E24}$, $Y^{E25}$ and $Y^{E26}$ independently represent a nitrogen atom or a substituted or unsubstituted carbon atom.

$X^{E21}$ and $X^{E22}$ independently represent an oxygen atom, a sulfur atom, —$NR^{E21}$— or —$C(R^{E22})R^{E23}$—. $R^{E21}$, $R^{E22}$ and $R^{E23}$ independently represent a hydrogen atom or a substituent group.

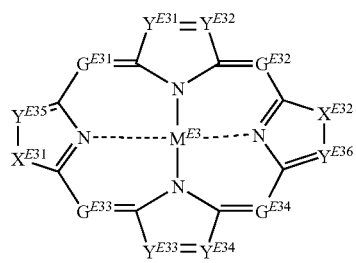

Formula (E-3)

In the formula (E-3), $M^{E3}$ represents a metal ion. $J^{E31}$ and $J^{E32}$ independently represent an atomic group necessary for forming a 5-membered ring. $G^{E31}$, $G^{E32}$, $G^{E33}$ and $G^{E34}$ independently represent a nitrogen atom or a substituted or unsubstituted carbon atom. $Y^{E31}$, $Y^{E32}$, $Y^{E33}$, $Y^{E34}$, $Y^{E35}$ and $Y^{E36}$ independently represent a nitrogen atom or a substituted or unsubstituted carbon atom. $X^{E31}$ and $X^{E32}$ independently represent an oxygen atom, a sulfur atom, —$NR^{E31}$— or —$C(R^{E32})R^{E33}$—. $R^{E31}$, $R^{E32}$ and $R^{E33}$ independently represent a hydrogen atom or a substituent group.

The formula (E-2) is described in detail.

$M^{E2}$, $G^{E21}$, $G^{E22}$, $G^{E23}$, $G^{E24}$, $Y^{E21}$, $Y^{E22}$, $Y^{E23}$ and $Y^{E24}$ have the same meaning as defined above in their corresponding $M^{E1}$, $G^{E11}$, $G^{E12}$, $G^{E13}$, $G^{E14}$, $Y^{E11}$, $Y^{E12}$, $Y^{E13}$ and $Y^{E14}$ in the formula (E-1), and their preferable examples are also the same as defined above. $X^{E21}$ and $X^{E22}$ have the same meaning as defined in their corresponding $X^{D21}$ and $X^{D22}$ in the formula (D-2), and their preferable examples are also the same as defined above.

The formula (E-3) is described in detail.

$M^{E3}$, $G^{E31}$, $G^{E32}$, $G^{E33}$, $G^{E34}$, $Y^{E31}$, $Y^{E32}$, $Y^{E33}$ and $Y^{E34}$ have the same meaning as defined above in their corresponding $M^{E1}$, $G^{E11}$, $G^{E12}$, $G^{E13}$, $G^{E14}$, $Y^{E11}$, $Y^{E12}$, $Y^{E13}$ and $Y^{E14}$ in the formula (E-1), and their preferable examples are also the same as defined above. $X^{E31}$ and $X^{E32}$ have the same meaning as defined in their corresponding $X^{E21}$ and $X^{E22}$ in the formula (E-2), and their preferable examples are also the same as defined above.

Specific examples of the compounds represented by the formula (E-1) are illustrated below, but the invention is not limited thereto.

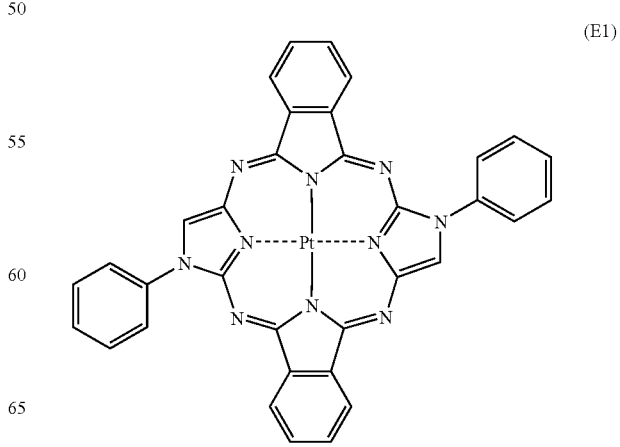

(E1)

-continued
(E2)
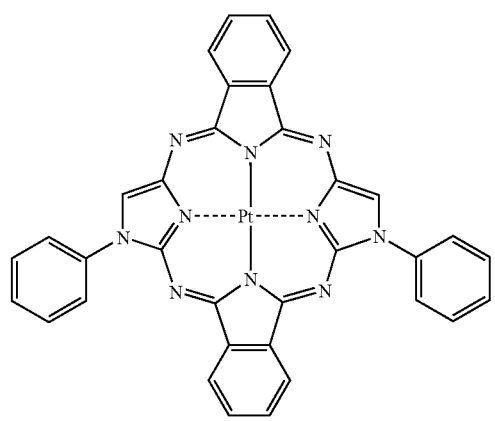
(E3)
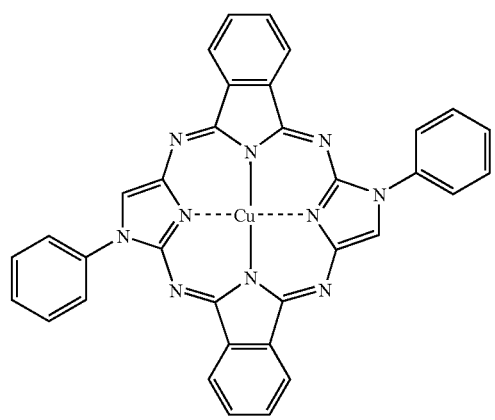
(E4)
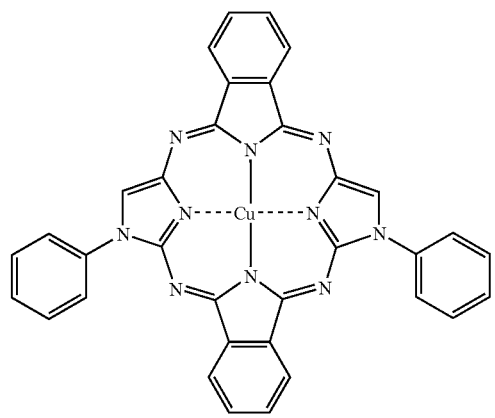
(E5)
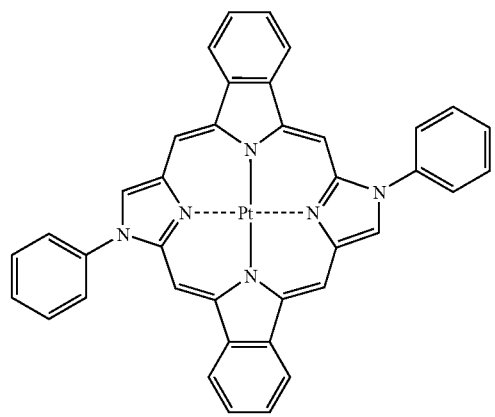
-continued
(E6)
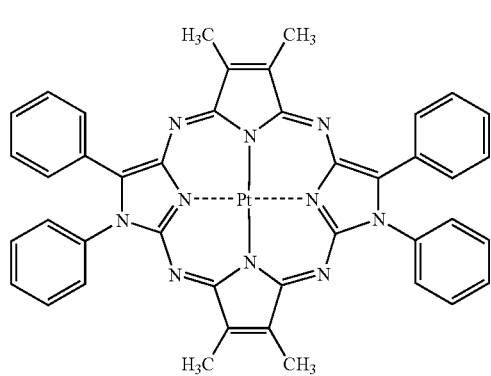
(E7)
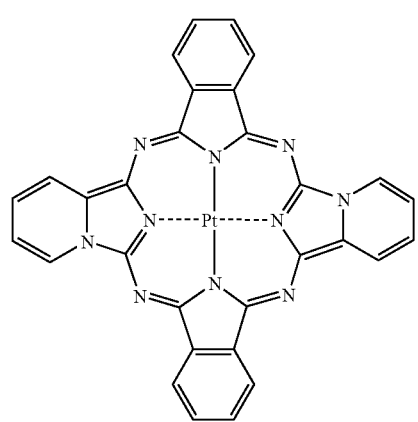
(E8)
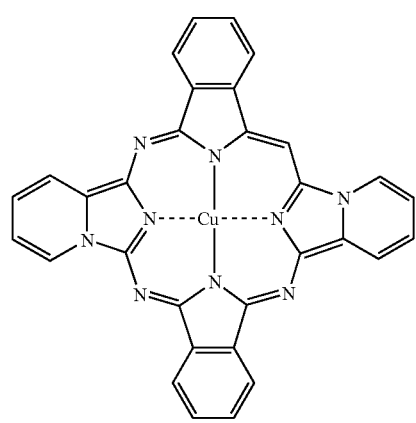

-continued
(E9)
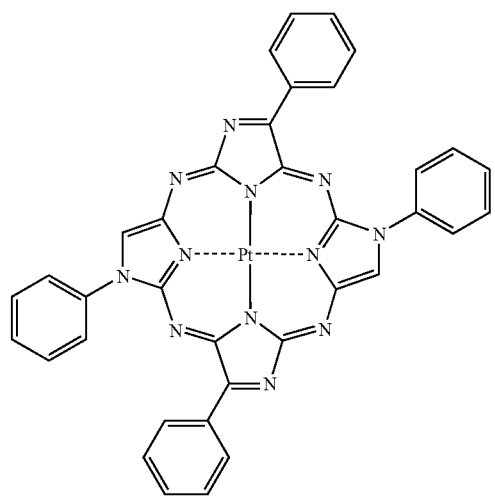
(E10)
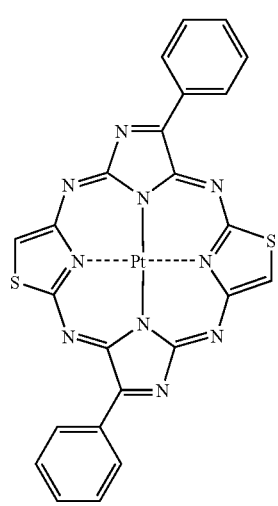
(E11)
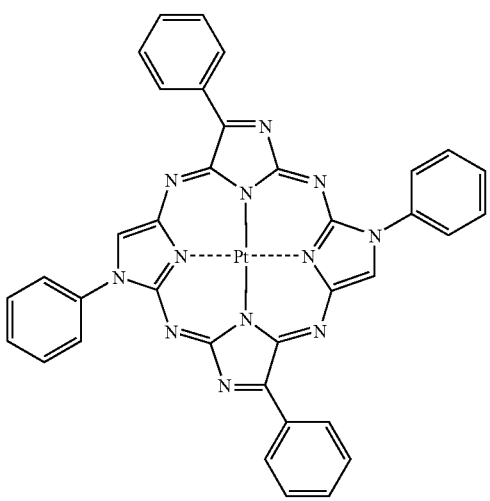
-continued
(E12)
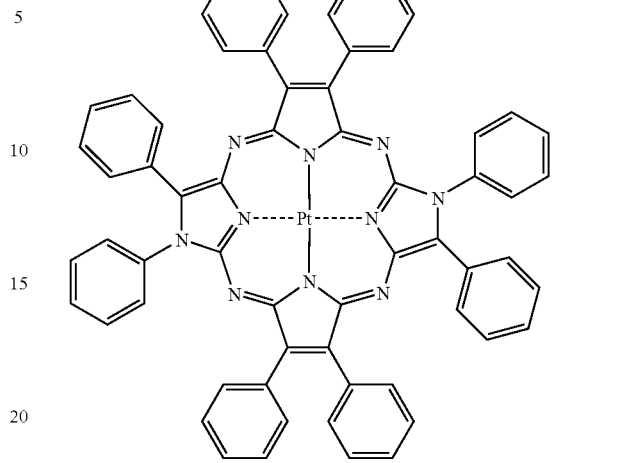
(E13)
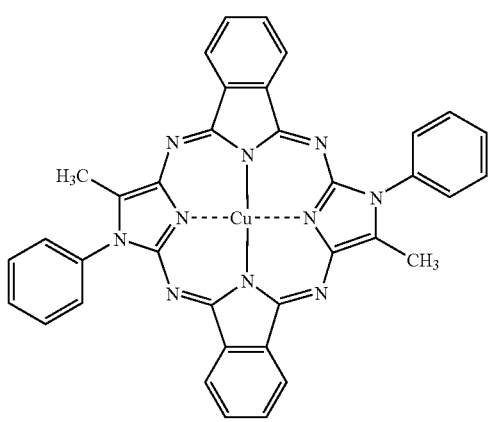
(E14)
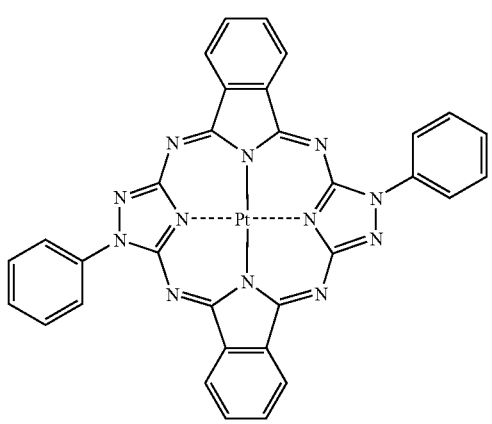

-continued

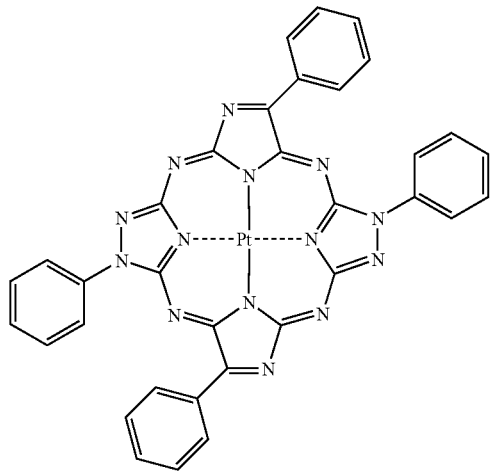

(E15)

One of preferable compounds among the metal complexes in the invention is a compound represented by the following formula (F-1):

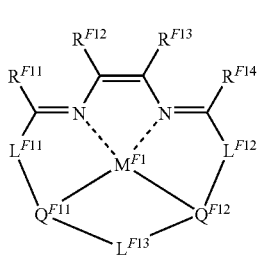

Formula (F-1)

In the formula (F-1), $M^{F1}$ represents a metal ion. $L^{F11}$, $L^{F12}$ and $L^{F13}$ independently represent a linking group. $R^{F11}$, $R^{F12}$, $R^{F13}$ and $R^{F14}$ independently represent a hydrogen atom or a substituent group. $R^{F11}$ and $R^{F12}$, $R^{F12}$ and $R^{F13}$, or $R^{F13}$ and $R^{F14}$ may, if possible, be bonded to each other to form a ring provided that the ring formed by $R^{F11}$ and $R^{F12}$ or $R^{F13}$ and $R^{F14}$ is a 5-membered ring. $Q^{F11}$ and $Q^{F12}$ independently represent a partial structure containing an atom bonded to $M^{F1}$.

The compound represented by the formula (F-1) is described in detail.

$M^{F1}$, $L^{F11}$, $L^{F12}$, $L^{F13}$, $Q^{F11}$ and $Q^{F12}$ have the same meaning as defined above in their corresponding $M^{A1}$, $L^{A11}$, $L^{A12}$, $L^{A13}$, $Q^{A11}$ and $Q^{A12}$ in the formula (A-1), and their preferable examples are also the same as defined above. $R^{F11}$, $R^{F12}$, $R^{F13}$ and $R^{F14}$ independently represent a hydrogen atom or a substituent group. $R^{F11}$ and $R^{F12}$, $R^{F12}$ and $R^{F13}$, or $R^{F13}$ and $R^{F14}$ may, if possible, be bonded to each other to form a ring provided that the ring formed by $R^{F11}$ and $R^{F12}$ or $R^{F13}$ and $R^{F14}$ is a 5-membered ring. The substituent group represented by $R^{F11}$, $R^{F12}$, $R^{F13}$ or $R^{F14}$ may be selected from the above-mentioned substituent groups listed as examples of the substituent group represented by their corresponding $R^{C11}$ to $R^{C14}$ in the formula (C-1). Each of $R^{F11}$, $R^{F12}$, $R^{F13}$ and $R^{F14}$ is preferably a group forming a 5-membered ring which $R^{F11}$ and $R^{F12}$, or $R^{F13}$ and $R^{F14}$, are bonded to each other to form or a group forming an aromatic ring which $R^{F12}$ and $R^{F13}$ are bonded to each other to form.

The compound represented by the formula (F-1) is more preferably a compound represented by formula (F-2), (F-3) or (F-4).

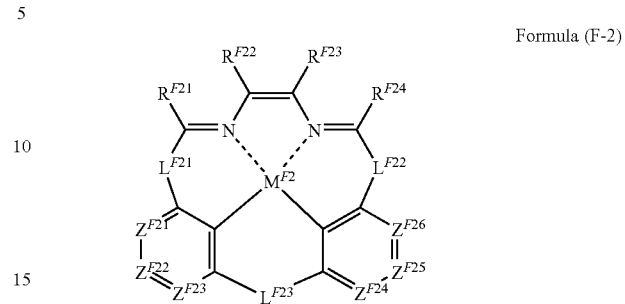

Formula (F-2)

In the formula (F-2), $M^{F2}$ represents a metal ion. $L^{F21}$, $L^{F22}$ and $L^{F23}$ independently represent a linking group. $R^{F21}$, $R^{F22}$, $R^{F23}$ and $R^{F24}$ independently represent a substituent group, and $R^{F21}$ and $R^{F22}$, $R^{F22}$ and $R^{F23}$ or $R^{F23}$ and $R^{F24}$ may, if possible, be bonded to each other to form a ring provided that the ring formed by $R^{F21}$ and $R^{F22}$ or $R^{F23}$ and $R^{F24}$ is a 5-membered ring. $Z^{F21}$, $Z^{F22}$, $Z^{F23}$, $Z^{F24}$, $Z^{F25}$ and $Z^{F26}$ independently represent a nitrogen atom or a substituted or unsubstituted carbon atom.

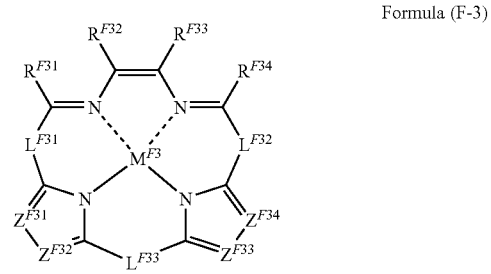

Formula (F-3)

In the formula (F-3), $M^{F3}$ represents a metal ion. $L^{F31}$, $L^{F32}$ and $L^{F33}$ independently represent a linking group. $R^{F31}$, $R^{F32}$, $R^{F33}$ and $R^{F34}$ independently represent a substituent group. $R^{F31}$ and $R^{F32}$, $R^{F32}$ and $R^{F33}$, or $R^{F33}$ and $R^{F34}$ may, if possible, be bonded to each other to form a ring provided that the ring formed by $R^{F31}$ and $R^{F32}$ or $R^{F33}$ and $R^{F34}$ is a 5-membered ring. $Z^{F31}$, $Z^{F32}$, $Z^{F33}$ and $Z^{F34}$ independently represent a nitrogen atom or a substituted or unsubstituted carbon atom.

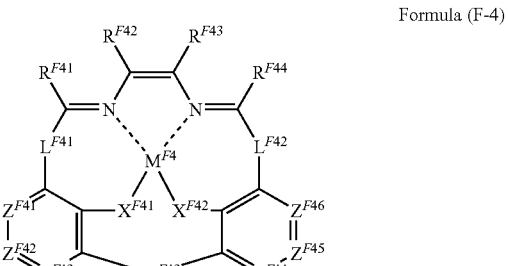

Formula (F-4)

In the formula (F-4), $M^{F4}$ represents a metal ion. $L^{F41}$, $L^{F42}$ and $L^{F43}$ independently represent a linking group. $R^{F41}$, $R^{F42}$, $R^{F43}$ and $R^{F44}$ independently represent a substituent group, and $R^{F41}$ and $R^{F42}$, $R^{F42}$ and $R^{F43}$ or $R^{F43}$ and $R^{F44}$ may if possible, be bonded to each other to form a ring provided that the ring formed by $R^{F41}$ and $R^{F42}$ or $R^{F43}$ and $R^{F44}$ is a 5-membered ring. $Z^{F41}$, $Z^{F42}$, $Z^{F43}$, $Z^{F44}$, $Z^{F45}$ and $Z^{F46}$ independently represent a nitrogen atom or a substituted or unsubstituted carbon atom. $X^{F41}$ and $X^{F42}$ independently represent an oxygen atom, a sulfur atom or a substituted or unsubstituted nitrogen atom.

The compound represented by the formula (F-2) is described in detail.

$M^{F2}$, $L^{F21}$, $L^{F22}$, $L^{F23}$, $R^{F21}$, $R^{F22}$, $R^{F23}$ and $R^{F24}$ have the same meaning as defined above in their corresponding $M^{F1}$, $L^{F11}$, $L^{F12}$, $L^{F13}$, $R^{F11}$, $R^{F12}$, $R^{F13}$ and $R^{F14}$ in the formula (F-1), and their preferable examples are also the same as defined above.

$Z^{F21}$, $Z^{F22}$, $Z^{F23}$, $Z^{F24}$, $Z^{F25}$ and $Z^{F26}$ independently represent a nitrogen atom or a substituted or unsubstituted carbon atom. Each of $Z^{F21}$, $Z^{F22}$, $Z^{F23}$, $Z^{F24}$, $Z^{F25}$ and $Z^{F26}$ is preferably a substituted or unsubstituted carbon atom, and more preferably an unsubstituted carbon atom. A substituent group with which the carbon atom is substituted may be selected from the above-mentioned substituent groups listed as examples of the substituent group on the divalent linking group represented by $L^{A11}$, $L^{A12}$, $L^{A13}$ or $L^{A14}$ in the formula (A-1).

The compound represented by the formula (F-3) is described in detail.

$M^{F3}$, $L^{F31}$, $L^{F32}$, $L^{F33}$, $R^{F31}$, $R^{F32}$, $R^{F33}$ and $R^{F34}$ have the same meaning as defined above in their corresponding $M^{F1}$, $L^{F11}$, $L^{F12}$, $L^{F13}$, $R^{F11}$, $R^{F12}$, $R^{F13}$ and $R^{F14}$ in the formula (F-1), and their preferable examples are also the same as defined above. $Z^{F31}$, $Z^{F32}$, $Z^{F33}$ and $Z^{F34}$ independently represent a nitrogen atom or a substituted or unsubstituted carbon atom. Each of $Z^{F31}$, $Z^{F32}$, $Z^{F33}$ and $Z^{F34}$ is preferably a substituted or unsubstituted carbon atom, and more preferably an unsubstituted carbon atom. A substituent group with which the carbon atom is substituted may be selected from the above-mentioned substituent groups listed as examples of the substituent group on the divalent linking group represented by $L^{A11}$, $L^{A12}$, $L^{A13}$ or $L^{A14}$ in the formula (A-1).

The compound represented by the formula (F-4) is described in detail.

$M^{F4}$, $L^{F41}$, $L^{F42}$, $L^{F43}$, $R^{F41}$, $R^{F42}$, $R^{F43}$ and $R^{F44}$ have the same meaning as defined above in their corresponding $M^{F1}$, $L^{F11}$, $L^{F12}$, $L^{F13}$, $R^{F11}$, $R^{F12}$, $R^{F13}$ and $R^{F14}$ in the formula (F-1), and their preferable examples are also the same as defined above.

$Z^{F41}$, $Z^{F42}$, $Z^{F43}$, $Z^{F44}$, $Z^{F45}$ and $Z^{F46}$ independently represent a nitrogen atom or a substituted or unsubstituted carbon atom. Each of $Z^{F41}$, $Z^{F42}$, $Z^{F43}$, $Z^{F44}$, $Z^{F45}$ and $Z^{F46}$ is preferably a substituted or unsubstituted carbon atom, and more preferably an unsubstituted carbon atom. A substituent group with which the carbon atom is substituted may be selected from the above-mentioned substituent groups listed as examples of the substituent group on the divalent linking group represented by $L^{A11}$, $L^{A12}$, $L^{A13}$ or $L^{A14}$ in the formula (A-1).

$X^{F41}$ and $X^{F42}$ independently represent an oxygen atom, a sulfur atom or a substituted or unsubstituted nitrogen atom. Each of $X^{F41}$ and $X^{F42}$ is preferably an oxygen atom or a sulfur atom, and more preferably an oxygen atom.

Specific examples of the compounds represented by the formula (F-1) are illustrated below, but the invention is not limited thereto.

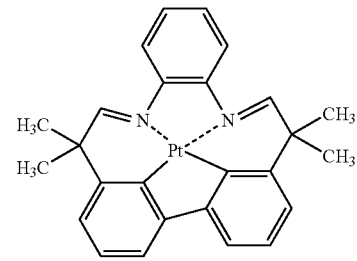
(F1)

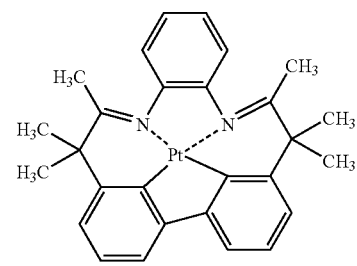
(F2)

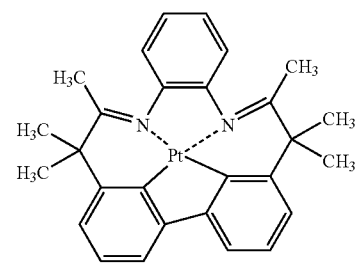
(F3)

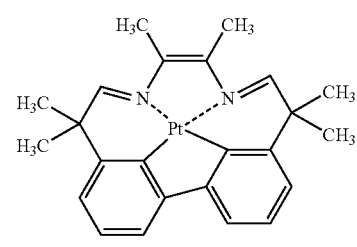
(F4)

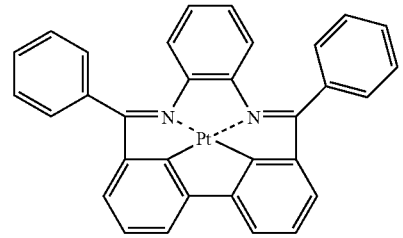
(F5)

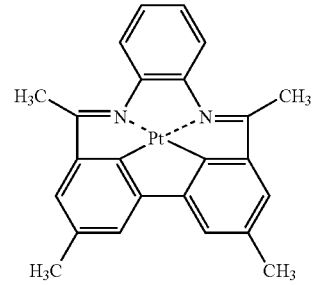
(F6)

(F7)
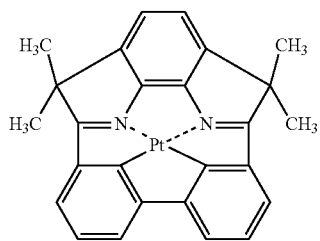
(F8)
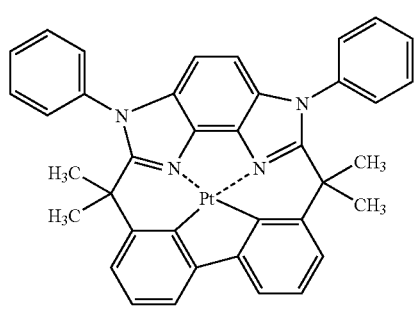
(F9)
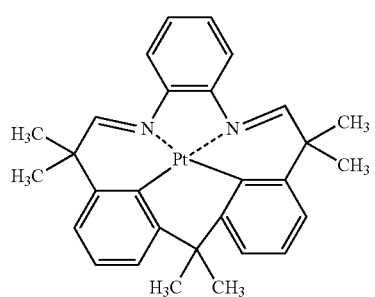
(F10)
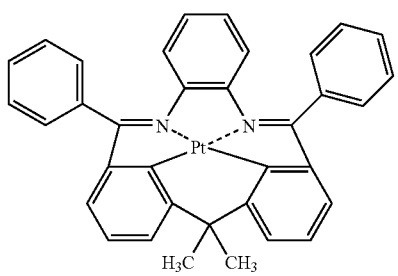
(F11)
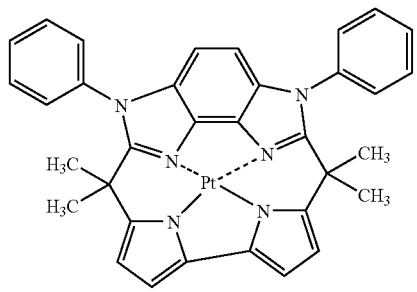
(F12)
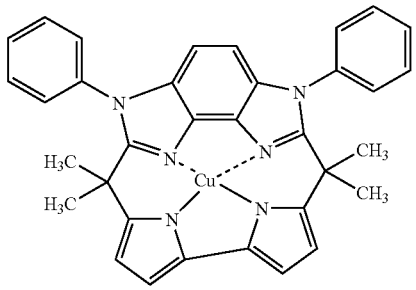
(F13)
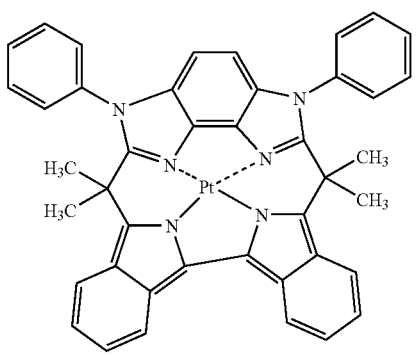
(F14)
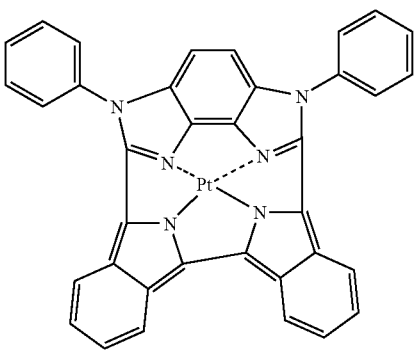
(F15)
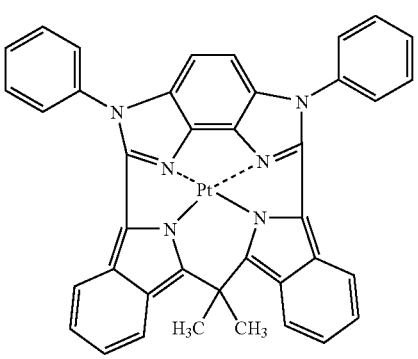

-continued
(F16)
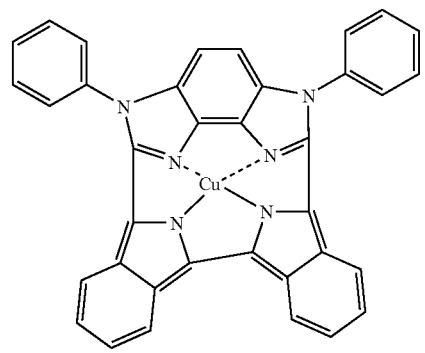
(F17)
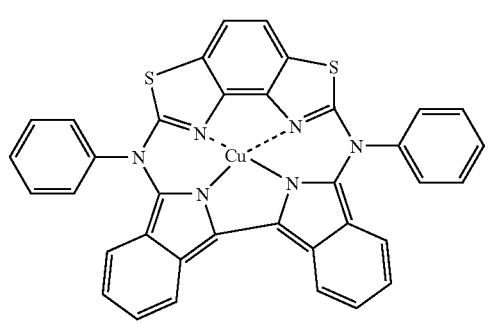
(F18)
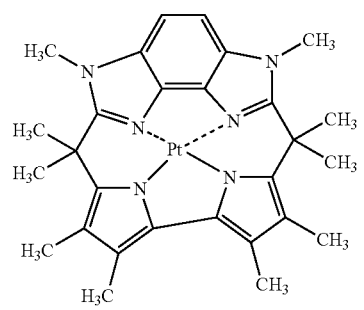
(F19)
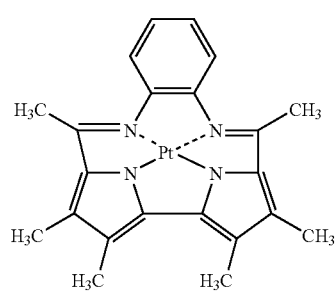
(F20)
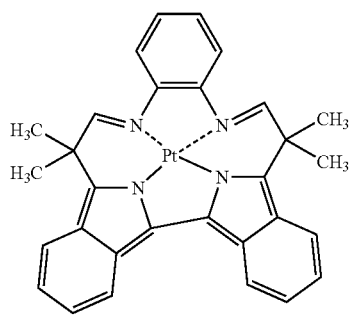
-continued
(F21)
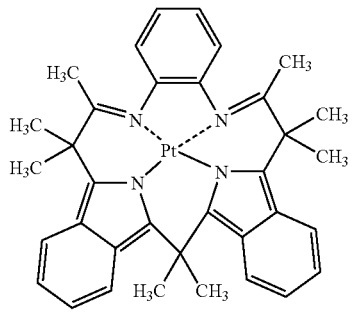
(F22)
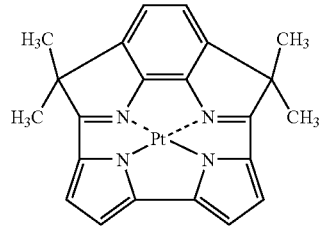
(F23)
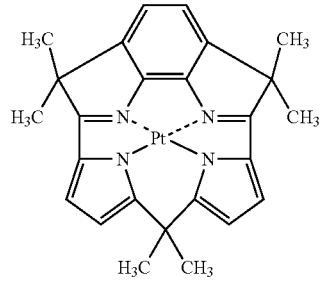
(F24)
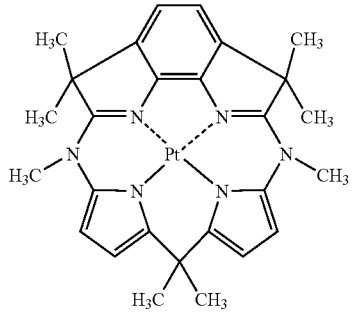
(F25)
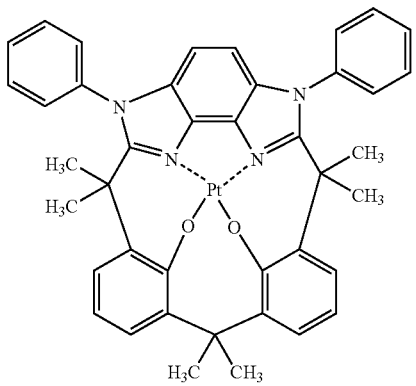

-continued
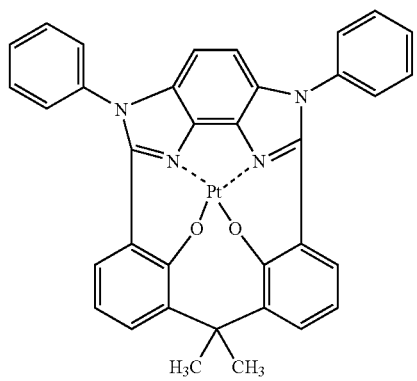
(F26)
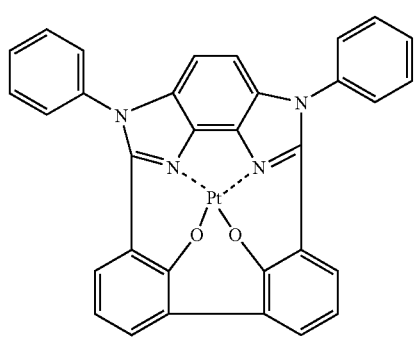
(F27)
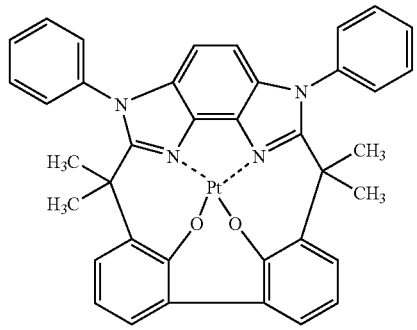
(F28)
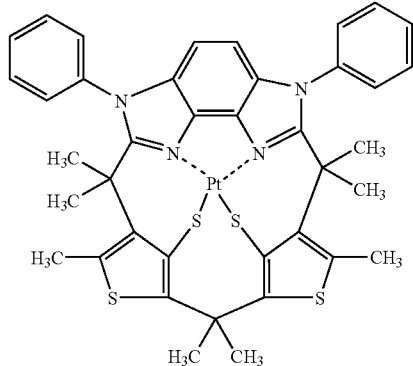
(F29)
-continued
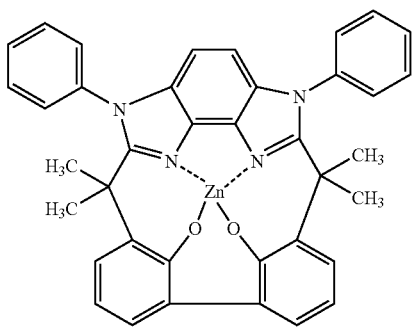
(F30)
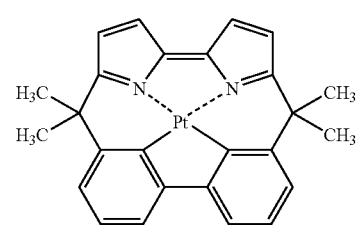
(F31)
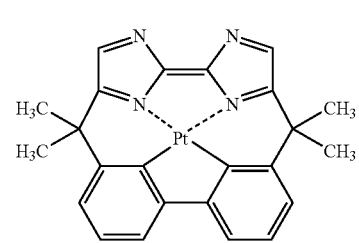
(F32)
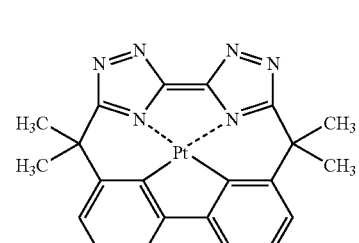
(F33)
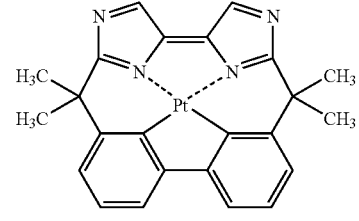
(F34)
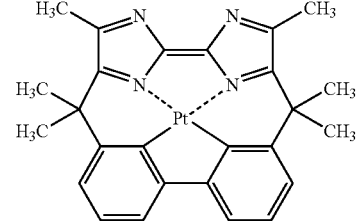
(F35)

-continued
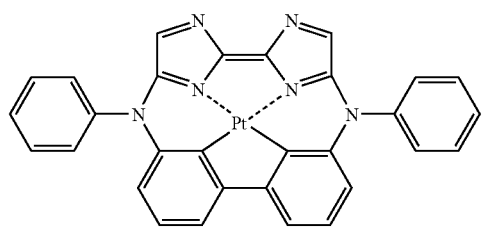 (F36)
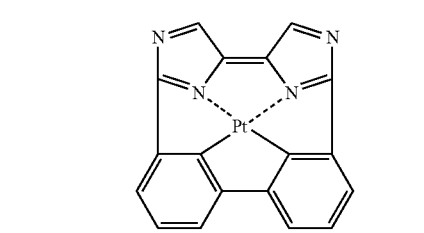 (F37)
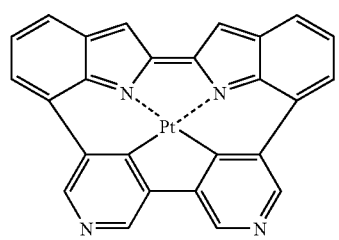 (F38)
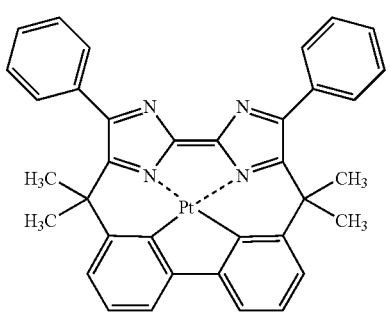 (F39)
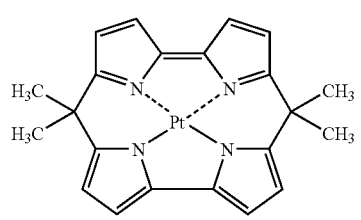 (F40)
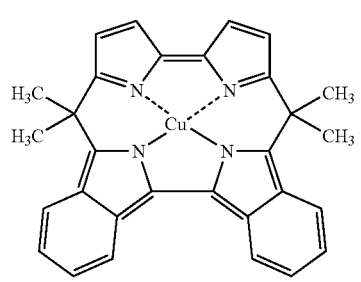 (F41)
-continued
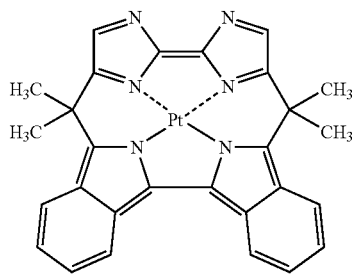 (F42)
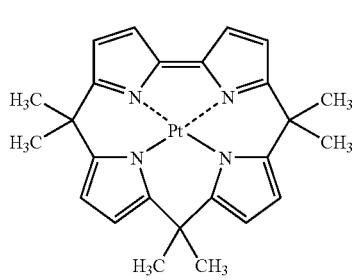 (F43)
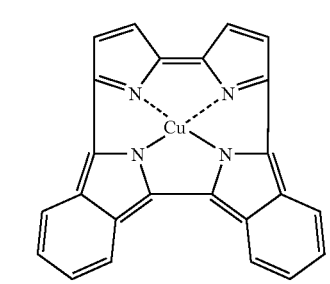 (F44)
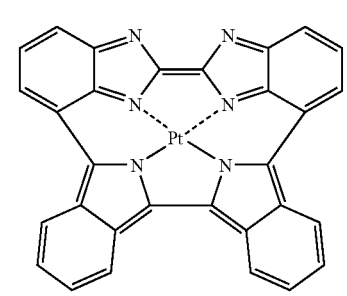 (F45)
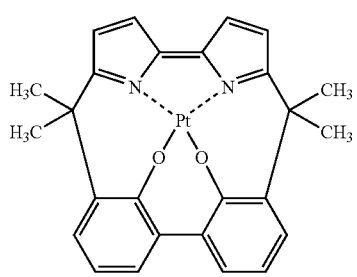 (F46)

-continued
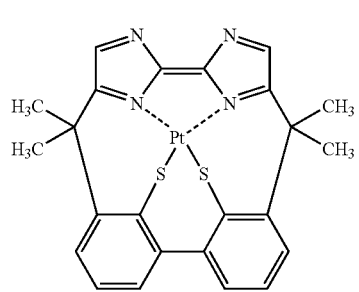
(F47)
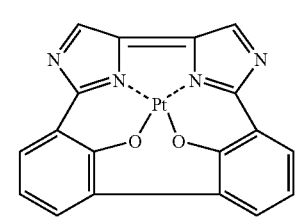
(F48)
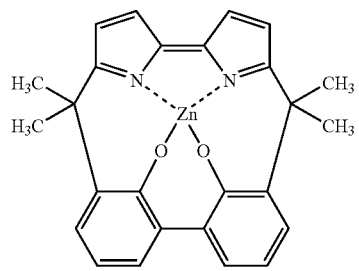
(F49)
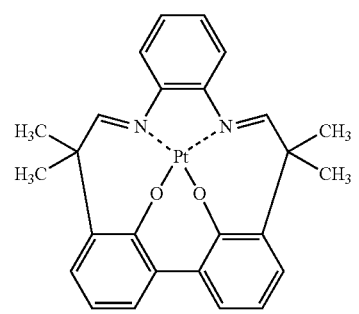
(F50)
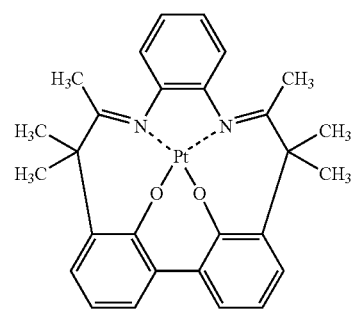
(F51)
-continued
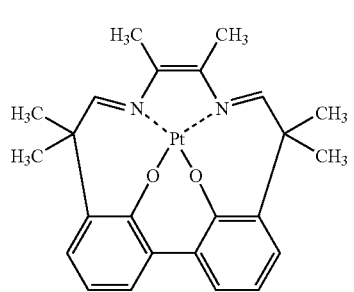
(F52)
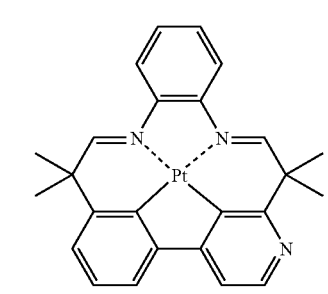
(F53)
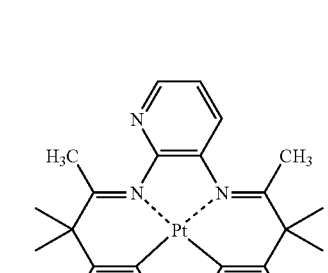
(F54)
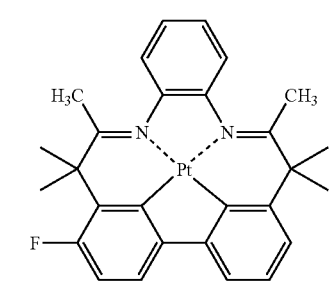
(F55)
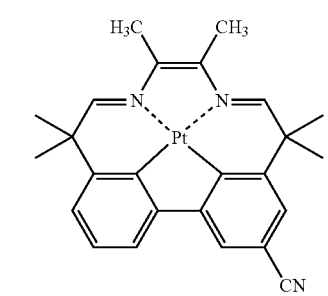
(F56)

-continued (F57) 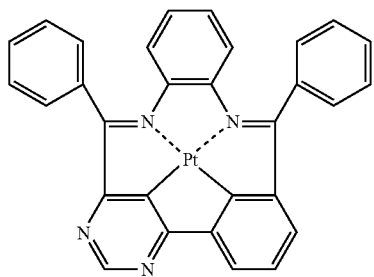

(F58) 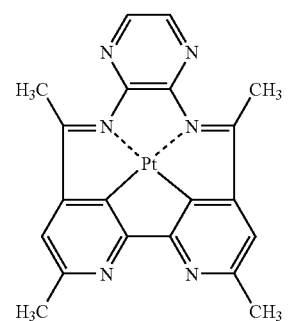

(F59) 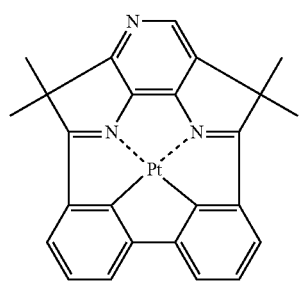

(F60) 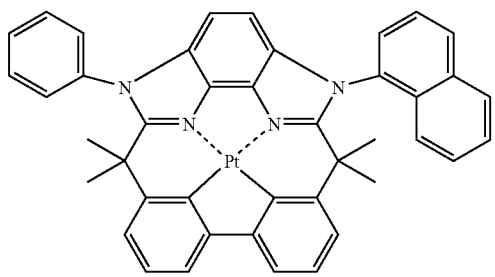

(F61) 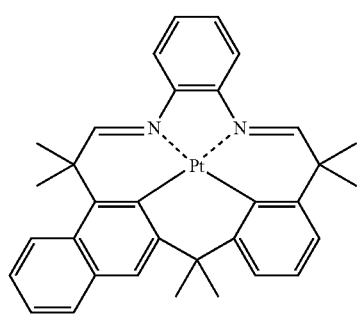

-continued (F62) 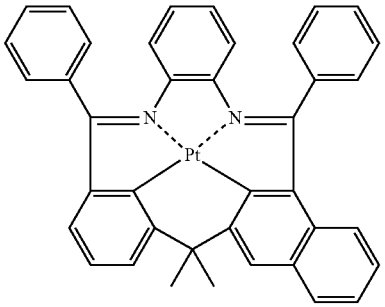

(F63) 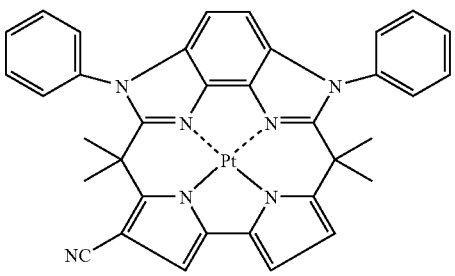

(F64) 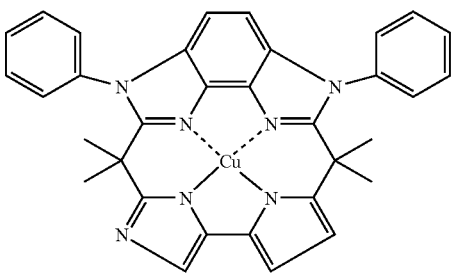

Next, the organic EL element containing the metal complex in the invention is described.

The organic EL element of the invention can make use of an ordinary emission system, driving method, application mode, etc. insofar as it is an element utilizing the metal complex in the invention.

The metal complex in the invention can be used in any of a hole injection material, a hole transport material, a luminescent material, an electron injection material, an electron transport material, a hole blocking material, an electron blocking material or an exciton blocking material, but is preferably used in a hole injection material, a hole transport material, an electron blocking material or a luminescent material, more preferably in a hole injection material or a luminescent material, and still more preferably in a luminescent material. When the metal complex is used in a luminescent material, the emission may be UV emission, visible light emission or IR emission, or may be fluorescence or phosphorescence.

The method of forming the organic compound layer in the invention is not particularly limited. Examples thereof include a resistance heating deposition method, an electrophotographic method, an electron beam method, a sputtering method, a molecule lamination method, a coating method (spray coating method, dip coating method, dipping method, roll coating method, gravure coating method, reverse coating method, roll brush method, air knife coating method, curtain coating method, spin coating method, flow coating method, bar coating method, micro-gravure coating method, air doctor coating, blade coating method, squeeze coating method, transfer roll coating method, kiss coating method, cast coating method, extrusion coating method, wire bar coating method, screen coating method, etc.), an ink-jet method, a printing method and a transfer method, among which the resistance heating deposition method, coating method and transfer method are preferable in consideration of characteristics of the element, easiness of production, and costs. When the luminescent element has a laminate structure having two or more layers, it can be produced by a combination of the methods described above.

In the coating method, the materials can be dissolved or dispersed together with a resin component. Examples of the resin component include polyvinyl chloride, polycarbonate, polystyrene, polymethyl methacrylate, polyester, polysulfone, polyphenylene oxide, polybutadiene, poly(N-vinyl carbazole), hydrocarbon resin, ketone resin, phenoxy resin, polyamide, ethyl cellulose, vinyl acetate, ABS resin, polyurethane, melamine resin, unsaturated polyester resin, alkyd resin, epoxy resin, silicon resin, etc.

The luminescent element of the invention includes at least a luminescent layer, and may have a hole injection layer, a hole transport layer, an electron injection layer, an electron transport layer, a protective layer, etc. as the organic layer in addition to the luminescent layer, and each of these layers may have another function respectively.

Hereinafter, each layer is described in more detail.

The material of the hole injection layer or hole transport layer is not limited insofar as it has any of a function of injecting holes through the anode, a function of transporting holes, or a function of blocking electrons injected through the cathode. Specific examples include the metal complexes of the invention; electroconductive polymers or oligomers of carbazole, imidazole, triazole, oxazole, oxadiazole, polyaryl alkane, pyrazoline, pyrazolone, phenylene diamine, aryl amine, amino-substituted chalcone, styryl anthracene, fluorenone, hydrazone, stilbene, silazane, aromatic tertiary amine compounds, styryl amine, aromatic dimethylidene compounds, porphyrin compounds, polysilane compounds, poly (N-vinyl carbazole), aniline copolymers, thiophene oligomers, polythiophene, and the like; organic metal complexes; transition metal complexes; and derivatives of these compounds.

The thickness of the hole injection layer or hole transport layer is not particularly limited, but is usually preferably in the range of 1 nm to 5 μm, more preferably 5 nm to 1 μm, and still more preferably 10 nm to 500 nm. The hole transport layer may have a single-layer structure including one or more kinds of the above-described materials, or a multilayer structure including a plurality of layers having the same composition or different compositions.

The material of the electron injection layer or electron transport layer is not limited insofar as it has any of a function of injecting electrons through the cathode, a function of transporting electrons or a function of blocking holes injected through the anode. Specific examples include the above-described metal complexes of the invention; various metal complexes represented by metal complexes of triazole, triazine, oxazole, oxadiazole, fluorenone, anthraquinodimethane, anthrone, diphenyl quinone, thiopyran dioxide, carbodiimide, fluorenylidene methane, distyryl pyrazine, sirole, aromatic tetracarboxylic acid anhydrides (such as naphthalene tetracarboxylic acid anhydride and perylene tetracarboxylic acid anhydride), phthalocyanine and 8-quinolinol derivatives, and metal complexes having metal phthalocyanine, benzoxazole or benzothiazole as ligand; and derivatives of these compounds.

The thickness of the electron injection layer or electron transport layer is not particularly limited, but is usually preferably in the range of 1 nm to 5 μm, more preferably 5 nm to 1 μm, and still more preferably 10 nm to 500 nm. The electron injection layer or the electron transport layer may have a single-layer structure including one or more kinds of the above-described materials, or have a multilayer structure including a plurality of layers having the same composition or different compositions.

The material of the luminescent layer may be a material having any a function of receiving holes from the anode, a hole injection layer or a hole transport layer and simultaneously receiving electrons from the cathode, an electron injection layer or an electron transport layer upon application of voltage, a function of transporting injected charges, a function of providing a site for recombination of holes and electrons thereby forming excitons, a function of transferring excitation energy, or a function of emission from excitons. Examples of the material used in the luminescent layer include the above-described metal complexes of the invention; benzoxazole, benzimidazole, benzothiazole, styryl benzene, polyphenyl, diphenyl butadiene, tetraphenyl butadiene, naphthalimide, coumarin, perylene, perinone, oxadiazole, aldazine, pyralizine, cyclopentadiene, bis-styryl anthracene, quinacridone, pyrrolopyridine, thiadiazolopyridine, styryl amine, aromatic dimethylidene compounds, polymer compounds such as polythiophene, polyphenylene, polyphenylene vinylene, etc.; electroconductive polymers or oligomers of carbazole, imidazole, triazole, oxazole, oxadiazole, polyaryl alkane, pyrazoline, pyrazolone, phenylene diamine, aryl amine, amino-substituted chalcone, styryl anthracene, fluorenone, hydrazone, stilbene, silazane, aromatic tertiary amine compounds, styryl amine, aromatic dimethylidene compounds, porphyrin compounds, polysilane compounds, poly(N-vinyl carbazole), aniline copolymers, thiophene oligomers, polythiophene, etc.; various metal complexes represented by organometallic complexes, transition metallic complexes, metal complexes of triazole, triazine, oxazole, oxadiazole, fluorenone, anthraquinodimethane, anthrone, diphenyl quinone, thiopyran dioxide, carbodiimide, fluorenylidene methane, distyryl pyrazine, sirole, aromatic tetracarboxylic acid anhydrides such as naphthalene tetracarboxylic acid anhydride and perylene tetracarboxylic acid anhydride, phthalocyanine and 8-quinolinol derivatives, and metal complexes having metal phthalocyanine, benzoxazole or benzothiazole as ligand; and derivatives of these compounds.

The luminescent layer may be a single layer or a multilayer of two or more layers. When two or more luminescent layers are included, the respective layers may emit lights of different colors. The thickness of the luminescent layer is not particularly limited, but is usually preferably in the range of 1 nm to 5 μm, more preferably 5 nm to 1 μm, and still more preferably 10 nm to 500 nm.

The material of the protective layer is not limited insofar as it has a function of preventing substances such as water and oxygen deteriorating the element from entering the element. Specific examples include metals such as In, Sn, Pb, Au, Cu, Ag, Al, Ti, Ni, etc., metal oxides such as MgO, SiO, $SiO_2$, $Al_2O_3$, GeO, NiO, CaO, BaO, $Fe_2O_3$, $Y_2O_3$, $TiO_2$, etc., metal fluorides such as $MgF_2$, LiF, $AlF_3$, $CaF_2$, etc., polyethylene, polypropylene, polymethyl methacrylate, polyimide, polyurea, polytetrafluoroethylene, polychlorotrifluoroethylene, polydichlorodifluoroethylene, a copolymer of chlorotrifluoroethylene and dichlorodifluoroethylene, a copolymer obtained by copolymerizing a monomer mixture containing tetrafluoroethylene and at least one kind of comonomer, a fluorine-containing copolymer having a cyclic structure in a main chain of the copolymer, a water-absorbing substance having a water-absorbing capacity of 1% or more, and a moisture-proof substance having a water-absorbing capacity of 0.1% or less. The method of forming the protective layer is not particularly limited. Examples thereof include a vacuum deposition method, a sputtering method, a reactive sputtering method, an MBE (molecular beam epitaxy) method, a cluster ion beam method, an ion plating method, a plasma polymerization method (high-frequency excitation ion plating method), a plasma CVD method, a laser CVD method, a thermal CVD method, a gas source CVD method, a coating method, an ink jet method, a printing method, a transfer method, and an electrophotographic method.

The anode supplies the hole injection layer, hole transport layer, luminescent layer, etc. with holes. The material of the anode may be, for example, a metal, an alloy, a metal oxide, an electroconductive compound or a mixture thereof, and preferably a material having a work function of 4 eV or more. Specific examples include electroconductive metal oxides such as tin oxide, zinc oxide, indium oxide, indium tin oxide (ITO), etc., metals such as gold, silver, chrome, nickel, etc., mixtures or laminates of such metals and electroconductive metal oxides, inorganic electroconductive substances such as copper iodide, copper sulfide, etc., organic electroconductive materials such as polyaniline, polythiophene, polypyrrole, etc., and mixtures or laminates thereof with ITO, preferably electroconductive metal oxides, and particularly ITO is preferable from the viewpoint of productivity, high electric conductivity, transparency, etc. The thickness of the anode can be suitably selected depending on its material, but is usually preferably in the range of 10 nm to 5 μm, more preferably 50 nm to 1 μm, and still more preferably 100 nm to 500 nm.

The anode used is usually the one having a layer formed on soda lime glass, non-alkali glass, a transparent resin substrate or the like. When glass is used, the glass is preferably non-alkali glass in order to reduce ions eluted from the glass. When soda lime glass is used, the glass is preferably coated with a barrier coat such as silica. The thickness of the substrate is not particularly limited insofar as it is sufficient for maintaining mechanical strength; for example, when glass is used, the thickness of the substrate is usually 0.2 mm or more, preferably 0.7 mm or more. Various methods are used to prepare the anode, and for example ITO is formed into a film by an electron beam method, a sputtering method, a resistance heating deposition method, an ion plating method, a chemical reaction method (sol/gel method, etc.), a spray method, a dipping method, a thermal CVD method, a plasma CVD method, or a method of applying a dispersion of ITO. By subjecting the anode to washing or any other treatment, the driving voltage of the element can be lowered, and luminous efficiency can be increased. For example, UV-ozone treatment, plasma treatment, etc. are effective for ITO.

The cathode supplies the electron injection layer, electron transport layer, luminescent layer, etc. with electrons, and is selected in consideration of the adhesion of the cathode to its adjacent layers such as the electron injection layer, electron transport layer, luminescent layer, etc., or ionization potential, stability, etc. As the material of the cathode, it is possible to use a metal, an alloy, a metal oxide, an electroconductive compound or a mixture thereof, and specific examples include alkali metals (for example, Li, Na, K, Cs, etc.) and fluorides thereof, alkaline earth metals (for example, Mg, Ca, etc.) and fluorides thereof, gold, silver, lead, aluminum, a sodium/potassium alloy or a mixed metal thereof, a lithium/aluminum alloy or a mixed metal thereof, a magnesium/silver alloy or a mixed metal thereof, and rare earth metals such as indium, ytterbium, etc., preferably a material having a work function of 4 eV or less, and more preferably aluminum, a lithium/aluminum alloy or a mixed metal thereof, a magnesium/silver alloy or a mixed metal thereof, etc. The thickness of the cathode can be selected suitably depending on its material, but is usually preferably in the range of 10 nm to 5 μm, more preferably 50 nm to 1 μm, still more preferably 100 nm to 1 μm. The cathode can be prepared by methods such as an electron beam method, a sputtering method, a resistance heating deposition method and a coating method, and a single metal may be vapor-deposited, or two or more components may be simultaneously vapor-deposited. Further, a plurality of metals can be simultaneously vapor-deposited to form an alloy electrode, or a previously prepared alloy may be vapor-deposited. The sheet resistance of the anode or cathode is preferably lower, and several hundreds Ω/sq or less are preferable.

The light extraction efficiency of the luminescent element of the invention can be improved by a wide variety of known techniques. The light extraction efficiency can be improved and the external quantum efficiency can be improved for example by processing the surface of the substrate (for example by forming a fine embossed pattern), by regulating the refractive index of the substrate/ITO layer/organic layer, or by regulating the thickness of the substrate/ITO layer/organic layer.

The luminescent element of the invention may have a top emission system wherein luminescent light is extracted from the cathode side.

The base material used in the luminescent element of the invention is not particularly limited. Examples thereof include inorganic materials such as zirconia-stabilized yttrium, glass, etc, polyesters such as polyethylene terephthalate, polybutylene terephthalate, polyethylene naphthalate, etc, and polymer materials such as polyethylene, polycarbonate, polyether sulfone, polyarylate, allyl diglycol carbonate, polyimide, polycycloolefin, norbornene resin, poly(chlorotrifluoroethylene), TEFRON, and a polytetrafluoroethylene/polyethylene copolymer.

The luminescent layer in the organic electroluminescent element of the invention may have a laminate structure. The number of laminated layers is preferably 2 to 50, more preferably 4 to 30, and still more preferably 6 to 20.

The thickness of each layer constituting the laminate is not particularly limited, but is preferably 0.2 nm to 20 nm, more preferably 0.4 nm to 15 nm, still more preferably 0.5 nm to 10 nm, and further more preferably 1 nm to 5 nm.

The luminescent layer in the organic electroluminescent element of the invention may have a plurality of domain structures. The luminescent layer may have other domain structures. The diameter of each domain is preferably 0.2 nm to 10 nm, more preferably 0.3 nm to 5 nm, still more preferably 0.5 nm to 3 nm, and still more preferably 0.7 nm to 2 nm.

The organic EL element of the invention can be used preferably in the fields of display elements, displays, backlights, electrophotography, lighting sources, recording light sources, exposure light sources, reading light sources, labels, signboards, interiors, optical communication, etc.

EXAMPLES

Hereinafter, the present invention is described by reference to the Examples, but the invention is not limited thereto.

Comparative Example 1

A washed ITO substrate was placed in a vapor-deposition apparatus, and 50 nm of NPD was vapor-deposited thereon.

CBP and PtOEP (compound described in U.S. Pat. No. 6,653, 654) were vapor-deposited to a thickness of 40 nm in a mass ratio of 10:1 thereon, BAlq was further vapor-deposited to a thickness of 10 nm thereon, and Alq was further vapor-deposited to a thickness of 30 nm thereon. A patterning mask (mask having a luminescent area of 4 mm×5 mm) was arranged on this organic film, lithium fluoride was vapor-deposited to a thickness of 3 nm, and aluminum was vapor-deposited to a thickness of 60 nm thereon to produce an organic EL element of Comparative Example 1.

The resulting organic EL element, upon application of a direct current constant voltage (5 V), was observed to emit red light.

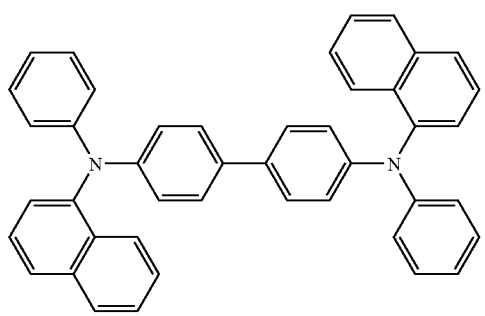

NPD

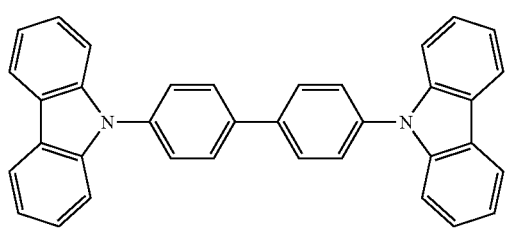

CBP

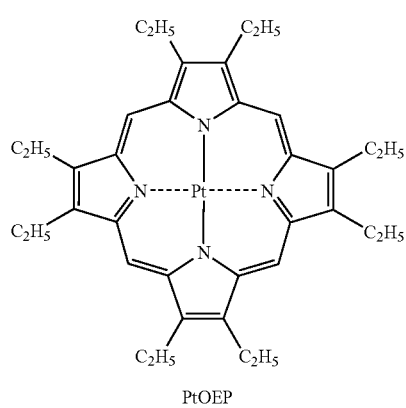

PtOEP

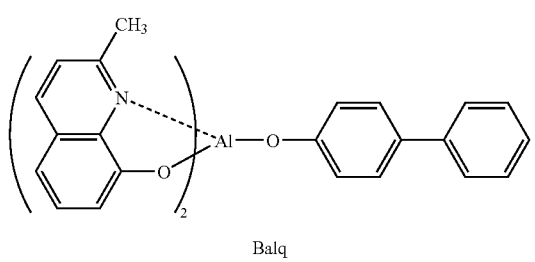

Balq

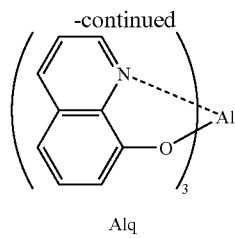

-continued

Alq

Comparative Example 2

An organic EL element was prepared in the same manner as in Comparative Example 1 except that complex II (compound described in U.S. Pat. No. 6,653,654) was used in place of PtOEP.

The resulting organic EL element, upon application of a direct current constant voltage (5 V), was observed to emit red light.

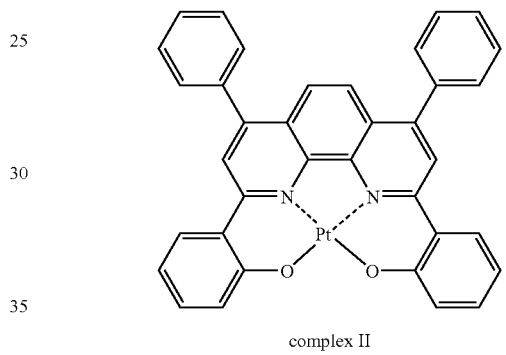

complex II

Example 1

An organic EL element of Example 1 was prepared in the same manner as in Comparative Example 1 except that Exemplary Compound (A-1) was used in place of PtOEP. The resulting organic EL element, upon application of a direct current constant voltage (5 V), was observed to emit light.

The organic EL element showed higher luminous efficiency and longer driving longevity than the organic EL elements of Comparative Examples 1 and 2.

Example 2

An organic EL element was prepared in the same manner as in Comparative Example 1 except that Exemplary Compound (B-14) was used in place of PtOEP.

The resulting organic EL element, upon application of a direct current constant voltage (5 V), was observed to emit light.

The organic EL element showed higher luminous efficiency and longer driving longevity than the organic EL elements of Comparative Examples 1 and 2.

Example 3

An organic EL element in Example 3 was prepared in the same manner as in Comparative Example 1 except that Exemplary Compound (C-17) was used in place of PtOEP. The resulting organic EL element, upon application of a direct current constant voltage (5 V), was observed to emit light.

The organic EL element showed higher luminous efficiency and longer driving longevity than the organic EL elements of Comparative Examples 1 and 2.

Example 4

An organic EL element was prepared in the same manner as in Comparative Example 1 except that Exemplary Compound (D-1) was used in place of PtOEP.

The resulting organic EL element, upon application of a direct current constant voltage (5 V), was observed to emit light. The organic EL element showed higher luminous efficiency and longer driving longevity than the organic EL elements of Comparative Examples 1 and 2.

Example 5

An organic EL element was prepared in the same manner as in Comparative Example 1 except that Exemplary Compound (E-1) was used in place of PtOEP. The resulting organic EL element, upon application of a direct current constant voltage (5 V), was observed to emit light. The organic EL element showed higher luminous efficiency and longer driving longevity than the organic EL elements of Comparative Examples 1 and 2.

Example 6

An organic EL element of Example 6 was prepared in the same manner as in Comparative Example 1 except that Exemplary Compound (F-13) was used in place of PtOEP.

The resulting organic EL element, upon application of a direct current constant voltage (5 V), was observed to emit light. The organic EL element showed higher luminous efficiency and longer driving longevity than the organic EL elements of Comparative Examples 1 and 2.

Comparative Example 3

A washed ITO substrate was placed in a vapor-deposition apparatus, and 5 nm of CuPc was vapor-deposited thereon. NDP was vapor-deposited to a thickness of 50 nm thereon, and Alq was further vapor-deposited to a thickness of 40 nm thereon. A patterning mask (mask having a luminescent area of 4 mm×5 mm) was arranged on this organic film, lithium fluoride was vapor-deposited to a thickness of 3 nm, and then aluminum was vapor-deposited to a thickness of 60 nm thereon to produce an organic EL element in Comparative Example 3.

The resulting organic EL element, upon application of a direct current constant voltage (5 V), was observed to emit green light. Upon emission at a luminance of 300 cd/m² for 10 hours, dark spots were observed with naked eyes.

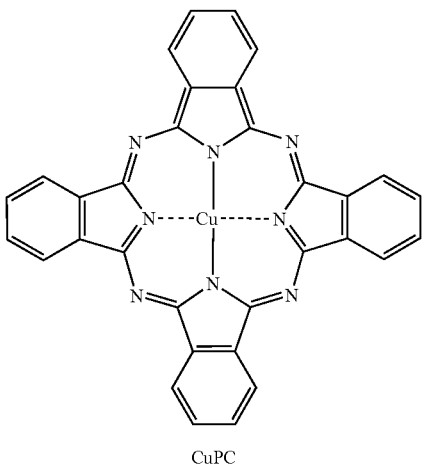

CuPC

Example 7

An organic EL element in Example 7 was prepared in the same manner as in Comparative Example 3 except that Exemplary Compound (C-20) was used in place of CuPc. The resulting organic EL element, upon application of a direct current constant voltage (5 V), was observed to emit green light. Upon emission at a luminance of 300 cd/m² for 20 hours, no dark spot was observed with naked eyes.

Example 8

An organic EL element in Example 8 was prepared in the same manner as in Comparative Example 1 except that Exemplary Compound (A-82) was used in place of PtOEP. The resulting organic EL element, upon application of a direct current constant voltage (5 V), was observed to emit light.

The organic EL element showed higher luminous efficiency and longer driving longevity than the organic EL elements of Comparative Examples 1 and 2.

Example 9

An organic EL element in Example 9 was prepared in the same manner as in Comparative Example 1 except that Exemplary Compound (A-85) was used in place of PtOEP. The resulting organic EL element, upon application of a direct current constant voltage (5 V), was observed to emit light.

The organic EL element showed higher luminous efficiency and longer driving longevity than the organic EL elements of Comparative Examples 1 and 2.

From the examples described above, it was revealed that highly efficient and highly durable organic EL elements were obtained by using the compounds in the invention.

What is claimed is:

1. An organic electroluminescent element having at least one organic layer including a luminescent layer between a pair of electrodes, wherein at least one organic layer comprises at least one compound represented by formula (A-1):

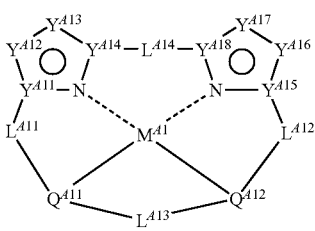

Formula (A-1)

wherein $M^{A1}$ represents a divalent metal ion, $Y^{A11}$, $Y^{A14}$, $Y^{A15}$ and $Y^{A18}$ independently represent a carbon atom or a nitrogen atom, $Y^{A12}$, $Y^{A13}$, $Y^{A16}$ and $Y^{A17}$ independently represent a substituted or unsubstituted carbon atom, a substituted or unsubstituted nitrogen atom, an oxygen atom or a sulfur atom, $L^{A11}$, $L^{A12}$, $L^{A13}$ and $L^{A14}$ independently represent a linking group, and $Q^{A11}$ and $Q^{A12}$ independently represent a partial structure containing an atom bonded to $M^{A1}$.

2. The organic electroluminescent element of claim 1, wherein the compound represented by the formula (A-1) is a compound represented by the following formula (A-2), (A-3) or (A-4):

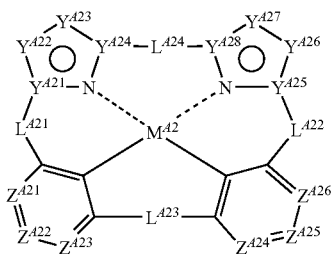

Formula (A-2)

wherein $M^{A2}$ represents a metal ion, $Y^{A21}$, $Y^{A24}$, $Y^{A25}$ and $Y^{A28}$ independently represent a carbon atom or a nitrogen atom, $Y^{A22}$, $Y^{A23}$, $Y^{A26}$ and $Y^{A27}$ independently represent a substituted or unsubstituted carbon atom, a substituted or unsubstituted nitrogen atom, an oxygen atom or a sulfur atom, $L^{A21}$, $L^{A22}$, $L^{A23}$ and $L^{A24}$ independently represent a linking group, and $Z^{A21}$, $Z^{A22}$, $Z^{A23}$, $Z^{A24}$, $Z^{A25}$ and $Z^{A26}$ independently represent a nitrogen atom or substituted or unsubstituted carbon atom;

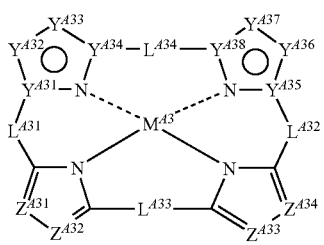

Formula (A-3)

wherein $MA^3$ represents a metal ion, $Y^{A31}$, $Y^{A34}$, $Y^{A35}$ and $Y^{A38}$ independently represent a carbon atom or a nitrogen atom, $Y^{A32}$, $Y^{A33}$, $Y^{A36}$ and $Y^{A37}$ independently represent a substituted or unsubstituted carbon atom, a substituted or unsubstituted nitrogen atom, an oxygen atom or a sulfur atom, $L^{A31}$, $L^{A32}$, $L^{A33}$ and $L^{A34}$ independently represent a linking group, and $Z^{A31}$, $Z^{A32}$, $Z^{A33}$ and $Z^{A34}$ independently represent a nitrogen atom or a substituted or unsubstituted carbon atom;

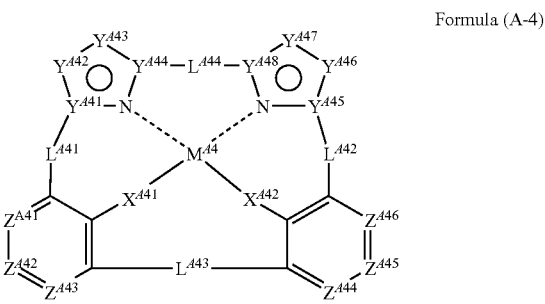

Formula (A-4)

wherein $M^{A4}$ represents a metal ion, $Y^{A41}$, $Y^{A44}$, $Y^{A45}$ and $Y^{A48}$ independently represent a carbon atom or a nitrogen atom, $Y^{A42}$, $Y^{A43}$, $Y^{A46}$ and $Y^{A47}$ independently represent a substituted or unsubstituted carbon atom, a substituted or unsubstituted nitrogen atom, an oxygen atom or a sulfur atom, $L^{A41}$, $L^{A42}$, $L^{A43}$ and $L^{A44}$ independently represent a linking group, $Z^{A41}$, $Z^{A42}$, $Z^{A43}$, $Z^{A44}$, $Z^{A45}$ and $Z^{A46}$ independently represent a nitrogen atom or a substituted or unsubstituted carbon atom, and $X^{A41}$ and $X^{A42}$ independently represent an oxygen atom, a sulfur atom or a substituted or unsubstituted nitrogen atom.

3. The organic electroluminescent element of claim 1, wherein the luminescent layer comprises at least one compound represented by the formula (A-1).

4. The organic electroluminescent element of claim 1, wherein the luminescent layer comprises a host material and at least one compound represented by the formula (A-1).

* * * * *